US012279435B2

(12) United States Patent
Lee et al.

(10) Patent No.: US 12,279,435 B2
(45) Date of Patent: Apr. 15, 2025

(54) SEMICONDUCTOR DEVICE

(71) Applicant: SAMSUNG ELECTRONICS CO., LTD., Suwon-si (KR)

(72) Inventors: Kyunghwan Lee, Seoul (KR); Yongseok Kim, Suwon-si (KR); Hyuncheol Kim, Seoul (KR); Jongman Park, Hwaseong-si (KR); Dongsoo Woo, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 447 days.

(21) Appl. No.: 17/683,460

(22) Filed: Mar. 1, 2022

(65) Prior Publication Data
US 2023/0011675 A1    Jan. 12, 2023

(30) Foreign Application Priority Data

Jul. 9, 2021 (KR) .......................... 10-2021-0090249

(51) Int. Cl.
H10B 51/20      (2023.01)
H10B 51/10      (2023.01)
H10B 51/40      (2023.01)

(52) U.S. Cl.
CPC ............. *H10B 51/20* (2023.02); *H10B 51/10* (2023.02); *H10B 51/40* (2023.02)

(58) Field of Classification Search
CPC ........ H10B 51/20; H10B 51/10; H10B 51/40; H10B 51/30; H01L 29/78391
See application file for complete search history.

(56) References Cited

U.S. PATENT DOCUMENTS 6,744,087 B2    6/2004   Misewich et al.
10,460,788 B2   10/2019  Müller
10,777,578 B2   9/2020   Liu
(Continued)

FOREIGN PATENT DOCUMENTS

TW    200405549 A    4/2004
TW    200901392 A    1/2009
TW    I715337 B      1/2021

OTHER PUBLICATIONS

Ni et al., IEEE, IEDM 18-296-299 (2018).
(Continued)

Primary Examiner — S M Sohel Imtiaz
(74) Attorney, Agent, or Firm — Muir Patent Law, PLLC

(57) ABSTRACT

A semiconductor device includes first conductive lines provided on a substrate and spaced apart from each other in a first direction perpendicular to a top surface of the substrate, second conductive lines spaced apart from the first conductive lines in a second direction parallel to the top surface of the substrate, a gate electrode disposed between the first and second conductive lines and extended in the first direction, a plurality of channel patterns provided to enclose a side surface of the gate electrode and spaced apart from each other in the first direction, a ferroelectric pattern between each of the channel patterns and the gate electrode, and a gate insulating pattern between each of the channel patterns and the ferroelectric pattern. Each of the channel patterns is connected to a corresponding one of the first conductive lines and a corresponding one of the second conductive lines.

20 Claims, 46 Drawing Sheets

(56) References Cited

U.S. PATENT DOCUMENTS

| | | |
|---|---|---|
| 10,825,834 B1 | 11/2020 | Chen |
| 10,916,654 B2 | 2/2021 | Fujii |
| 10,923,500 B2 | 2/2021 | Ino et al. |
| 2009/0004802 A1* | 1/2009 | Joo .................. H10B 69/00 257/E21.423 |
| 2012/0153379 A1* | 6/2012 | Kim ................ H01L 29/7827 257/329 |
| 2016/0093634 A1* | 3/2016 | Jang ................. H01L 29/495 257/324 |
| 2018/0182769 A1* | 6/2018 | Cheng ............. G11C 16/0483 |
| 2018/0277543 A1* | 9/2018 | Kim ............ H01L 21/823807 |
| 2019/0206869 A1* | 7/2019 | Kim .................... H01L 29/74 |
| 2020/0013870 A1* | 1/2020 | Ha ................. H01L 29/42392 |
| 2020/0066753 A1* | 2/2020 | Lee ..................... H10B 43/40 |
| 2020/0091160 A1* | 3/2020 | Ino ..................... H10B 53/30 |
| 2020/0227439 A1* | 7/2020 | Sato .................... H10B 51/10 |
| 2020/0303558 A1* | 9/2020 | Fujii ................... H10B 43/27 |
| 2020/0357822 A1* | 11/2020 | Chen .................. G11C 11/223 |
| 2021/0050372 A1* | 2/2021 | Sharangpani ........ H10B 43/35 |
| 2021/0066502 A1* | 3/2021 | Karda ............... H01L 29/7827 |
| 2021/0082956 A1* | 3/2021 | Suzuki ................ H10B 51/30 |
| 2021/0091204 A1* | 3/2021 | Rabkin ............ H01L 29/41725 |
| 2021/0375936 A1* | 12/2021 | Chiang ........... H01L 29/40111 |
| 2022/0157852 A1* | 5/2022 | Prasad ............... H01L 29/6684 |
| 2022/0157966 A1* | 5/2022 | Prasad ............ H01L 29/40111 |
| 2022/0231049 A1* | 7/2022 | Lin .................... H10B 51/20 |
| 2022/0415924 A1* | 12/2022 | Zhang ................ H10B 51/20 |

OTHER PUBLICATIONS

Shin et al., IEEE Transactions on Computers, vol. 67 (1), Jan. 2018.
Lee et al., IEEE Electron Device Letters, vol. 41 (8), Aug. 2020.

\* cited by examiner

SEMICONDUCTOR DEVICE

CROSS-REFERENCE TO RELATED APPLICATION

This U.S. non-provisional patent application claims priority under 35 U.S.C. § 119 to Korean Patent Application No. 10-2021-0090249, filed on Jul. 9, 2021, in the Korean Intellectual Property Office, the entire contents of which are hereby incorporated by reference.

BACKGROUND

1. Field

Embodiments relate to a semiconductor device.

2. Description of the Related Art

Semiconductor memory devices are generally classified into volatile memory devices and nonvolatile memory devices. The volatile memory devices lose their stored data when their power supplies are interrupted, and for example, include a dynamic random access memory (DRAM) device and a static random access memory (SRAM) device. The nonvolatile memory devices maintain their stored data even when their power supplies are interrupted and, for example, include a programmable read only memory (PROM), an erasable PROM (EPROM), an electrically EPROM (EEPROM), a flash memory device. In addition, to meet an increasing demand for a semiconductor memory device with high performance and low power consumption, next-generation nonvolatile semiconductor memory devices, such as magnetic random access memory (MRAM), phase-change random access memory (PRAM), and ferroelectric random access memory (FeRAM) devices, are being developed. To provide a semiconductor device with high integration density and high performance, various researches are being conducted to exploit semiconductor devices having different properties.

SUMMARY

According to an embodiment, a semiconductor device may include first conductive lines provided on a substrate and spaced apart from each other in a first direction perpendicular to a top surface of the substrate, second conductive lines spaced apart from the first conductive lines in a second direction parallel to the top surface of the substrate, a gate electrode disposed between the first conductive lines and the second conductive lines and extended in the first direction, a plurality of channel patterns provided to enclose a side surface of the gate electrode and spaced apart from each other in the first direction, a ferroelectric pattern between each of the channel patterns and the gate electrode, and a gate insulating pattern between each of the channel patterns and the ferroelectric pattern. Each of the channel patterns may be connected to a corresponding one of the first conductive lines and a corresponding one of the second conductive lines.

According to an embodiment, a semiconductor device may include first conductive lines and first insulating patterns, which are alternately stacked in a first direction perpendicular to a top surface of a substrate, a gate electrode, which is spaced apart from the first conductive lines in a second direction parallel to the top surface of the substrate and is extended in the first direction, a plurality of channel patterns provided to enclose a side surface of the gate electrode and spaced apart from each other in the first direction, a ferroelectric pattern between each of the channel patterns and the gate electrode, and a gate insulating pattern between each of the channel patterns and the ferroelectric pattern. The first insulating patterns may be extended into regions between the channel patterns, and the channel patterns may be connected to the first conductive lines, respectively.

BRIEF DESCRIPTION OF THE DRAWINGS

Features will become apparent to those of skill in the art by describing in detail example embodiments with reference to the attached drawings in which.

DETAILED DESCRIPTION

Figure 1:
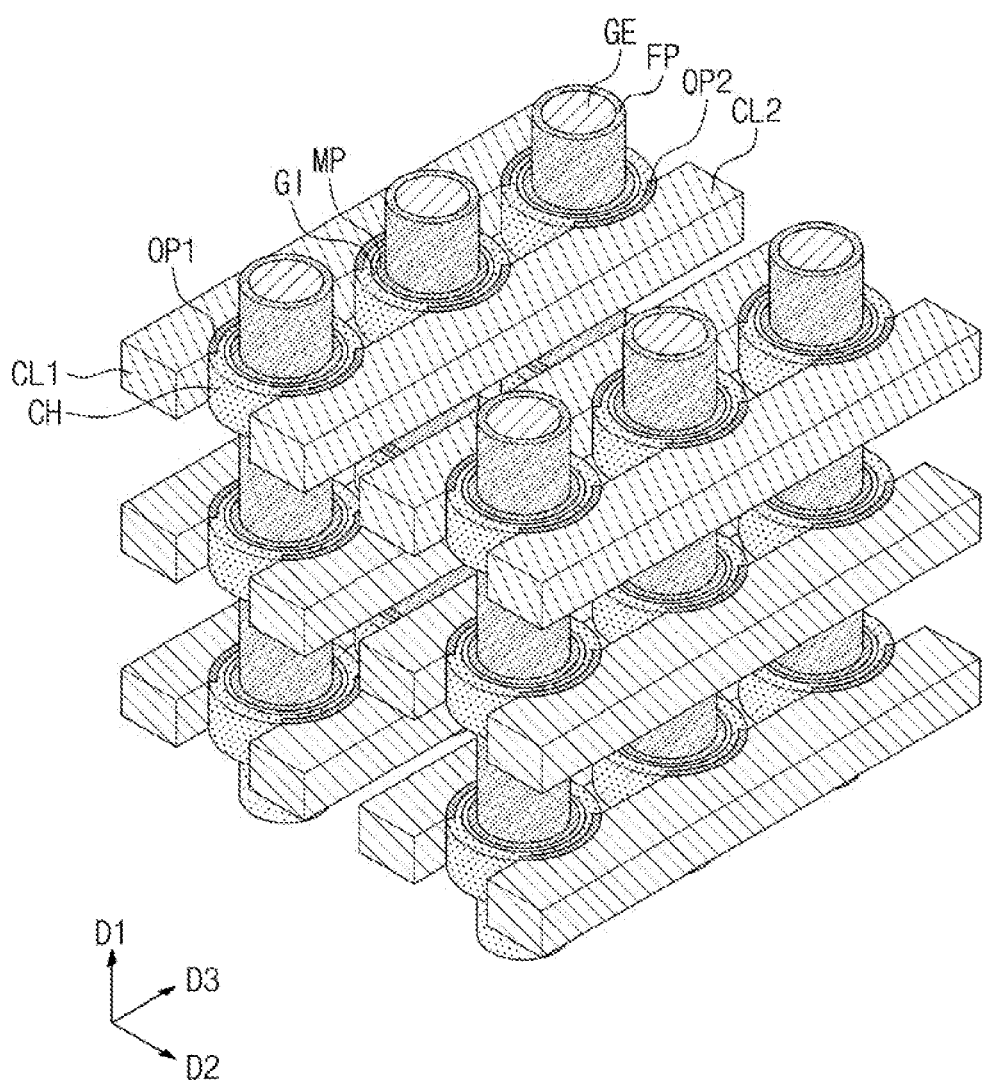
FIG. 1 is a perspective view schematically illustrating a semiconductor device according to an example embodiment.
Figure 2:
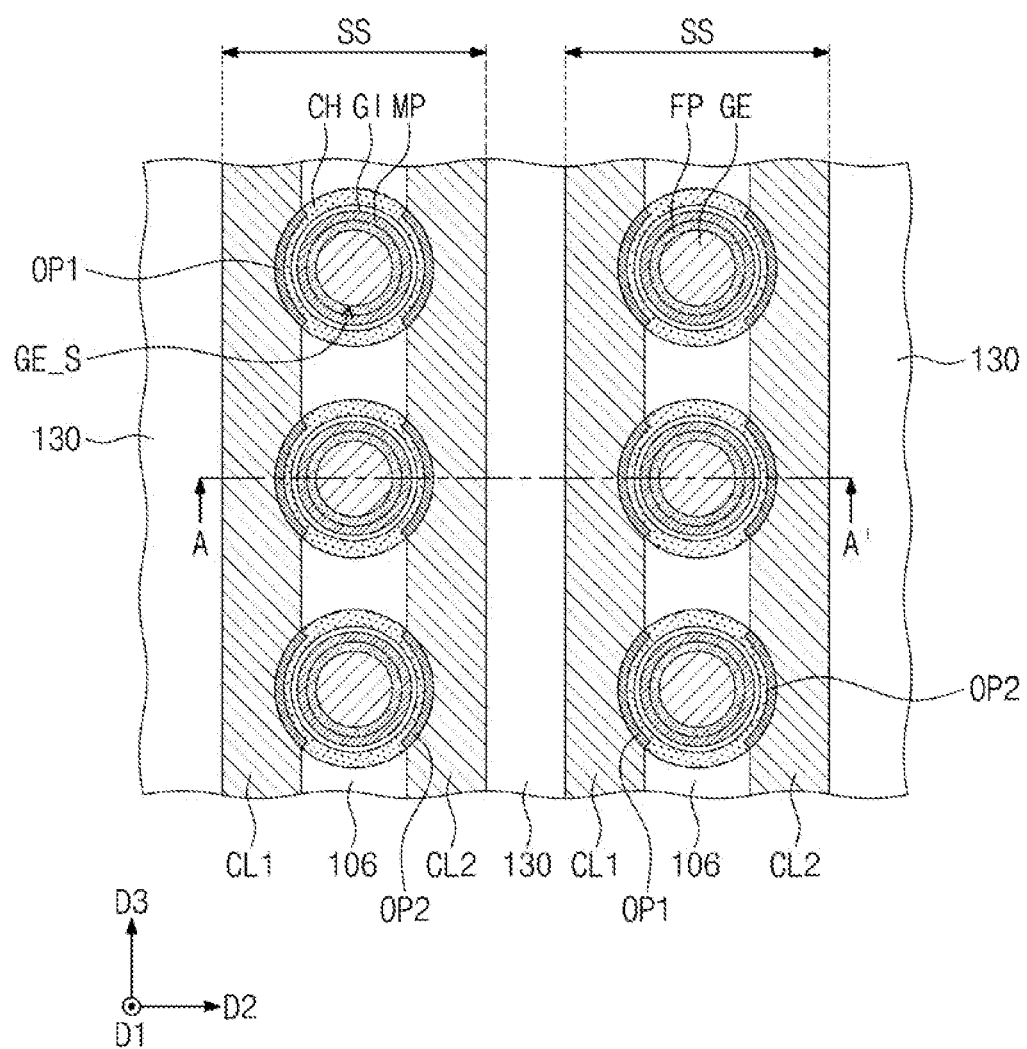
FIG. 2 is a plan view illustrating a semiconductor device according to an example embodiment.

FIG. 1 is a schematic perspective view illustrating a semiconductor device according to an example embodiment. FIG. 2 is a plan view illustrating a semiconductor device according to an example embodiment, and FIG. 3 is a sectional view taken along a line A-A' of FIG. 2.

Figure 3:
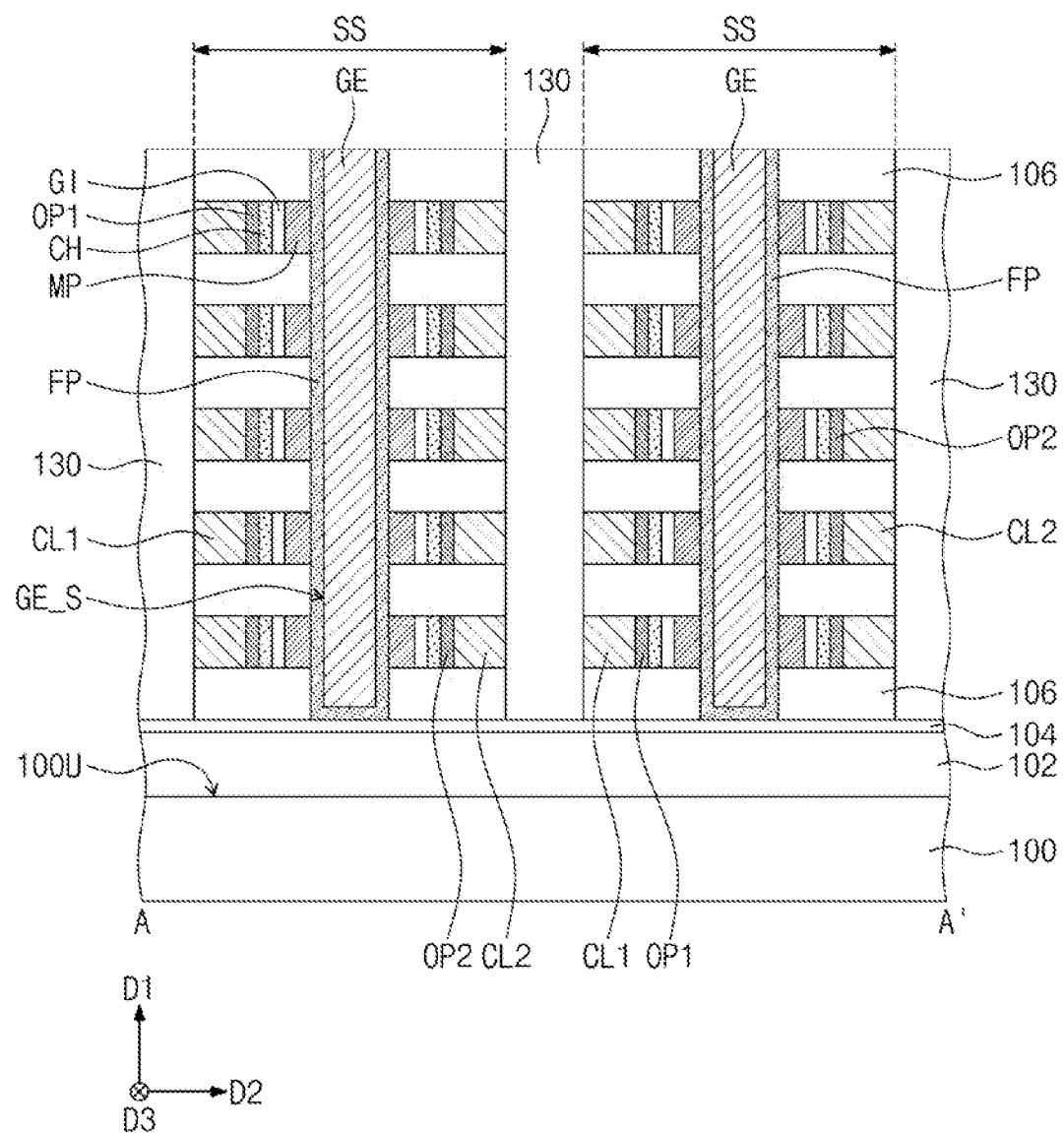
FIG. 3 is a sectional view taken along a line A-A' of FIG. 2.

Referring to FIGS. 1 to 3, an interlayer insulating layer 102 and an etch stop layer 104 may be sequentially disposed on a substrate 100. The interlayer insulating layer 102 may be disposed between the substrate 100 and the etch stop layer 104.

The substrate 100 may include a semiconductor substrate (e.g., a silicon substrate, a germanium substrate, a silicon-germanium substrate, and so forth).

The interlayer insulating layer 102 may be formed of or include at least one of silicon oxide, silicon nitride, and/or silicon oxynitride.

The etch stop layer 104 may be formed of or include at least one of metal oxides (e.g., aluminum oxide).

A stack SS may be disposed on the etch stop layer 104. The stack SS may include first conductive lines CL1, which are spaced apart from each other in a first direction D1 perpendicular to a top surface 100U of the substrate 100, second conductive lines CL2, which are spaced apart from the first conductive lines CL1 in a second direction D2 parallel to the top surface 100U of the substrate 100, and gate electrodes GE, which are disposed between the first and second conductive lines CL1 and CL2.

The first conductive lines CL1 may be extended in a third direction D3, which is parallel to the top surface 100U of the substrate 100, and the third direction D3 may cross (or, not be parallel to) the second direction D2.

The second conductive lines CL2 may be spaced apart from each other in the first direction D1 and may be extended in the third direction D3. The second conductive lines CL2 may be extended in the third direction D3 and parallel to the first conductive lines CL1.

The gate electrodes GE may be provided to cross the first and second conductive lines CL1 and CL2. The gate electrodes GE may be spaced apart from each other in the third direction D3, between the first and second conductive lines CL1 and CL2, and may be extended in the first direction D1.

The first and second conductive lines CL1 and CL2 may be formed of or include at least one of conductive materials (e.g., doped polysilicon, metal, conductive metal nitride, conductive metal silicide, conductive metal oxide, or combination thereof). The first and second conductive lines CL1 and CL2 may be formed of or include at least one of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or combinations thereof. The first and second conductive lines CL1 and CL2 may be formed of or include at least one of two-dimensional semiconductor materials (e.g., graphene, carbon nanotube, or combinations thereof).

The gate electrodes GE may be formed of or include at least one of doped polysilicon, metal, conductive metal nitride, conductive metal silicide, conductive metal oxide, or combinations thereof. The gate electrodes GE may be formed of or include at least one of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or combinations thereof.

The stack SS may further include a plurality of channel patterns CH, which are provided to enclose a side surface GE_S of each of the gate electrodes GE.

The channel patterns CH may be provided to enclose a side surface GE_S of a corresponding one of the gate electrodes GE, and may be spaced apart from each other in the first direction D1. The channel patterns CH may be disposed between the first and second conductive lines CL1 and CL2. The first conductive lines CL1 may be connected to the channel patterns CH, respectively, and the second conductive lines CL2 may be connected to the channel patterns CH, respectively. Each of the channel patterns CH may be connected to a corresponding one of the first conductive lines CL1 and a corresponding one of the second conductive lines CL2. Each of the channel patterns CH may be disposed between the corresponding first conductive line CL1 and the corresponding second conductive line CL2. When viewed in a sectional view, the corresponding first conductive line CL1, each of the channel patterns CH, and the corresponding second conductive line CL2 may be overlapped with each other horizontally (e.g., in the second direction D2).

Each of the first conductive lines CL1 may be extended in the third direction D3 and may be connected to adjacent ones of the channel patterns CH respectively enclosing the side surfaces GE_S of the gate electrodes GE. Each of the second conductive lines CL2 may be extended in the third direction D3 and may be connected to the adjacent ones of the channel patterns CH.

The channel patterns CH may be formed of or include at least one of silicon (e.g., poly silicon, doped silicon, or single crystalline silicon), germanium, silicon-germanium, or oxide semiconductor materials. The oxide semiconductor materials may include InGaZnO (IGZO), Sn—InGaZnO, InWO (IWO), $CuS_2$, $CuSe_2$, $WSe_2$, InGaSiO, InSnZnO, InZnO (IZO), ZnO, ZnTiO (ZTO), YZnO (YZO), ZnSnO, ZnON, ZrZnSnO, SnO, HfInZnO, GaZnSnO, AlZnSnO, YbGaZnO, InGaO, or combinations thereof. The channel patterns CH may be formed of or include at least one of two-dimensional semiconductor materials (e.g., $MoS_2$, $MoSe_2$, $WS_2$, graphene, carbon nanotube, or combinations thereof).

The stack SS may further include a ferroelectric pattern FP between each of the channel patterns CH and the corresponding gate electrode GE, a metal pattern MP between each of the channel patterns CH and the ferroelectric pattern FP, and a gate insulating pattern GI between each of the channel patterns CH and the metal pattern MP.

The ferroelectric pattern FP may be provided to enclose or cover the side surface GE_S of the corresponding gate electrode GE.

The metal pattern MP may be provided to enclose the side surface GE_S of the corresponding gate electrode GE, and may be spaced apart from the side surface GE_S of the corresponding gate electrode GE with the ferroelectric pattern FP interposed therebetween.

The gate insulating pattern GI may be provided to enclose the side surface GE_S of the corresponding gate electrode GE, and may be spaced apart from the side surface GE_S of the corresponding gate electrode GE with the ferroelectric pattern FP and the metal pattern MP interposed therebetween.

The ferroelectric pattern FP may be formed of or include hafnium oxide with a ferroelectric property. The ferroelectric pattern FP may further include dopants, and in an example embodiment, the dopants may be at least one of Zr, Si, Al, Y, Gd, La, Sc, or Sr. The ferroelectric pattern FP may be formed of or include at least one of $HfO_2$, HfZnO, HfSiO, HfSiON, HfTaO, HfTiO, HfZrO, or combinations thereof. The ferroelectric pattern FP may have an orthorhombic phase.

The metal pattern MP may be formed of or include at least one of metallic materials (e.g., Pt) and/or metal oxides (e.g., $RuO_2$, $IrO_2$, and $LaSrCoO_3$). The metal pattern MP may be used to easily maintain polarization of the ferroelectric pattern FP.

The gate insulating pattern GI may be formed of or include at least one of silicon oxide, silicon oxynitride layer, high-k dielectric materials having a higher dielectric constant than silicon oxide, or combinations thereof. The high-k dielectric materials may be formed of or include metal oxide or metal oxynitride.

The stack SS may further include first impurity patterns OP1, which are provided between the first conductive lines CL1 and the channel patterns CH, and second impurity patterns OP2, which are provided between the second conductive lines CL2 and the channel patterns CH.

The first impurity patterns OP1 may be spaced apart from each other in the first direction D1, and may be respectively interposed between the first conductive lines CL1 and the channel patterns CH.

The second impurity patterns OP2 may be spaced apart from each other in the first direction D1, and may be respectively interposed between the second conductive lines CL2 and the channel patterns CH. The second impurity patterns OP2 may be spaced apart from the first impurity patterns OP1 in the second direction D2 with the channel patterns CH, the gate insulating pattern GI, the metal pattern MP, the ferroelectric pattern FP, and the corresponding gate electrode GE interposed therebetween.

The first conductive lines CL1 may be electrically and respectively connected to the channel patterns CH through the first impurity patterns OP1, and the second conductive lines CL2 may be electrically and respectively connected to the channel patterns CH through the second impurity patterns OP2.

Each of the first conductive lines CL1 may be connected to the adjacent ones of the channel patterns CH, which are spaced apart from each other in the third direction D3. Adjacent ones of the first impurity patterns OP1, which are adjacent to each other in the third direction D3, may be disposed between each of the first conductive lines CL1 and the adjacent ones of the channel patterns CH. Each of the first conductive lines CL1 may be electrically connected to the adjacent ones of the channel patterns CH through the adjacent ones of the first impurity patterns OP1.

Each of the second conductive lines CL2 may be connected to the adjacent ones of the channel patterns CH. Adjacent ones of the second impurity patterns OP2, which are adjacent to each other in the third direction D3, may be disposed between each of the second conductive lines CL2 and the adjacent ones of the channel patterns CH. Each of the second conductive lines CL2 may be electrically connected to the adjacent ones of the channel patterns CH through the adjacent ones of the second impurity patterns OP2.

The first and second impurity patterns OP1 and OP2 may include impurities of the same conductivity type. The first and second impurity patterns OP1 and OP2 may include n-type impurities or p-type impurities.

A ferroelectric field effect transistor may be constituted by the corresponding gate electrode GE, each of the channel patterns CH (which are provided to enclose the side surface GE_S of the corresponding gate electrode GE), the ferroelectric pattern FP, the metal pattern MP, and the gate insulating pattern GI (which are interposed between each of the channel patterns CH and the corresponding gate electrode GE), and corresponding first and second impurity patterns OP1 and OP2 (which are disposed at both sides of each of the channel patterns CH).

As an example, the first conductive lines CL1 may serve as bit lines, and the second conductive lines CL2 may serve as source lines. As another example, the first conductive lines CL1 may serve as source lines, and the second conductive lines CL2 may serve as bit lines.

The stack SS may further include first insulating patterns 106, which are spaced apart from each other in the first direction D1 and are interposed between the channel patterns CH.

The first insulating patterns 106 and the channel patterns CH may be alternately stacked in the first direction D1. The channel patterns CH may be electrically separated or disconnected from each other by the first insulating patterns 106. Each of the first insulating patterns 106 may be provided to enclose the side surface GE_S of the corresponding gate electrode GE. The first insulating patterns 106 may be extended to regions between the first impurity patterns OP1, between the first conductive lines CL1, between the second impurity patterns OP2, and between the second conductive lines CL2.

The first insulating patterns 106 may be extended into regions between gate insulating patterns GI, which are adjacent to each other in the first direction D1 and between metal patterns MP, which are adjacent to each other in the first direction D1. In other words, the gate insulating pattern GI and the metal pattern MP may be interposed between adjacent ones of the first insulating patterns 106, which are adjacent to each other in the first direction D1. The ferroelectric pattern FP may be extended into a region between each of the first insulating patterns 106 and the corresponding gate electrode GE. The first insulating patterns 106 may be in contact with a side surface of the ferroelectric pattern FP.

In an example embodiment, the first insulating patterns 106 may be formed of or include silicon oxide.

Sidewall insulating patterns 130 may be disposed on the etch stop layer 104 and at both sides of the stack SS.

The sidewall insulating patterns 130 may be spaced apart from each other in the second direction D2 with the stack SS interposed therebetween. The sidewall insulating patterns 130 may be extended in the first direction D1 and the third direction D3. One of the sidewall insulating patterns 130 may be extended in the first direction D1 to cover the side surfaces of the first conductive lines CL1 and the first insulating patterns 106 and may be extended along the side surfaces of the first conductive lines CL1 and in the third direction D3. Another of the sidewall insulating patterns 130 may be extended in the first direction D1 to cover the side surfaces of the second conductive lines CL2 and the first insulating patterns 106 and may be extended along the side surfaces of the second conductive lines CL2 and in the third direction D3.

The sidewall insulating patterns 130 may be formed of or include at least one of, for example, silicon oxide, silicon nitride, and/or silicon oxynitride.

A ferroelectric field effect transistor may be constituted by the corresponding gate electrode GE, each of the channel patterns CH, which are disposed enclose the side surface GE_S of the corresponding gate electrode GE, the ferroelectric pattern FP, the metal pattern MP, and the gate insulating pattern GI, which are interposed between each of the channel patterns CH and the corresponding gate electrode GE, and the corresponding first and second impurity patterns OP1 and OP2, which are disposed at both sides of each of the channel patterns CH. Accordingly, it may be possible to easily stack a plurality of ferroelectric field effect transistors in a vertical direction (e.g., the first direction D1), and thereby to increase an integration density of the semiconductor device.

In addition, since each of the ferroelectric pattern FP, the metal pattern MP, and the gate insulating pattern GI is disposed to enclose the side surface GE_S of the corresponding gate electrode GE, an intensity of an electric field applied to the ferroelectric pattern FP and the metal pattern MP may be increased, and an intensity of an electric field applied to the gate insulating pattern GI may be decreased. Accordingly, it may be possible to improve a polarization property of the ferroelectric pattern FP and an endurance property of the gate insulating pattern GI. Thus, it may be possible to improve operational and reliability characteristics of the semiconductor device.

FIGS. 4, 6, 8, 10, 12, and 14 are plan views illustrating a method of fabricating a semiconductor device according to an example embodiment, and FIGS. 5, 7, 9, 11, 13, and 15 are sectional views, which are respectively taken along lines A-A' of FIGS. 4, 6, 8, 10, 12, and 14. For concise description, an element previously described with reference to FIGS. 1 to 3 may be identified by the same reference number without repeating an overlapping description thereof.

Figure 4:
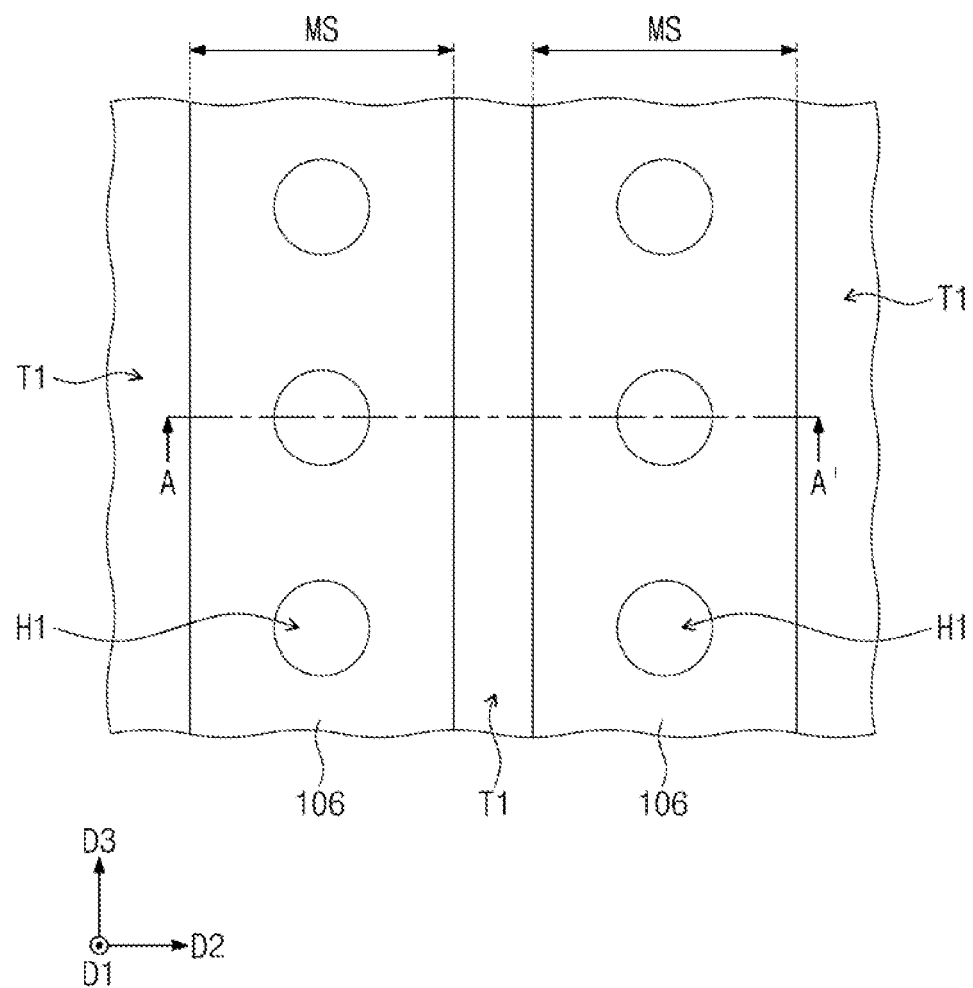
FIGS. 4, 6, 8, 10, 12, and 14 are plan views illustrating a method of fabricating a semiconductor device, according to an example embodiment.
Figure 5:
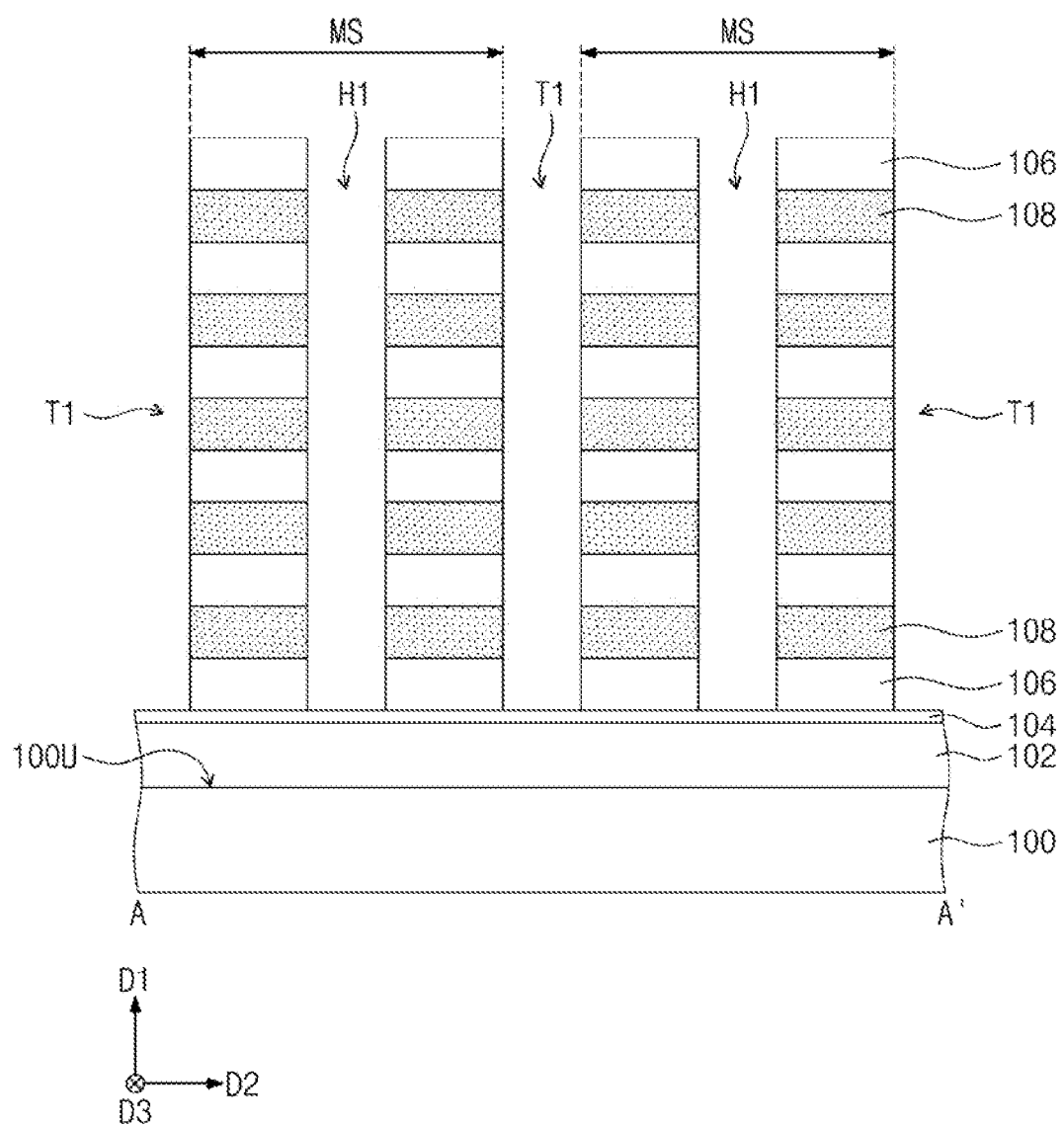
FIGS. 5, 7, 9, 11, 13, and 15 are sectional views, which are respectively taken along lines A-A' of FIGS. 4, 6, 8, 10, 12, and 14.

Referring to FIGS. 4 and 5, an interlayer insulating layer 102 and an etch stop layer 104 may be sequentially formed on a substrate 100. First insulating layers 106 and second insulating layers 108 may be stacked on the etch stop layer 104.

The first and second insulating layers 106 and 108 may be alternately stacked in the first direction D1 perpendicular to the top surface 100U of the substrate 100. The lowermost one of the first insulating layers 106 may be interposed between the lowermost one of the second insulating layers 108 and the etch stop layer 104, and the uppermost one of the first insulating layers 106 may be disposed on the uppermost one of the second insulating layers 108.

The first insulating layers 106 may be formed of or include silicon oxide. The second insulating layers 108 may be formed of or include a material (e.g., silicon nitride) having an etch selectivity with respect to the first insulating layers 106.

First trenches T1 may be formed in the first and second insulating layers 106 and 108.

Each of the first trenches T1 may be formed to penetrate the first and second insulating layers 106 and 108 in the first direction D1 and to expose a top surface of the etch stop layer 104. The first trenches T1 may be spaced apart from each other in the second direction D2 parallel to the top surface 100U of the substrate 100 and may be extended in the third direction D3 parallel to the top surface 100U of the substrate 100. The third direction D3 may not be parallel to the second direction D2.

The formation of the first trenches T1 may include anisotropically etching the first and second insulating layers 106 and 108.

A mold structure MS may be defined by the first trenches T1.

The mold structure MS may include remaining portions of the first insulating layers 106 and remaining portions of the second insulating layers 108, which are interposed between the first trenches T1. The remaining portions of the first insulating layers 106 may be referred to as first insulating patterns 106, and the remaining portions of the second insulating layers 108 may be referred to as second insulating patterns 108. In other words, the mold structure MS may include the first and second insulating patterns 106 and 108, which are alternately stacked in the first direction D1.

The first trenches T1 may be spaced apart from each other in the second direction D2 with the mold structure MS interposed therebetween and may be extended in the third direction D3. The mold structure MS may be extended in the third direction D3, between the first trenches T1.

First holes H1 may be formed in the mold structure MS.

Each of the first holes H1 may be extended in the first direction D1 to penetrate the mold structure MS and to expose the top surface of the etch stop layer 104. Between the first trenches T1, the first holes H1 may be spaced apart from each other in the third direction D3.

The formation of the first holes H1 may include anisotropically etching the first and second insulating patterns 106 and 108.

Figure 6:
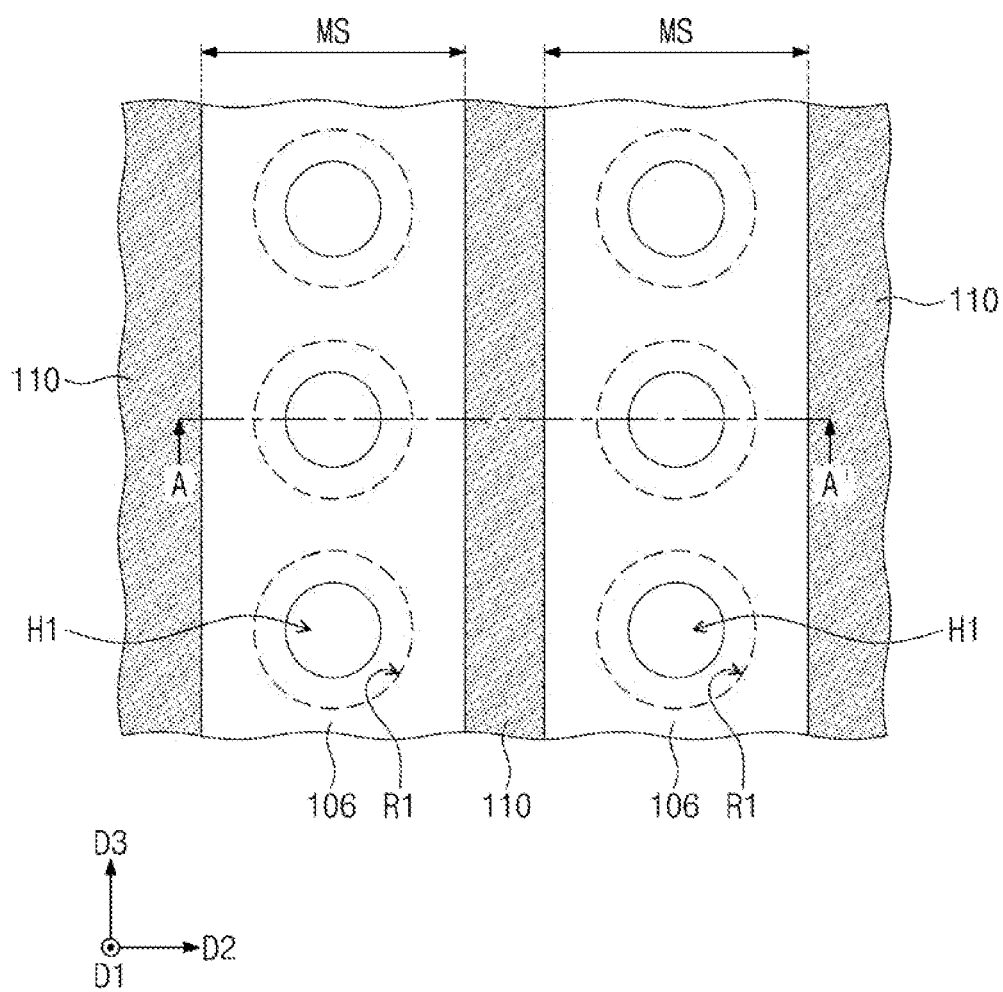
Figure 7:
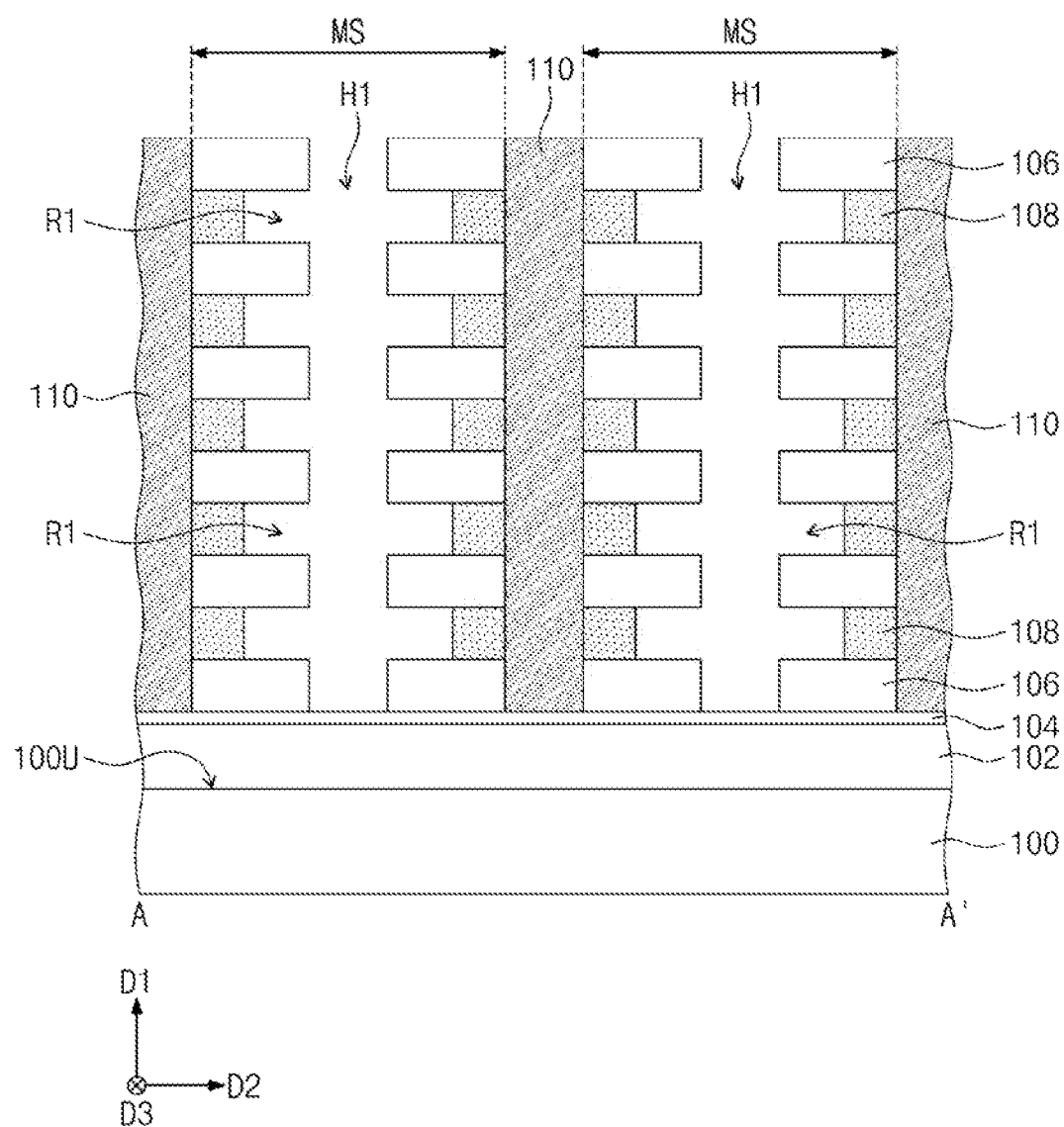

Referring to FIGS. 6 and 7, first sacrificial patterns 110 may be formed in the first trenches T1, respectively.

The first sacrificial patterns 110 may be formed to fill the first trenches T1, respectively. The first sacrificial patterns 110 may be spaced apart from each other in the second direction D2 with the mold structure MS interposed therebetween and may be extended in the third direction D3. The first sacrificial patterns 110 may cover opposite side surfaces of the mold structure MS. The first sacrificial patterns 110 may be formed of or include a material having an etch selectivity with respect to the second insulating patterns 108.

In an example embodiment, each of the first sacrificial patterns 110 may include a silicon oxide layer, which is formed to conformally cover an inner surface of each of the first trenches T1 and to fill an upper region of each of the first trenches T1, and a silicon nitride layer, which is formed to fill a remaining region of each of the first trenches T1.

Each of the first holes H1 may be formed to expose side surfaces of the first and second insulating patterns 106 and 108 of the mold structure MS.

The exposed side surfaces of the second insulating patterns 108 may be selectively recessed, and thus, first recess regions R1 may be formed in the mold structure MS. In an example embodiment, the formation of the first recess regions R1 may include performing an etching process, which has an etch selectivity with respect to the second insulating patterns 108, to laterally etch the exposed side surfaces of the second insulating patterns 108. The first recess regions R1 may be spaced apart from each other in the first direction D1 and may be respectively interposed between the first insulating patterns 106. Each of the first recess regions R1 may be formed to enclose each of the first holes H1, when viewed in a plan view.

Figure 8:
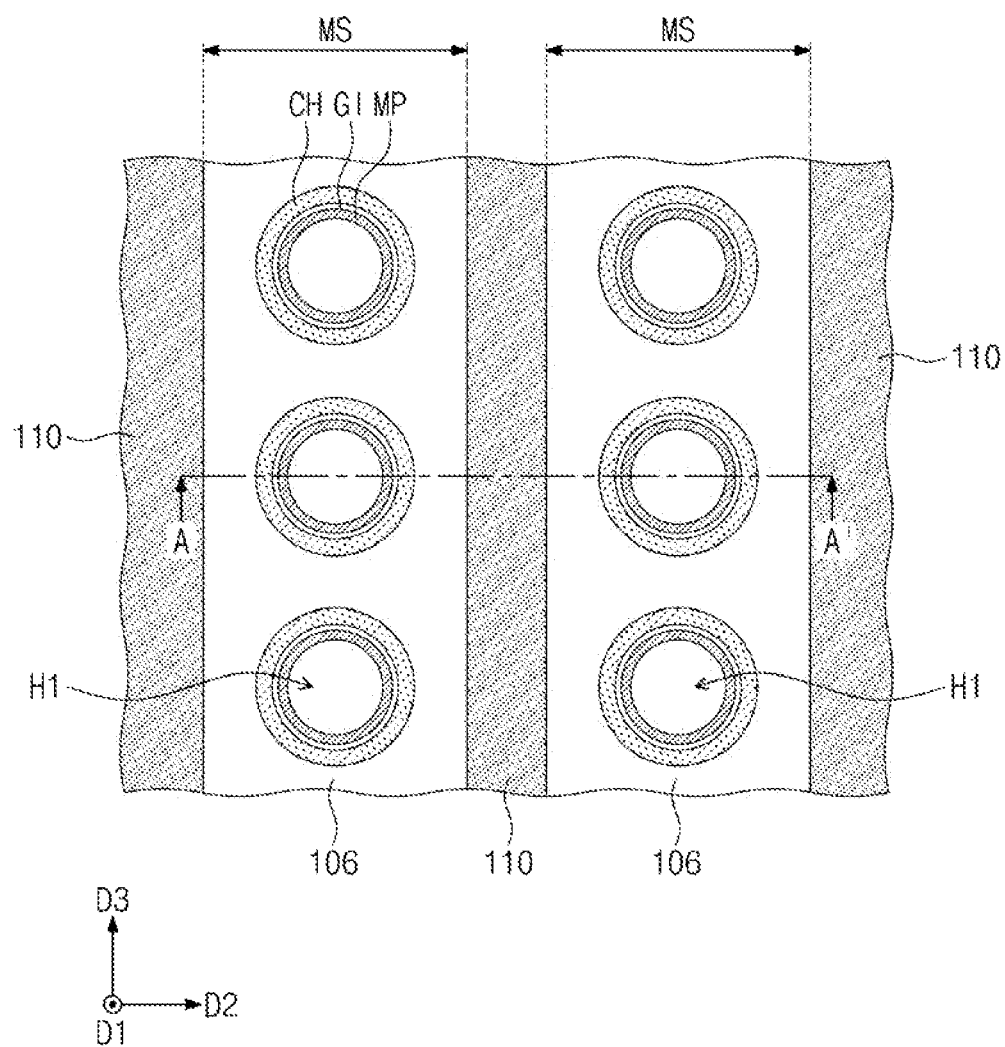
Figure 9:
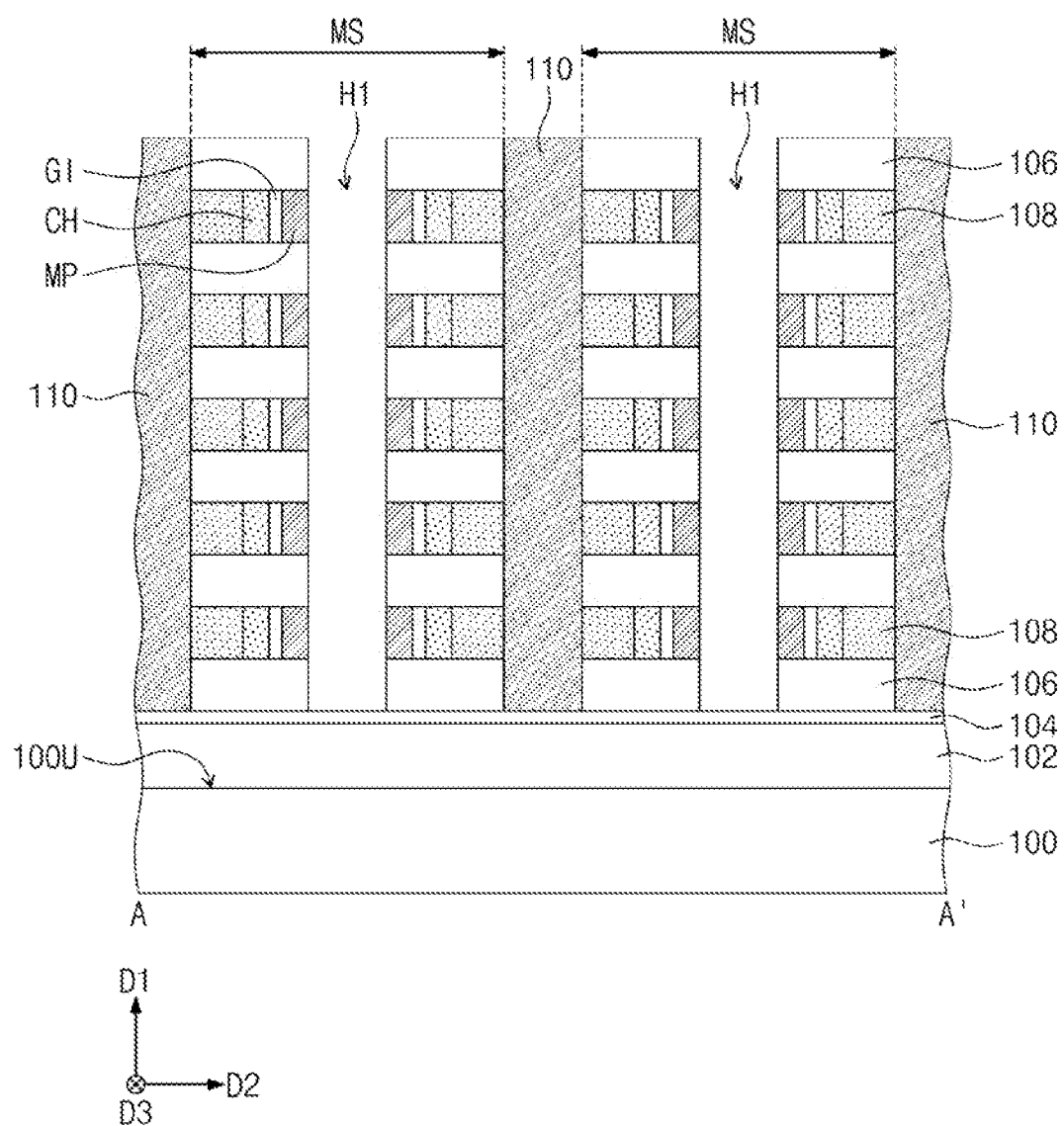

Referring to FIGS. 8 and 9, a plurality of channel patterns CH may be formed in the first recess regions R1, respectively.

Each of the channel patterns CH may fill a portion of each of the first recess regions R1. In an example embodiment, the formation of the channel patterns CH may include forming a channel layer to fill the first recess regions R1 and a portion of each of the first holes H1, removing the channel layer from the first holes H1, and laterally etching the channel layer until the channel layer has a desired thickness in each of the first recess regions R1.

A plurality of gate insulating patterns GI may be respectively formed in the first recess regions R1 to cover side surfaces of the channel patterns CH, respectively.

Each of the gate insulating patterns GI may fill a portion of each of the first recess regions R1.

A plurality of metal patterns MP may be respectively formed in the first recess regions R1 to cover side surfaces of the gate insulating patterns GI, respectively. Each of the metal patterns MP may fill a remaining region of each of the first recess regions R1.

The gate insulating patterns GI and the metal patterns MP may be formed by substantially the same method as the channel patterns CH.

Figure 10:
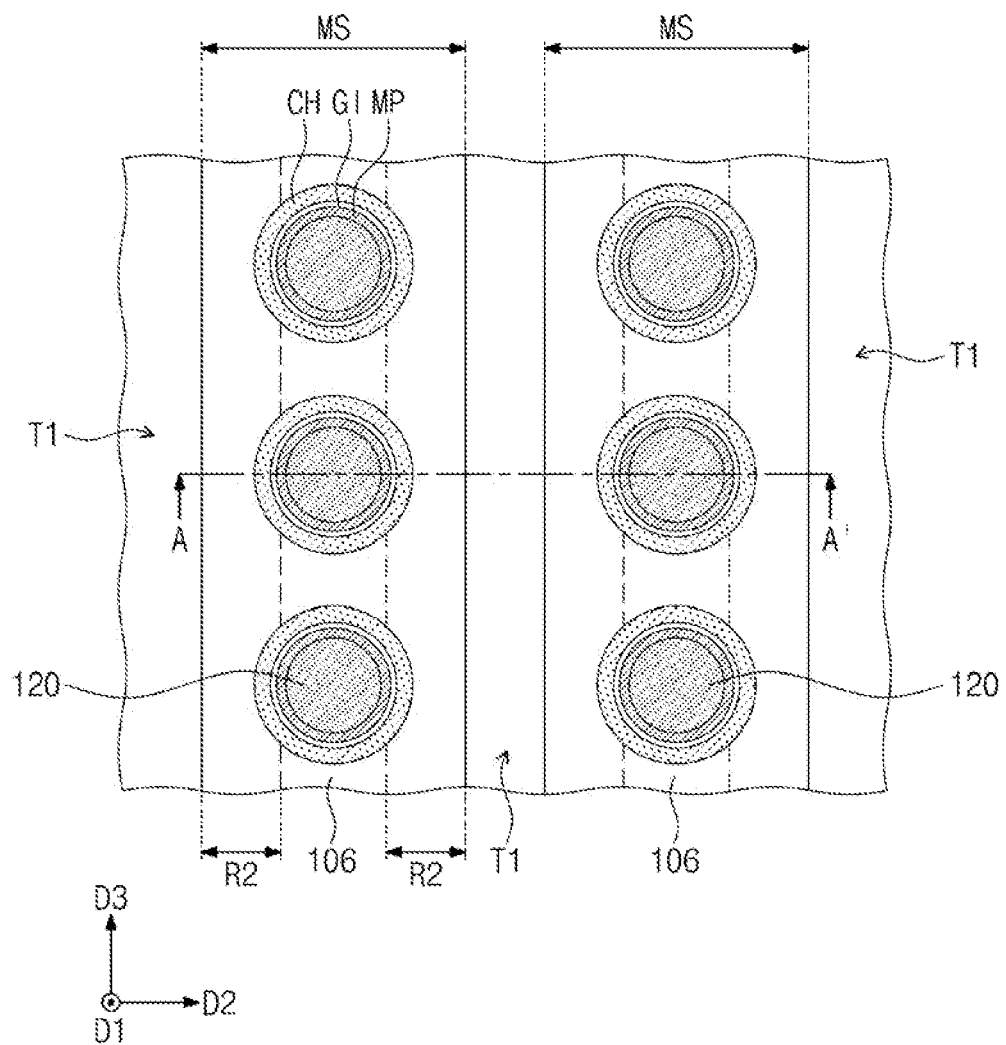
Figure 11:
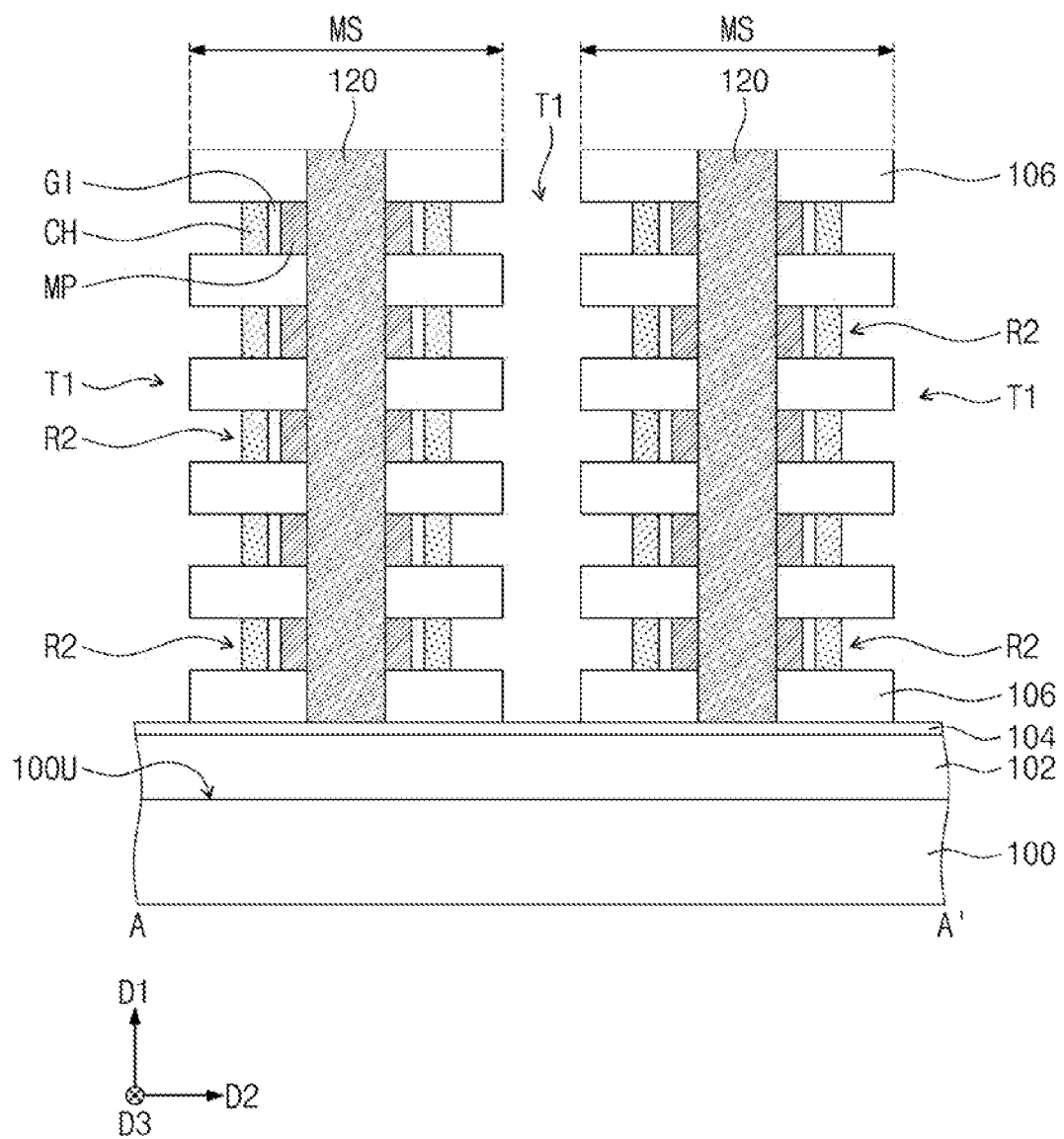

Referring to FIGS. 10 and 11, second sacrificial patterns 120 may be formed in the first holes H1, respectively.

The second sacrificial patterns 120 may be formed to fill the first holes H1, respectively. The second sacrificial patterns 120 may be provided in the mold structure MS to be spaced apart from each other in the third direction D3.

The second sacrificial patterns 120 may be formed of or include a material having an etch selectivity with respect to the second insulating patterns 108. As an example, each of the second sacrificial patterns 120 may include a silicon oxide layer, which is formed to conformally cover an inner surface of each of the first holes H1 and to fill an upper region of each of the first holes H1, and a silicon nitride layer, which is formed to fill a remaining region of each of the first holes H1.

The first sacrificial patterns 110 may be removed at the first trenches T1.

Each of the first trenches T1 may be formed to expose side surfaces of the first and second insulating patterns 106 and 108 of the mold structure MS. The exposed side surfaces of the second insulating patterns 108 may be selectively recessed, and thus, second recess regions R2 may be formed in the mold structure MS.

The formation of the second recess regions R2 may include performing an etching process, which has an etch selectivity with respect to the second insulating patterns 108, to laterally etch the exposed side surfaces of the second insulating patterns 108.

The second recess regions R2 may expose side surfaces of the channel patterns CH. The second recess regions R2 may be spaced apart from each other in the first direction D1 and may be respectively interposed between the first insulating patterns 106. Each of the second recess regions R2 may have a line shape extending in the third direction D3.

Figure 12:
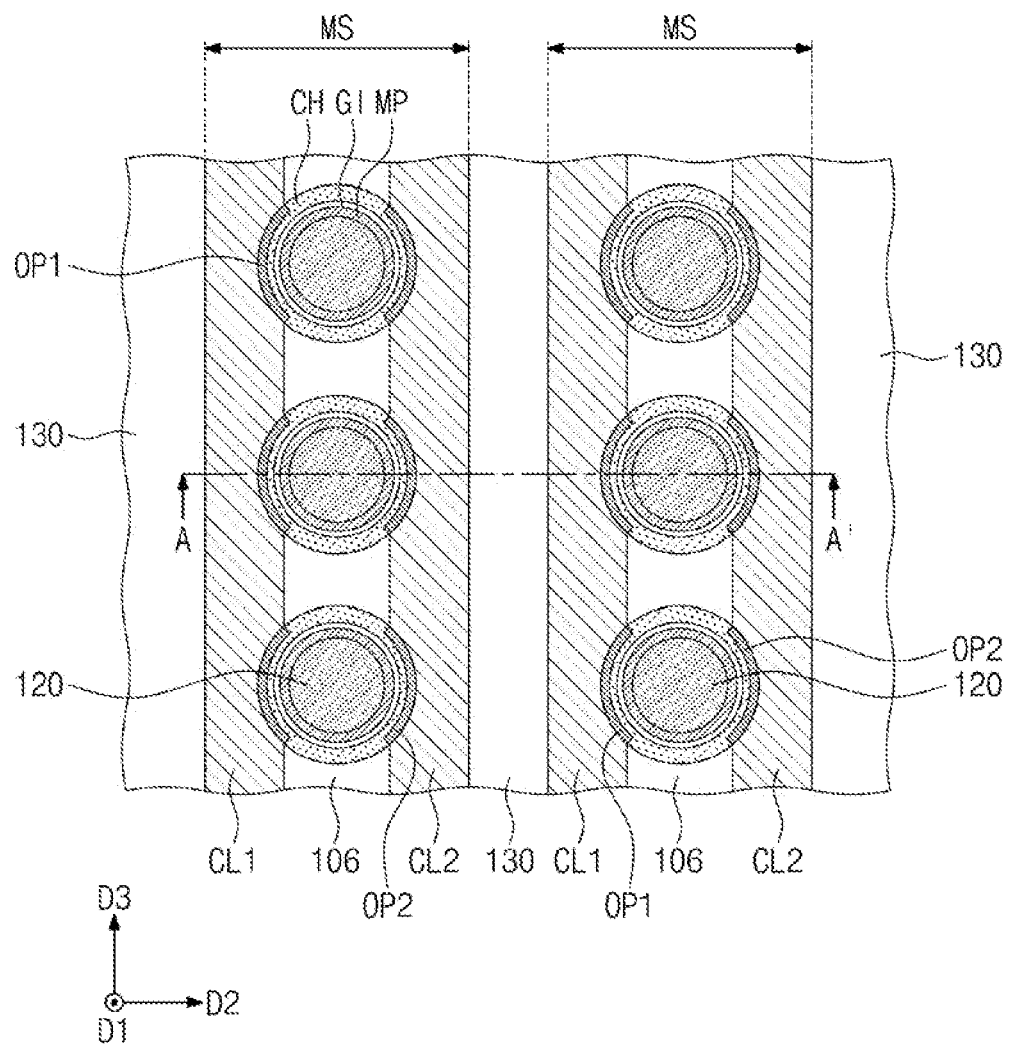
Figure 13:
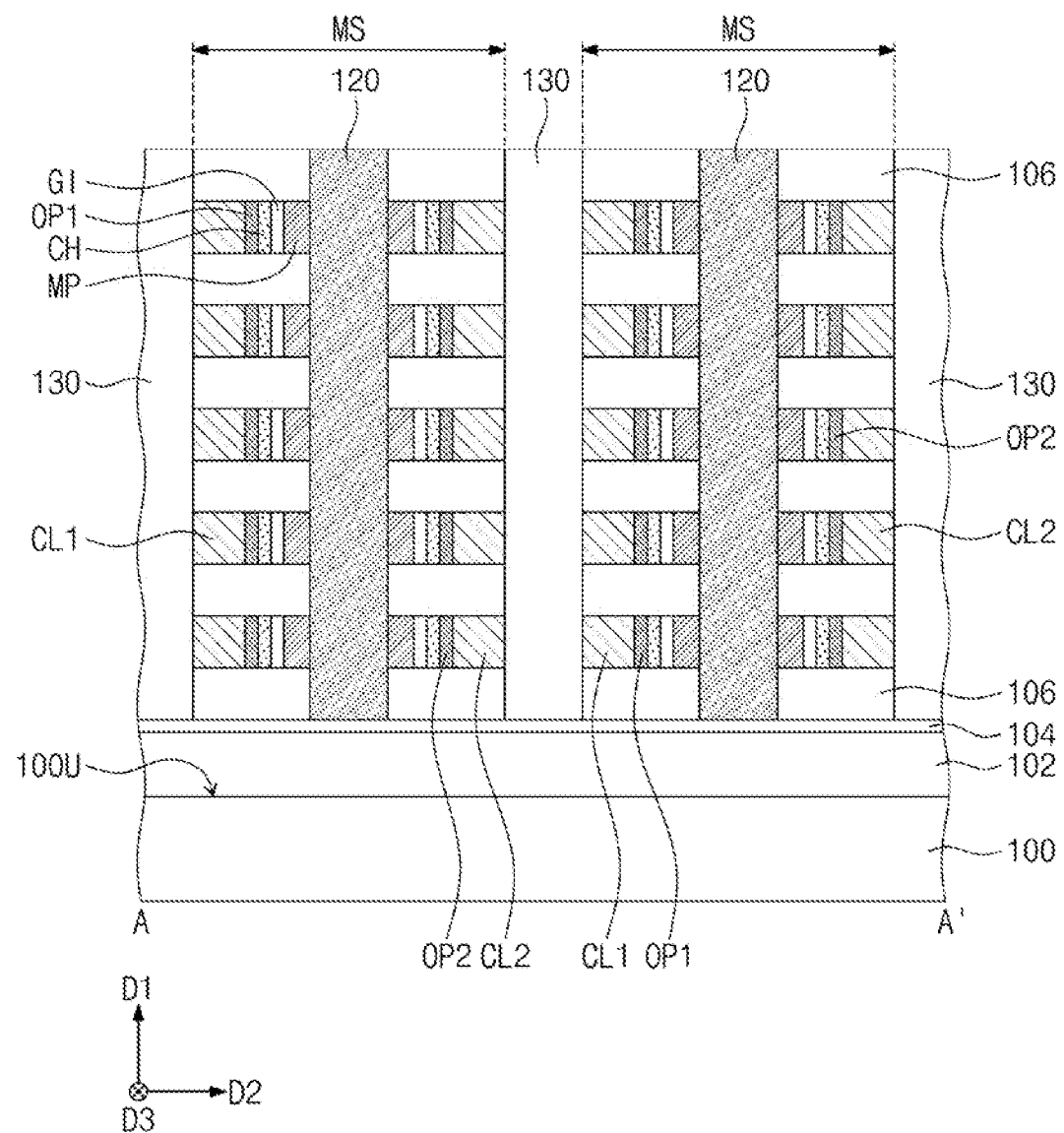

Referring to FIGS. 12 and 13, first conductive lines CL1 and first impurity patterns OP1 may be formed in corresponding ones of the second recess regions R2.

Each of the first impurity patterns OP1 may fill a portion of each of the corresponding second recess regions R2, and may be in contact with a side surface of each of the channel patterns CH. Each of the first conductive lines CL1 may fill a remaining region of each of the corresponding second recess regions R2.

Second conductive lines CL2 and second impurity patterns OP2 may be formed in corresponding ones of the second recess regions R2.

Each of the second impurity patterns OP2 may fill a portion of each of the corresponding second recess regions R2, and may be in contact with an opposite side surface of each of the channel patterns CH. Each of the second conductive lines CL2 may fill a remaining region of each of the corresponding second recess regions R2.

In an example embodiment, the formation of the first and second impurity patterns OP1 and OP2 may include doping side surfaces of the channel patterns CH, which are exposed by the second recess regions R2, with impurities. The first and second impurity patterns OP1 and OP2 may have the same conductivity type, and the impurities may be n-type or p-type impurities. In an example embodiment, the formation of the first and second conductive lines CL1 and CL2 may include forming a conductive layer to fill remaining portions of the second recess regions R2 and to fill a portion of each of the first trenches T1 and removing the conductive layer from the first trenches T1.

The first conductive lines CL1 may be spaced apart from each other in the first direction D1, and the first impurity patterns OP1 may be spaced apart from each other in the first direction D1. The first insulating patterns 106 may be respectively interposed between the first conductive lines CL1, and may be extended into regions between the first impurity patterns OP1. The second conductive lines CL2 may be spaced apart from the first conductive lines CL1 in the second direction D2, and the second impurity patterns OP2 may be spaced apart from the first impurity patterns OP1 in the second direction D2. The first and second impurity patterns OP1 and OP2 may be disposed between the first and second conductive lines CL1 and CL2. The second conductive lines CL2 may be spaced apart from each other in the first direction D1, and the second impurity patterns OP2 may be spaced apart from each other in the first direction D1. The first insulating patterns 106 may be respectively interposed between the second conductive lines CL2, and may be extended to regions between the second impurity patterns OP2.

The second sacrificial patterns 120, the channel patterns CH, the gate insulating patterns GI, and the metal patterns MP may be disposed between the first and second conductive lines CL1 and CL2. The first impurity patterns OP1 may be respectively interposed between the first conductive lines CL1 and the channel patterns CH, and the second impurity patterns OP2 may be respectively interposed between the second conductive lines CL2 and the channel patterns CH.

Sidewall insulating patterns 130 may be formed in the first trenches T1, respectively.

The sidewall insulating patterns 130 may be formed to fill the first trenches T1, respectively. The sidewall insulating patterns 130 may be spaced apart from each other in the second direction D2 with the mold structure MS interposed therebetween. One of the sidewall insulating patterns 130 may be extended in the first direction D1 to cover side surfaces of the first conductive lines CL1, and another of the sidewall insulating patterns 130 may be extended in the first direction D1 to cover side surfaces of the second conductive lines CL2. Each of the sidewall insulating patterns 130 may have a line shape extending in the third direction D3.

Figure 14:
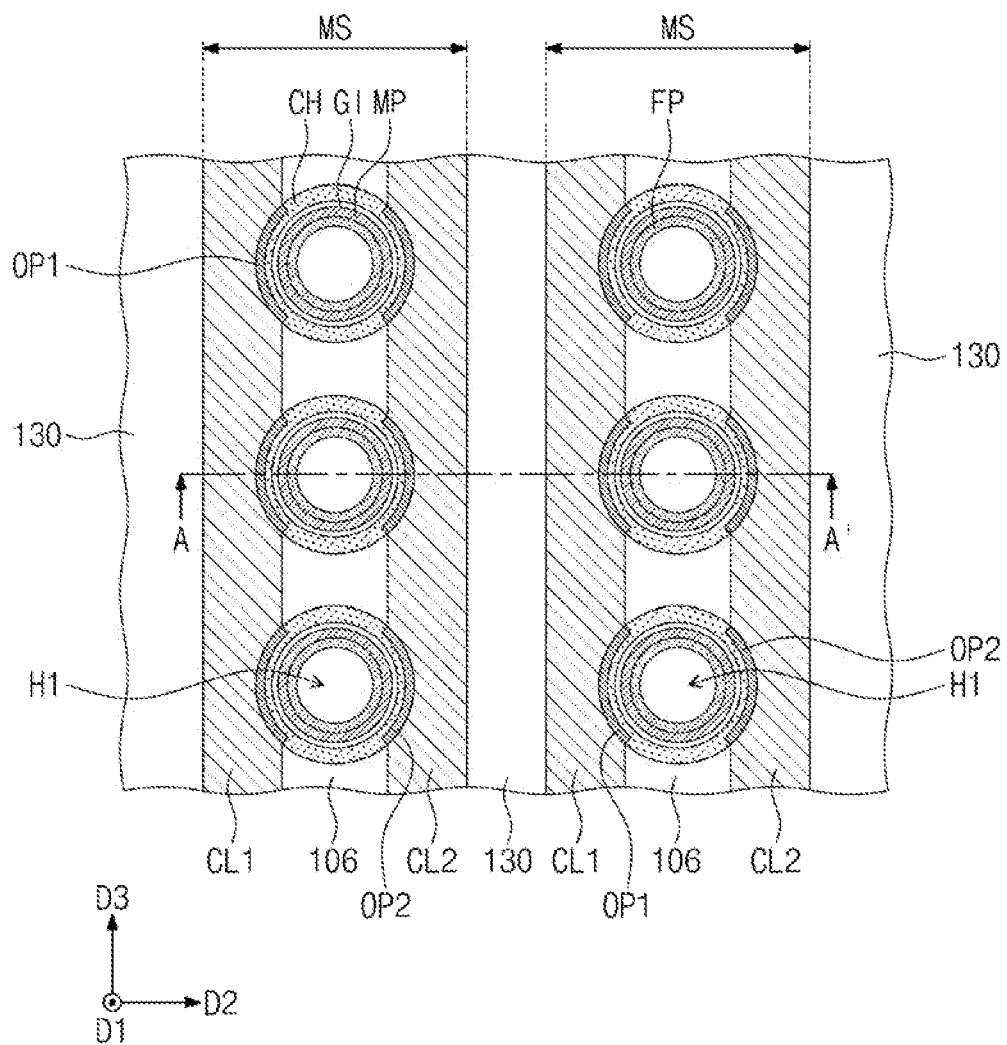
Figure 15:
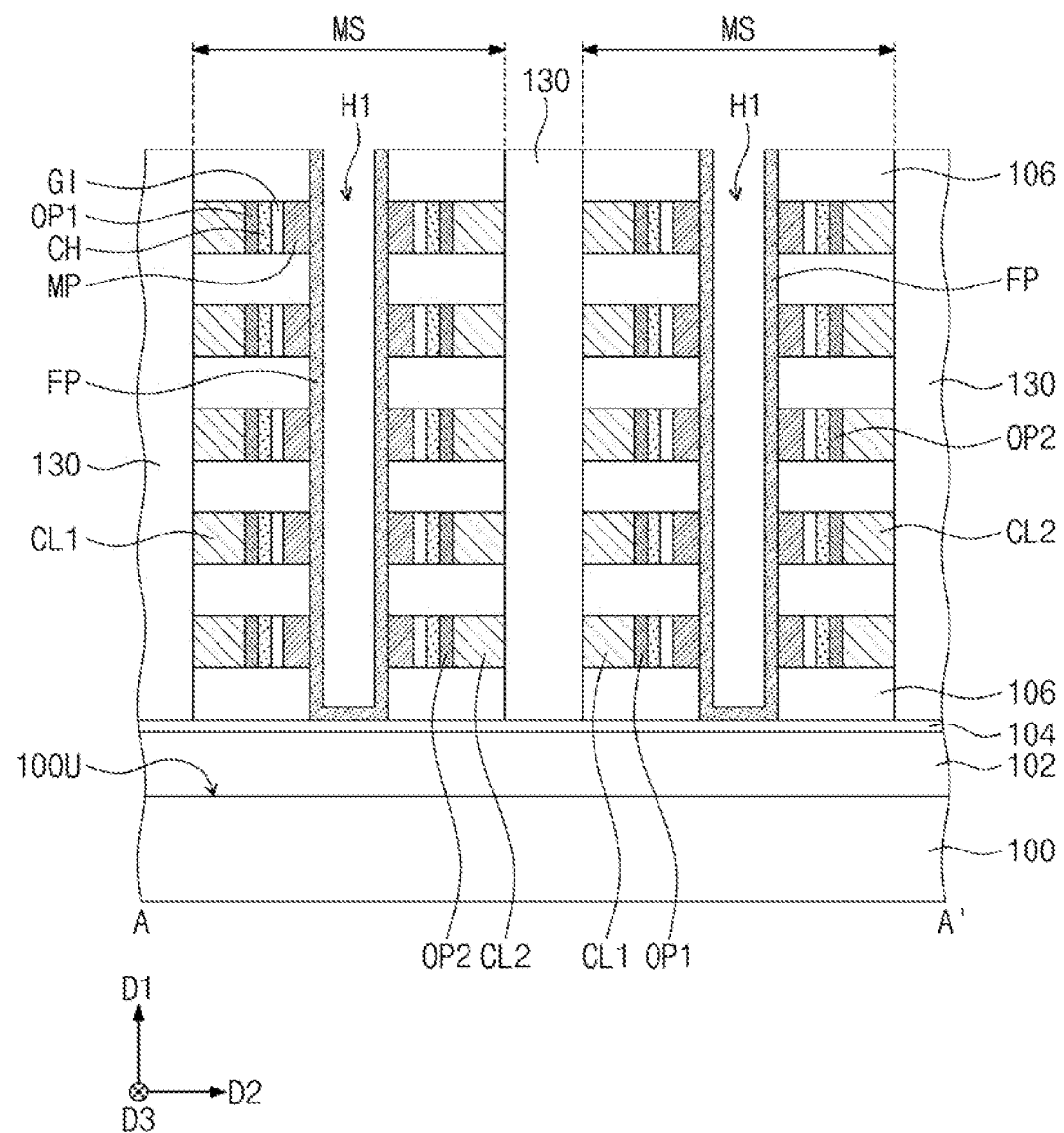

Referring to FIGS. 14 and 15, the second sacrificial patterns 120 may be removed from the first holes H1.

A ferroelectric pattern FP may be formed in each of the first holes H1. The ferroelectric pattern FP may be formed to fill a portion of each of the first holes H1, and to conformally cover an inner surface of each of the first holes H1. The ferroelectric pattern FP may be formed to cover side surfaces of the metal patterns MP, side surfaces of the first insulating patterns 106, and a top surface of the etch stop layer 104.

Referring back to FIGS. 2 and 3, a gate electrode GE may be formed in each of the first holes H1. The gate electrode GE may be formed to fill a remaining region of each of the first holes H1.

A stack SS may be constituted by the gate electrode GE, the ferroelectric pattern FP, the channel patterns CH, the gate insulating patterns GI, the metal patterns MP, the first and second conductive lines CL1 and CL2, the first and second impurity patterns OP1 and OP2, and the first insulating patterns 106.

Figure 16:
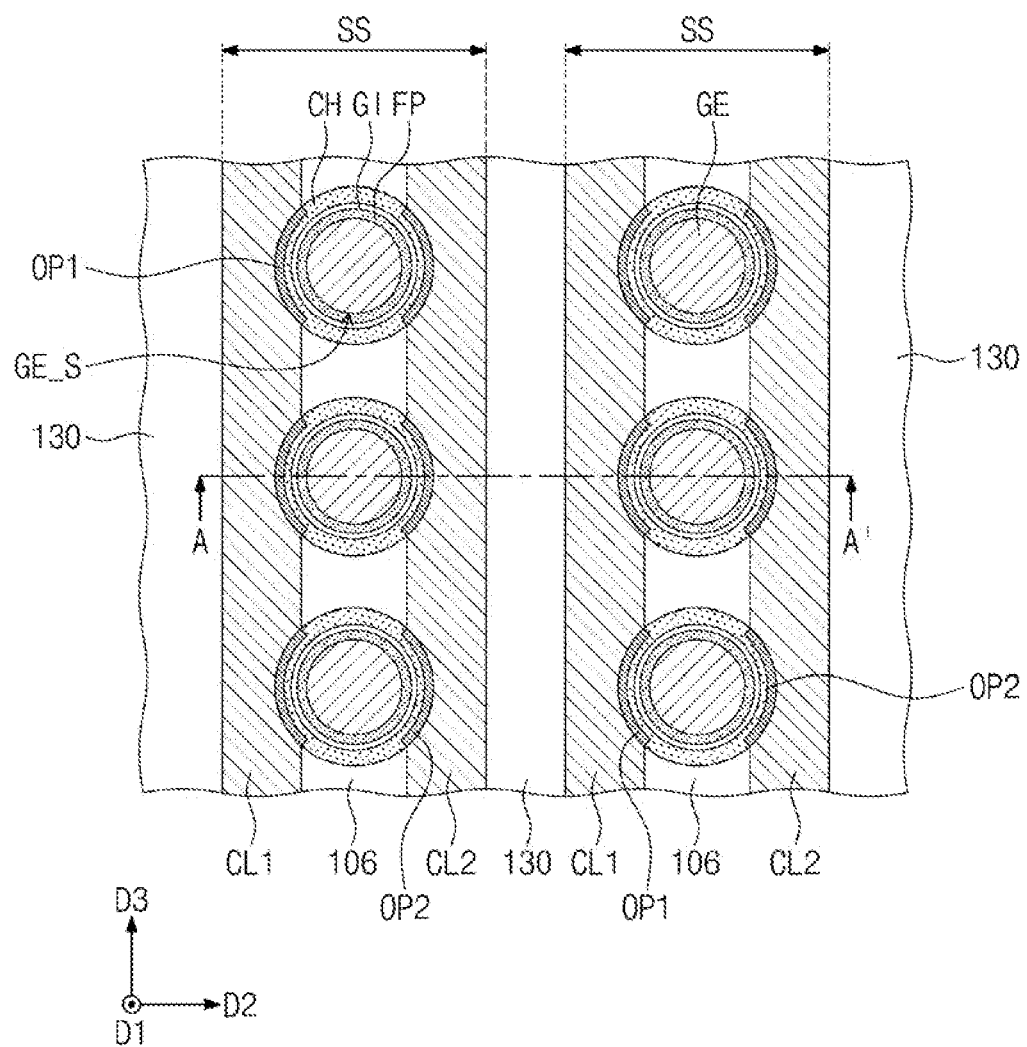
FIG. 16 is a plan view illustrating a semiconductor device according to an example embodiment.
Figure 17:
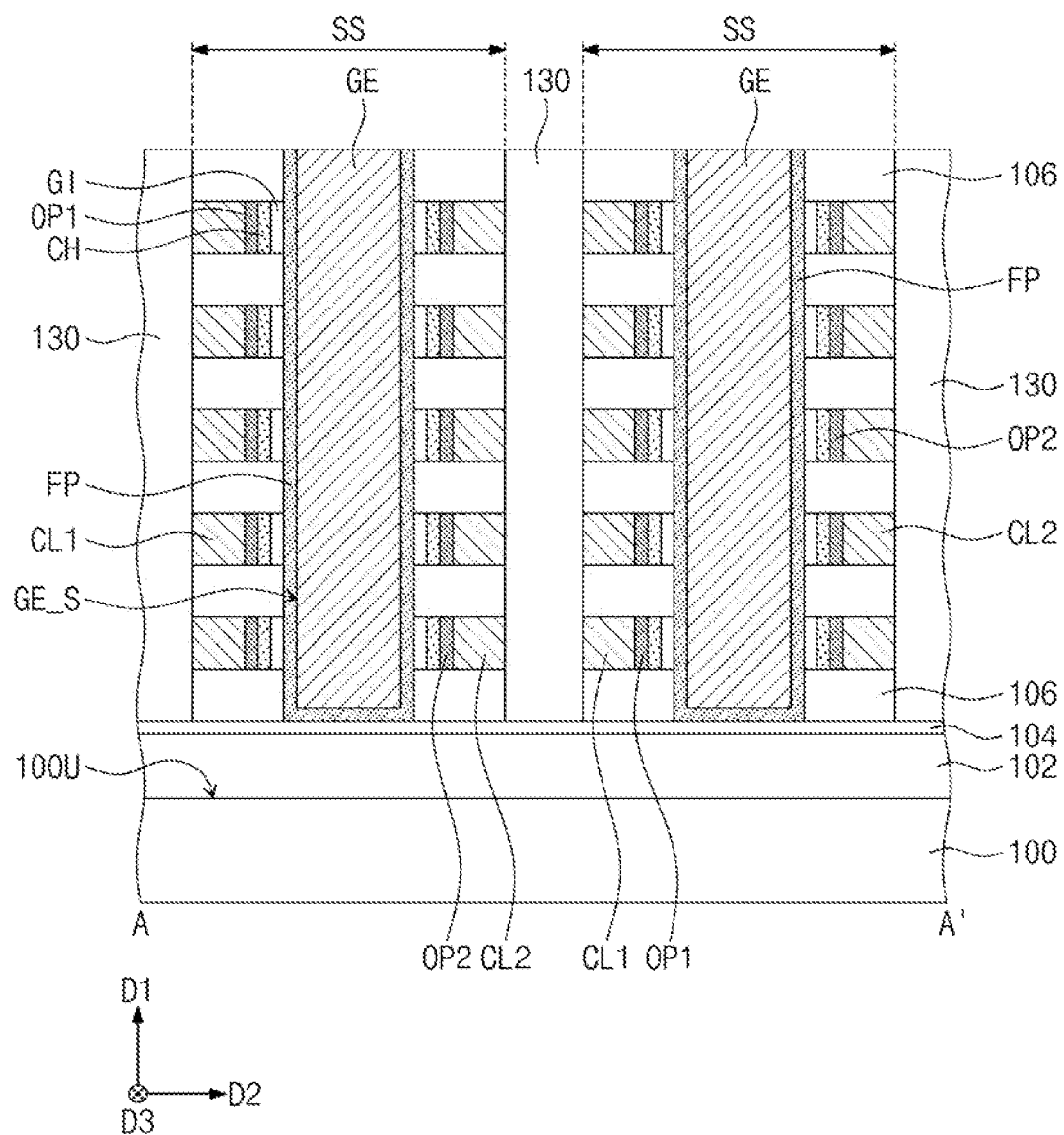
FIG. 17 is a sectional view taken along a line A-A' of FIG. 16.

FIG. 16 is a plan view illustrating a semiconductor device according to an example embodiment, and FIG. 17 is a sectional view taken along a line A-A' of FIG. 16. For the sake of brevity, features, which are different from the semiconductor device described with reference to FIGS. 1 to 3, will be mainly described below.

Referring to FIGS. 16 and 17, the stack SS may include the channel patterns CH enclosing a side surface GE_S of a corresponding one of the gate electrodes GE, the ferroelectric pattern FP between each of the channel patterns CH and the corresponding gate electrode GE, and the gate insulating pattern GI between each of the channel patterns CH and the ferroelectric pattern FP.

According to the present example embodiments, the stack SS may not include the metal pattern MP between the ferroelectric pattern FP and the gate insulating pattern GI described with reference to FIGS. 1 to 3.

The gate insulating pattern GI may enclose the side surface GE_S of the corresponding gate electrode GE, and may be spaced apart from the side surface GE_S of the corresponding gate electrode GE with the ferroelectric pattern FP interposed therebetween. The gate insulating pattern GI may be in contact with a side surface of the ferroelectric pattern FP.

A ferroelectric field effect transistor may be constituted by the corresponding gate electrode GE, each of the channel patterns CH enclosing the side surface GE_S of the corresponding gate electrode GE, the ferroelectric pattern FP and the gate insulating pattern GI interposed between each of the channel patterns CH and the corresponding gate electrode GE, and corresponding first and second impurity patterns OP1 and OP2, which are disposed at both sides of each of the channel patterns CH.

Except for the afore-described differences, the semiconductor device according to the present example embodiment may be configured to have substantially the same features as the semiconductor device described with reference to FIGS. 1 to 3.

Figure 18:
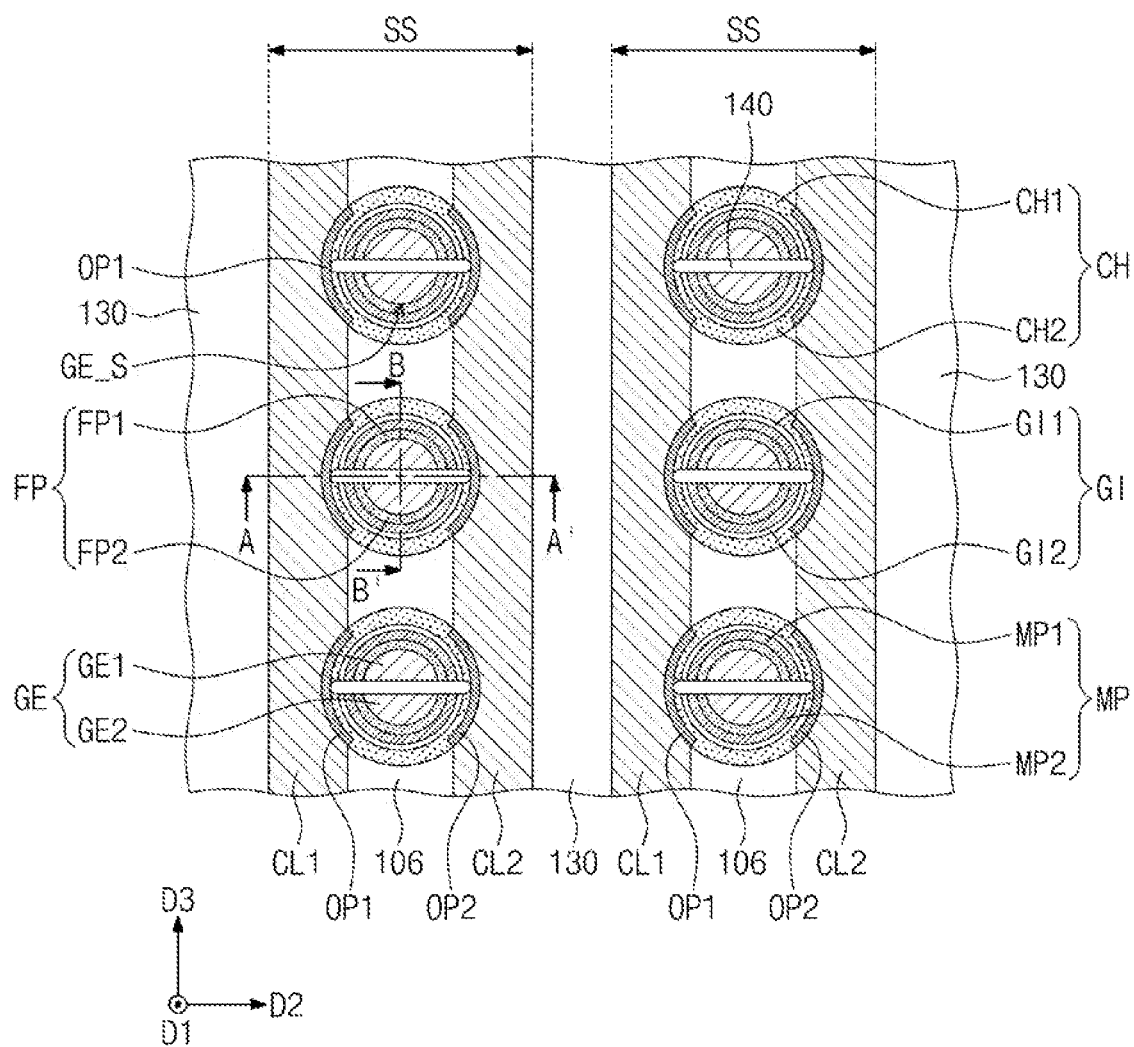
FIG. 18 is a plan view illustrating a semiconductor device according to an example embodiment.
Figure 19:
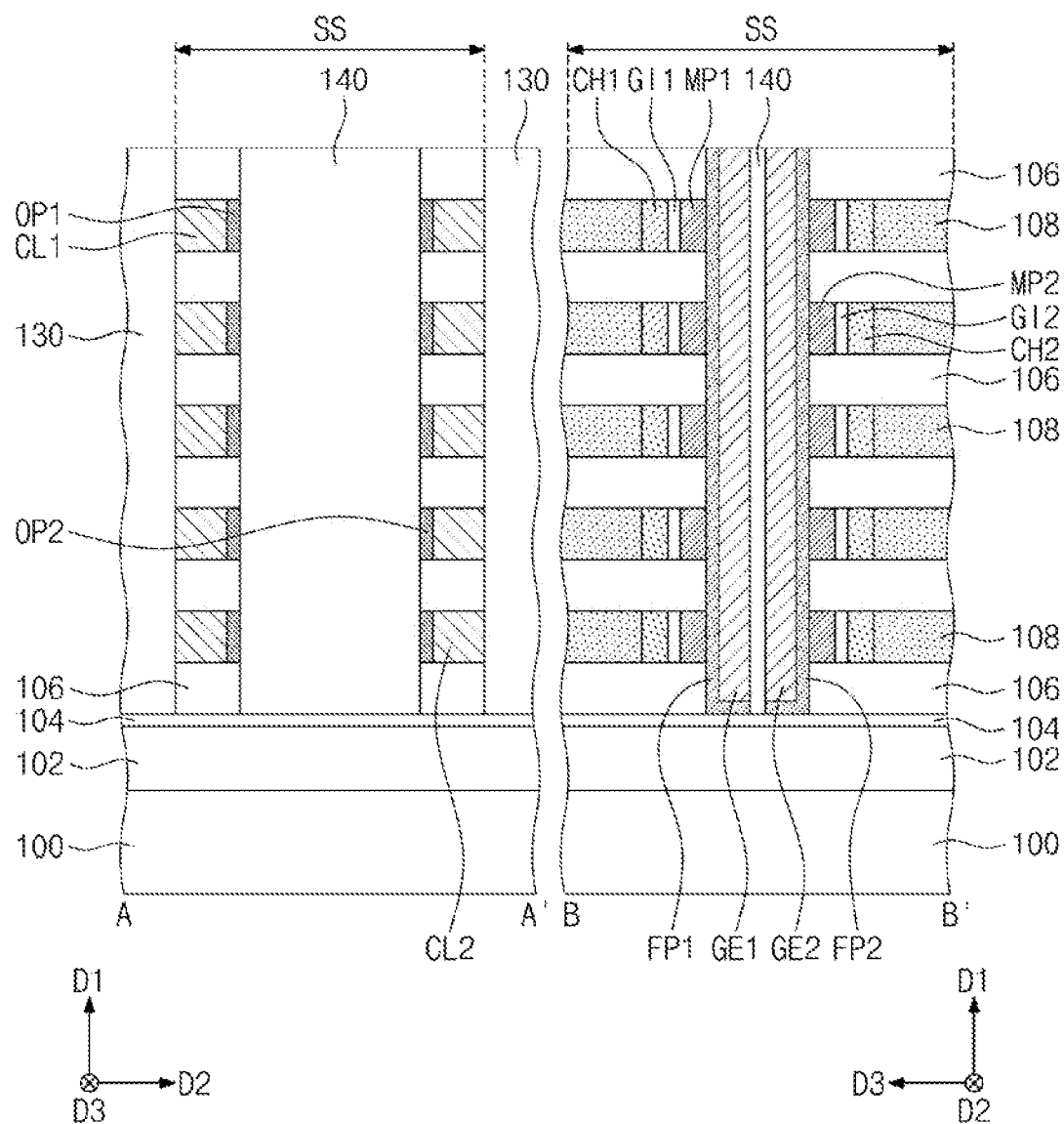
FIG. 19 is a sectional view taken along lines A-A' and B-B' of FIG. 18.

FIG. 18 is a plan view illustrating a semiconductor device according to an example embodiment, and FIG. 19 is a sectional view taken along lines A-A' and B-B' of FIG. 18. For the sake of brevity, features, which are different from the semiconductor device described with reference to FIGS. 1 to 3, will be mainly described below.

Referring to FIGS. 18 and 19, the stack SS may further include a separation insulating pattern 140, which is provided to penetrate each of the gate electrodes GE.

The separation insulating pattern 140 may be extended in the second direction D2 to penetrate a corresponding one of the gate electrodes GE, the ferroelectric pattern FP, the metal pattern MP, the gate insulating pattern GI, and each of the channel patterns CH. The separation insulating pattern 140 may be extended in the first direction D1 to penetrate the corresponding gate electrode GE and a bottom portion of the ferroelectric pattern FP.

The corresponding gate electrode GE may be divided into a first gate electrode GE1 and a second gate electrode GE2, which are spaced apart from each other in the third direction D3 by the separation insulating pattern 140. The ferroelectric pattern FP may be divided into a first ferroelectric pattern FP1 and a second ferroelectric pattern FP2, which are spaced apart from each other in the third direction D3 by the separation insulating pattern 140. The metal pattern MP may be divided into a first metal pattern MP1 and a second metal pattern MP2, which are spaced apart from each other in the third direction D3 by the separation insulating pattern 140. The gate insulating pattern GI may be divided into a first gate insulating pattern GI1 and a second gate insulating pattern GI2, which are spaced apart from each other in the third direction D3 by the separation insulating pattern 140. Each of the channel patterns CH may be divided into a first channel pattern CH1 and a second channel pattern CH2, which are spaced apart from each other in the third direction D3 by the separation insulating pattern 140.

A first ferroelectric field effect transistor may be constituted by the first gate electrode GE1, the first ferroelectric pattern FP1, the first metal pattern MP1, the first gate insulating pattern GI1, and the first channel pattern CH1.

A second ferroelectric field effect transistor may be constituted by the second gate electrode GE2, the second ferroelectric pattern FP2, the second metal pattern MP2, the second gate insulating pattern GI2, and the second channel pattern CH2.

The first ferroelectric field effect transistor and the second ferroelectric field effect transistor may be electrically separated or disconnected from each other by the separation insulating pattern 140.

The separation insulating pattern 140 may be formed of or include at least one of silicon oxide, silicon nitride, and/or silicon oxynitride.

The first channel pattern CH1 and the second channel pattern CH2 may be connected to a corresponding one of the first impurity patterns OP1, and may be connected to a corresponding one of the first conductive lines CL1 through the corresponding first impurity pattern OP1. The first channel pattern CH1 and the second channel pattern CH2 may share the corresponding first impurity pattern OP1 and the corresponding first conductive line CL1. The first channel pattern CH1 and the second channel pattern CH2 may be connected to a corresponding one of the second impurity patterns OP2 and may be connected to a corresponding one of the second conductive lines CL2 through the corresponding second impurity pattern OP2. The first channel pattern CH1 and the second channel pattern CH2 may share the corresponding second impurity pattern OP2 and the corresponding second conductive line CL2.

Figure 20:
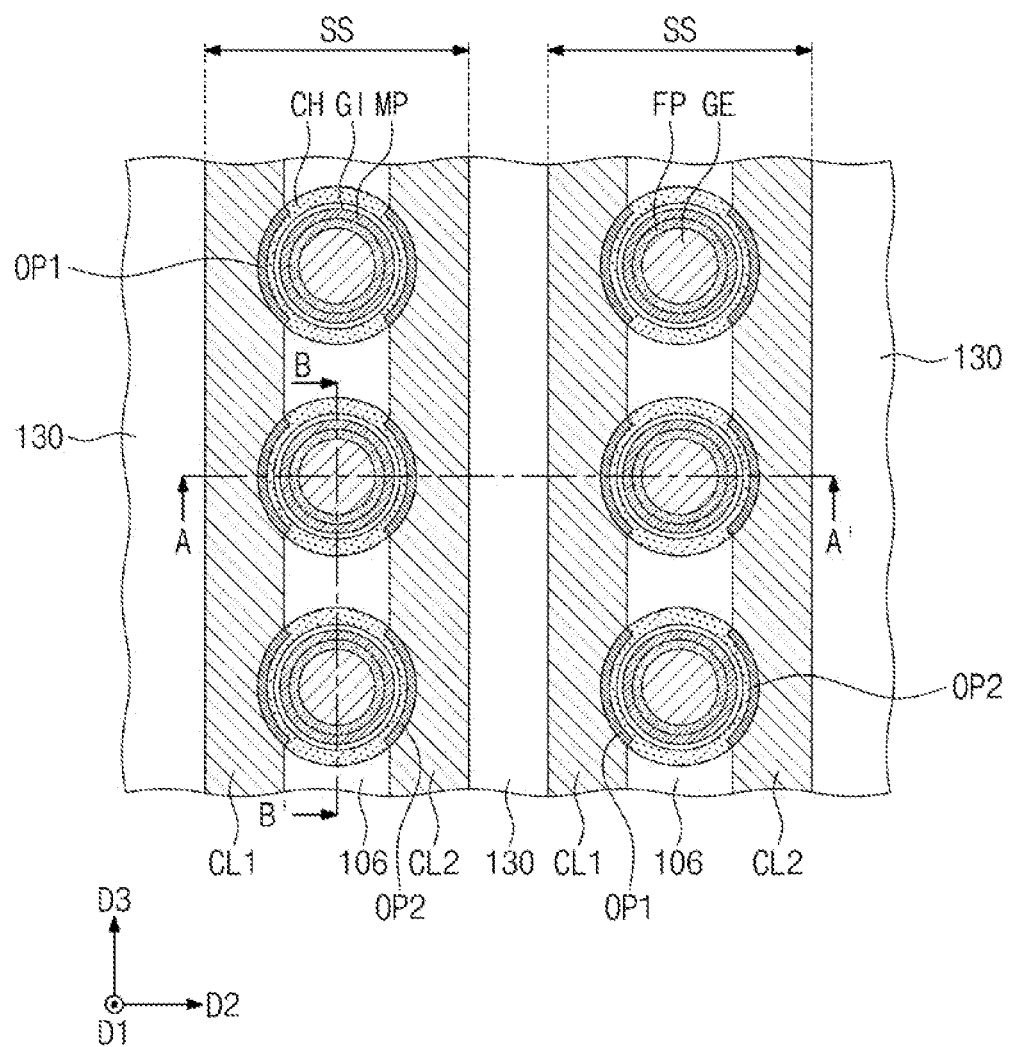
FIG. 20 is a plan view illustrating a semiconductor device according to an example embodiment.
Figure 21:
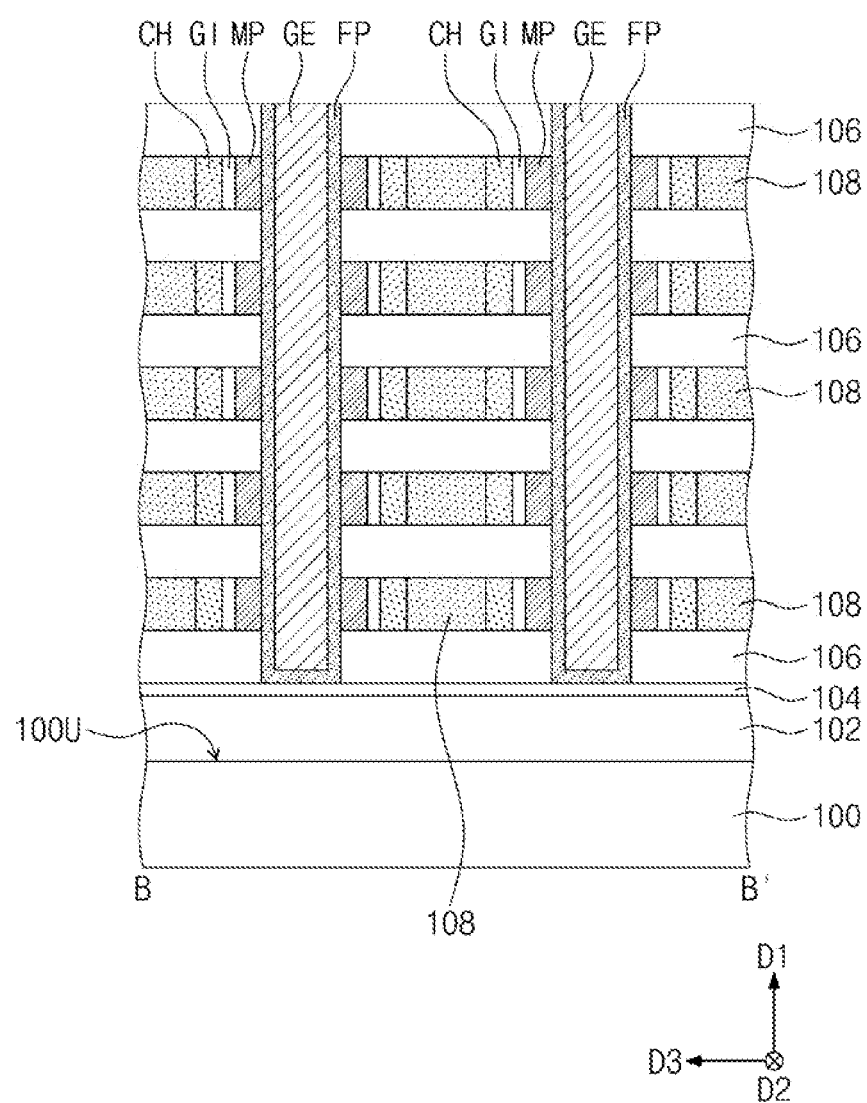
FIGS. 21 to 23 are sectional views taken along a line B-B' of FIG. 20.
Figure 22:
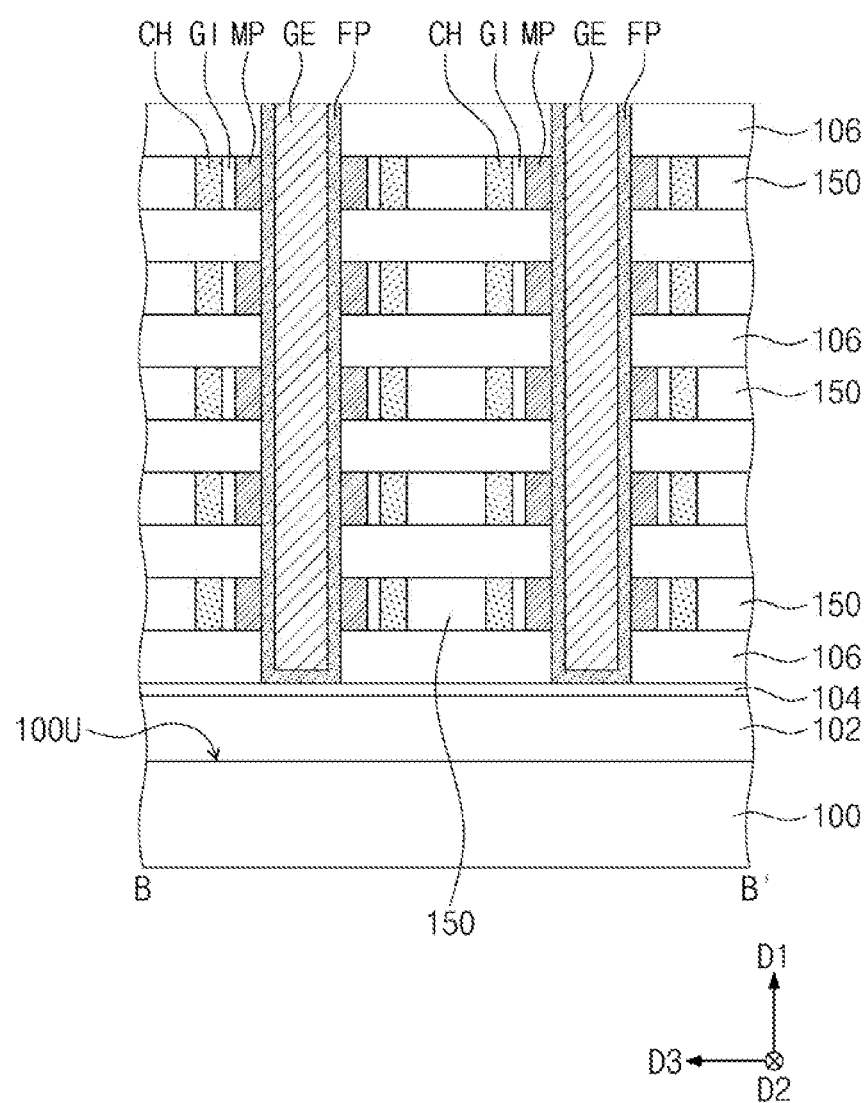
Figure 23:
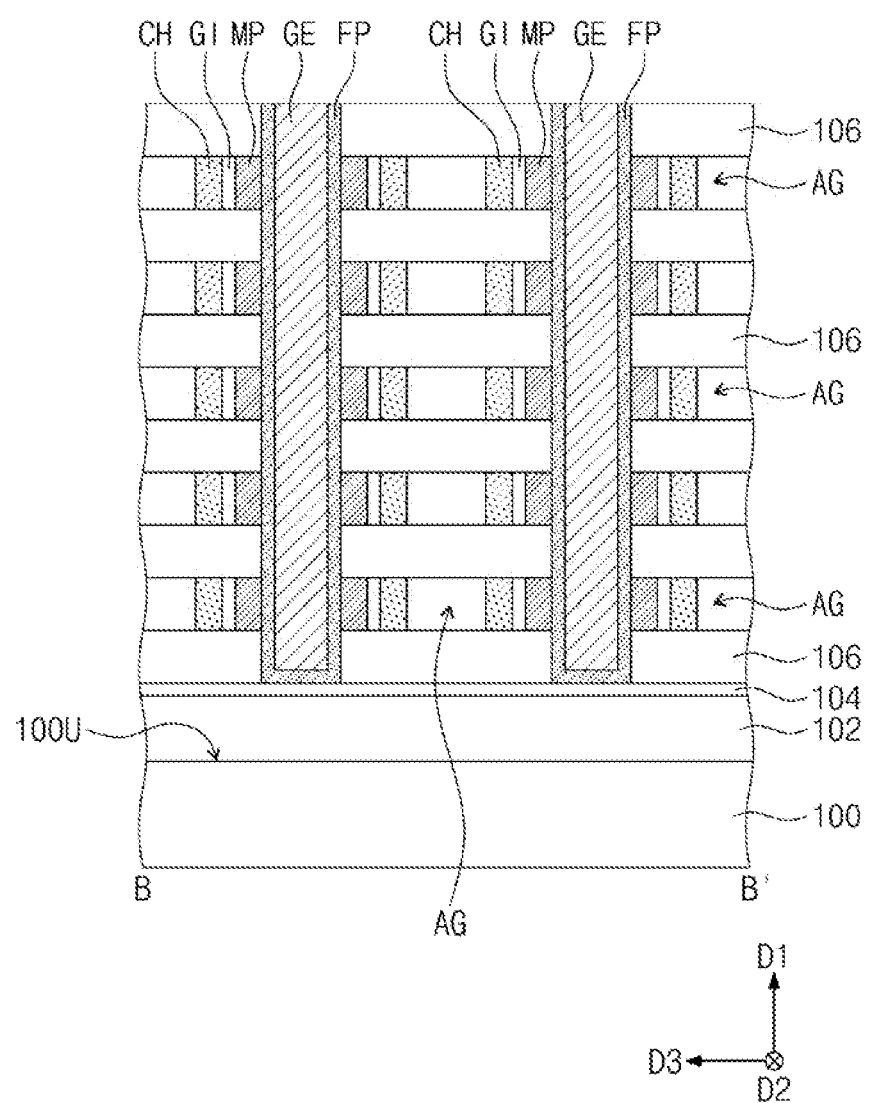

FIG. 20 is a plan view illustrating a semiconductor device according to an example embodiment. FIGS. 21 to 23 is a sectional views taken along a line B-B' of FIG. 20. A sectional view taken along a line A-A' of FIG. 20 may be substantially the same as FIG. 3. For the sake of brevity, features, which are different from the semiconductor device described with reference to FIGS. 1 to 3, will be mainly described below.

Referring to FIGS. 20 and 21, the stack SS may further include second insulating patterns 108, which are interposed between the adjacent ones of the channel patterns CH spaced apart from each other in the third direction D3.

The adjacent ones of the channel patterns CH may be electrically separated or disconnected from each other by the second insulating patterns 108. The second insulating patterns 108 may be interposed between a corresponding one of the first conductive lines CL1 and a corresponding one of the second conductive lines CL2. The second insulating patterns 108 may be interposed between the first insulating patterns 106.

The second insulating patterns 108 may be formed of or include a material different from the first insulating patterns 106. In an example embodiment, the first insulating patterns 106 may be formed of or include silicon oxide, and the second insulating patterns 108 may be formed of or include silicon nitride.

Referring to FIGS. 20 and 22, the stack SS may further include third insulating patterns 150, which are interposed between the adjacent ones of the channel patterns CH spaced apart from each other in the third direction D3.

The adjacent ones of the channel patterns CH may be electrically separated or disconnected from each other by the third insulating patterns 150. The third insulating patterns 150 may be interposed between a corresponding one of the first conductive lines CL1 and a corresponding one of the second conductive lines CL2. The third insulating patterns 150 may be interposed between the first insulating patterns 106.

The third insulating patterns 150 may be formed of or include the same material as the first insulating patterns 106. As an example, the first insulating patterns 106 and the third insulating patterns 150 may be formed of or include silicon oxide.

Referring to FIGS. 20 and 23, the stack SS may further include air gaps AG, which are interposed between the adjacent ones of the channel patterns CH spaced apart from each other in the third direction D3. The adjacent ones of the channel patterns CH may be electrically separated or disconnected from each other by the air gaps AG.

The air gaps AG may be interposed between a corresponding one of the first conductive lines CL1 and a corresponding one of the second conductive lines CL2. The air gaps AG may be interposed between the first insulating patterns 106.

Figure 24:
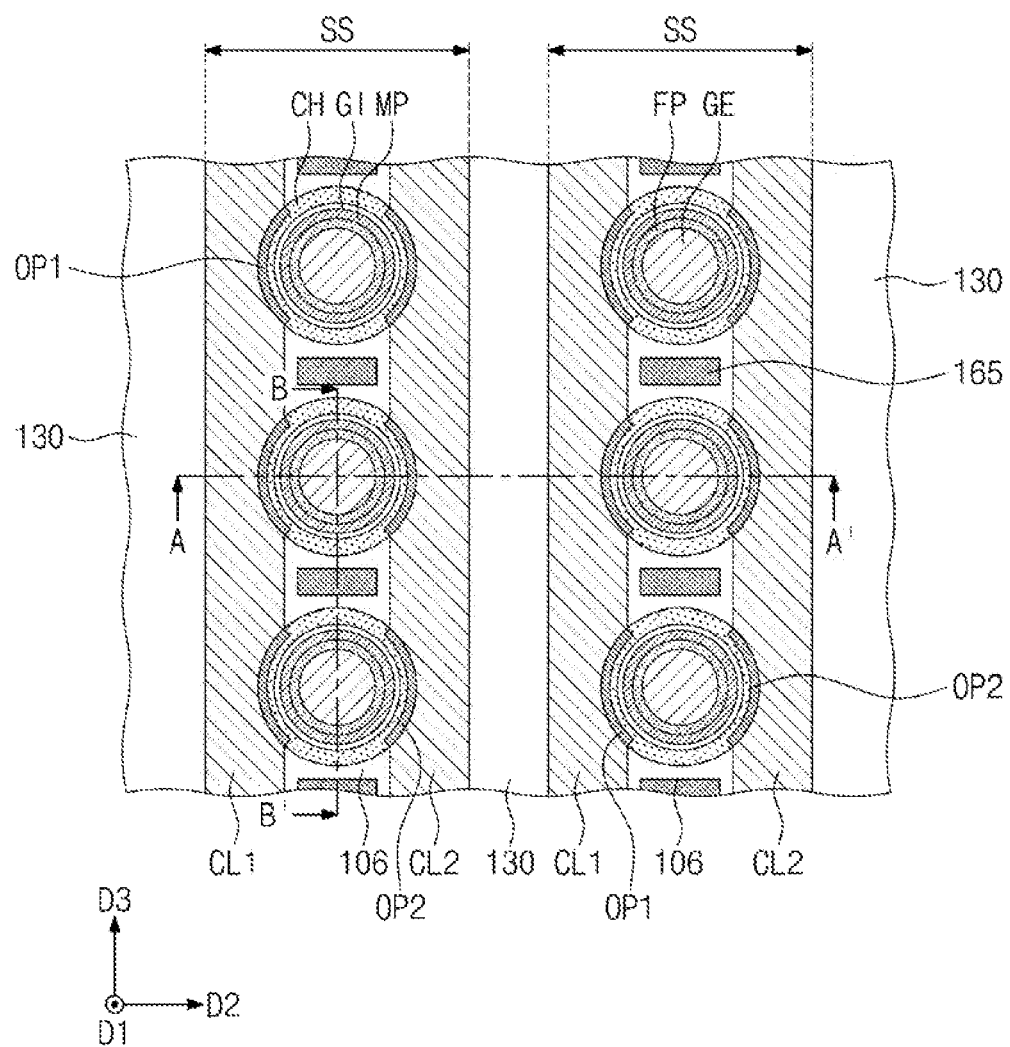
FIG. 24 is a plan view illustrating a semiconductor device according to an example embodiment.
Figure 25:
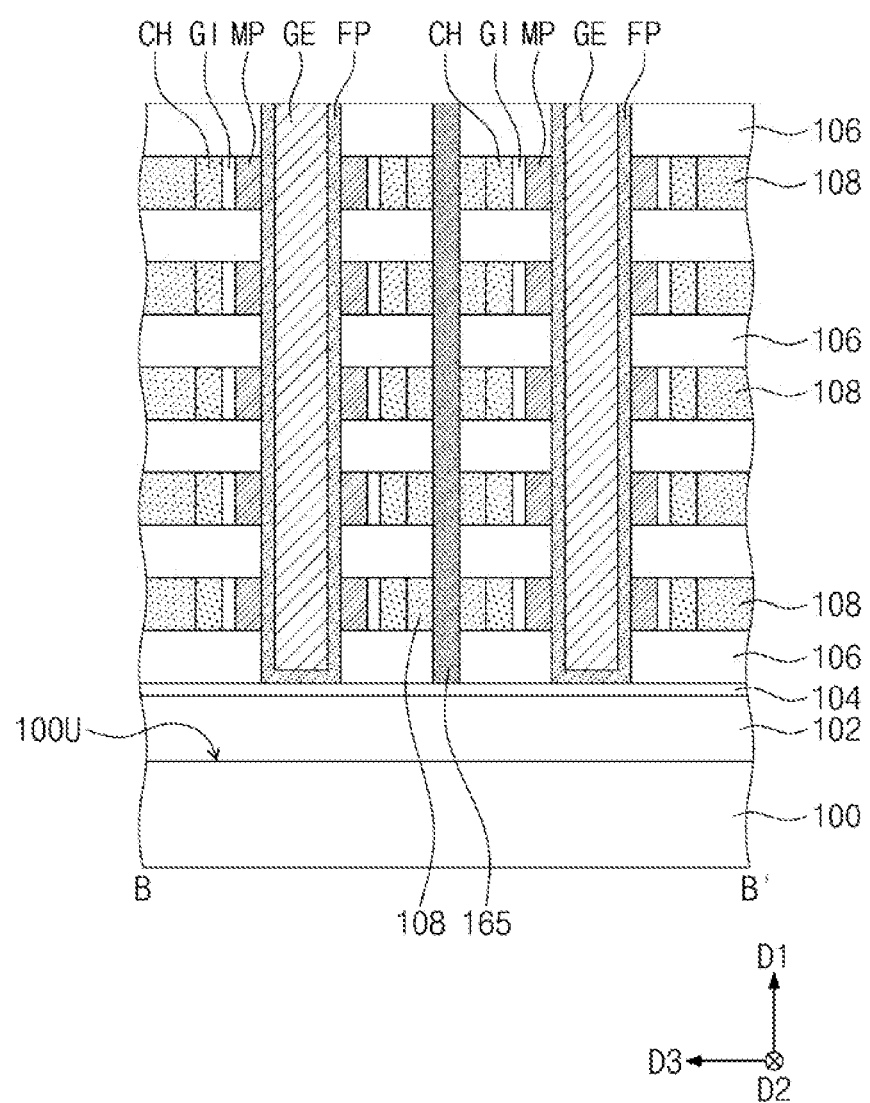
FIG. 25 is a sectional view taken along a line B-B' of FIG. 24.

FIG. 24 is a plan view illustrating a semiconductor device according to an example embodiment. FIG. 25 is a sectional view taken along a line B-B' of FIG. 24. A sectional view taken along a line A-A' of FIG. 24 may be substantially the same as FIG. 3. For the sake of brevity, features, which are different from the semiconductor device described with reference to FIGS. 1 to 3, will be mainly described below.

Referring to FIGS. 24 and 25, the stack SS may further include shielding lines 165, which are disposed between the first and second conductive lines CL1 and CL2 and are disposed between the gate electrodes GE. The shielding lines 165 may be used to prevent an electrical interference issue from occurring between the gate electrodes GE and between adjacent ones of the channel patterns CH.

The shielding lines 165 and the gate electrodes GE may be alternately arranged in the third direction D3. The shielding lines 165 may be extended in the first direction D1 and parallel to the gate electrodes GE. The shielding lines 165 may be disposed between adjacent ones of channel patterns CH, which are respectively provided to enclose side surfaces GE_S of the gate electrodes GE.

The stack SS may further include the second insulating patterns 108 between adjacent ones of the channel patterns CH described with reference to FIGS. 20 and 21. In this case, each of the shielding lines 165 may be extended in the first direction D1 to penetrate the first and second insulating patterns 106 and 108, which are interposed between the first insulating patterns 106.

The shielding lines 165 may be formed of or include at least one of metallic materials, and a ground voltage may be applied to the shielding lines 165.

Figure 26:
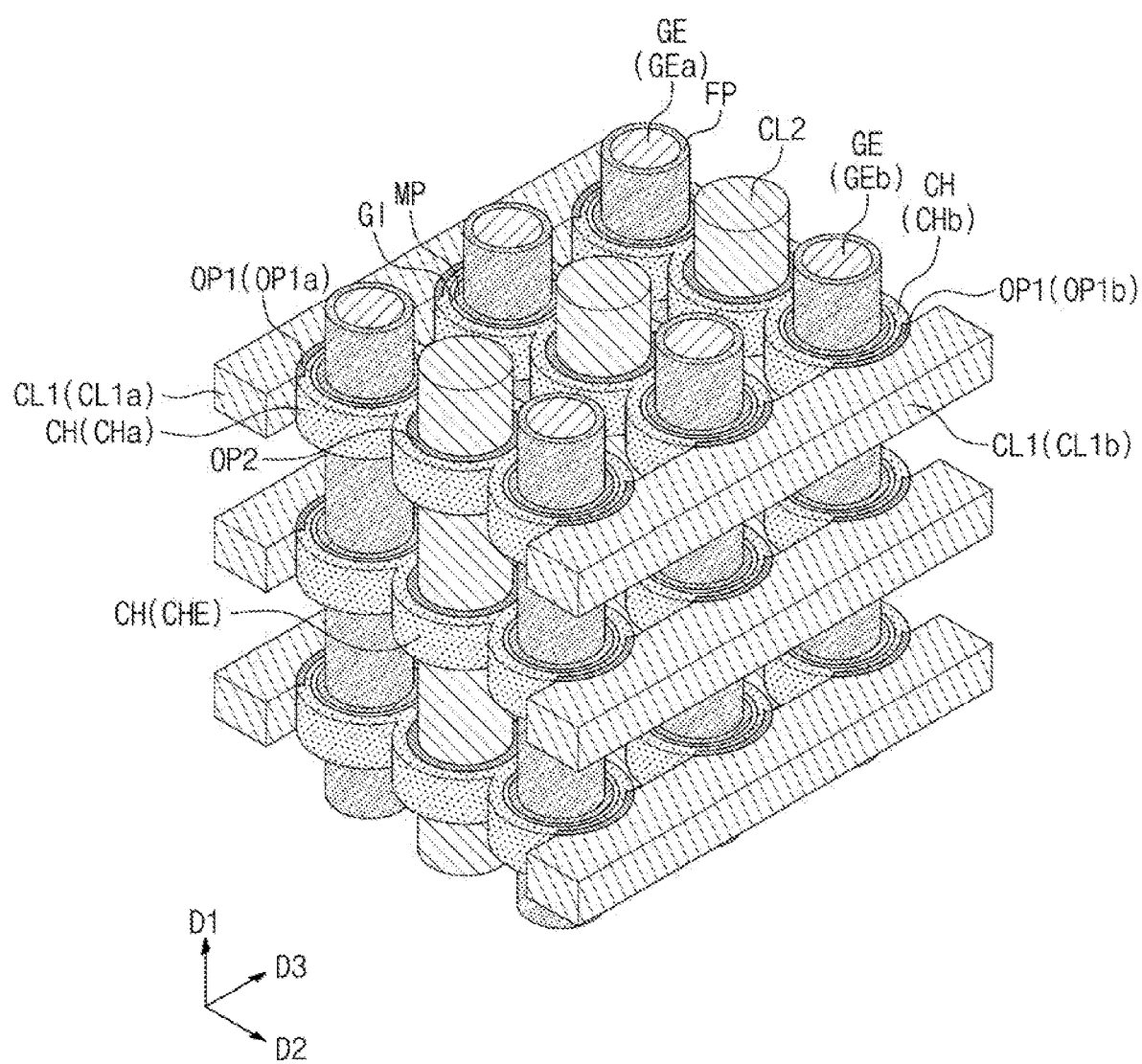
FIG. 26 is a perspective view schematically illustrating a semiconductor device according to an example embodiment.
Figure 27:
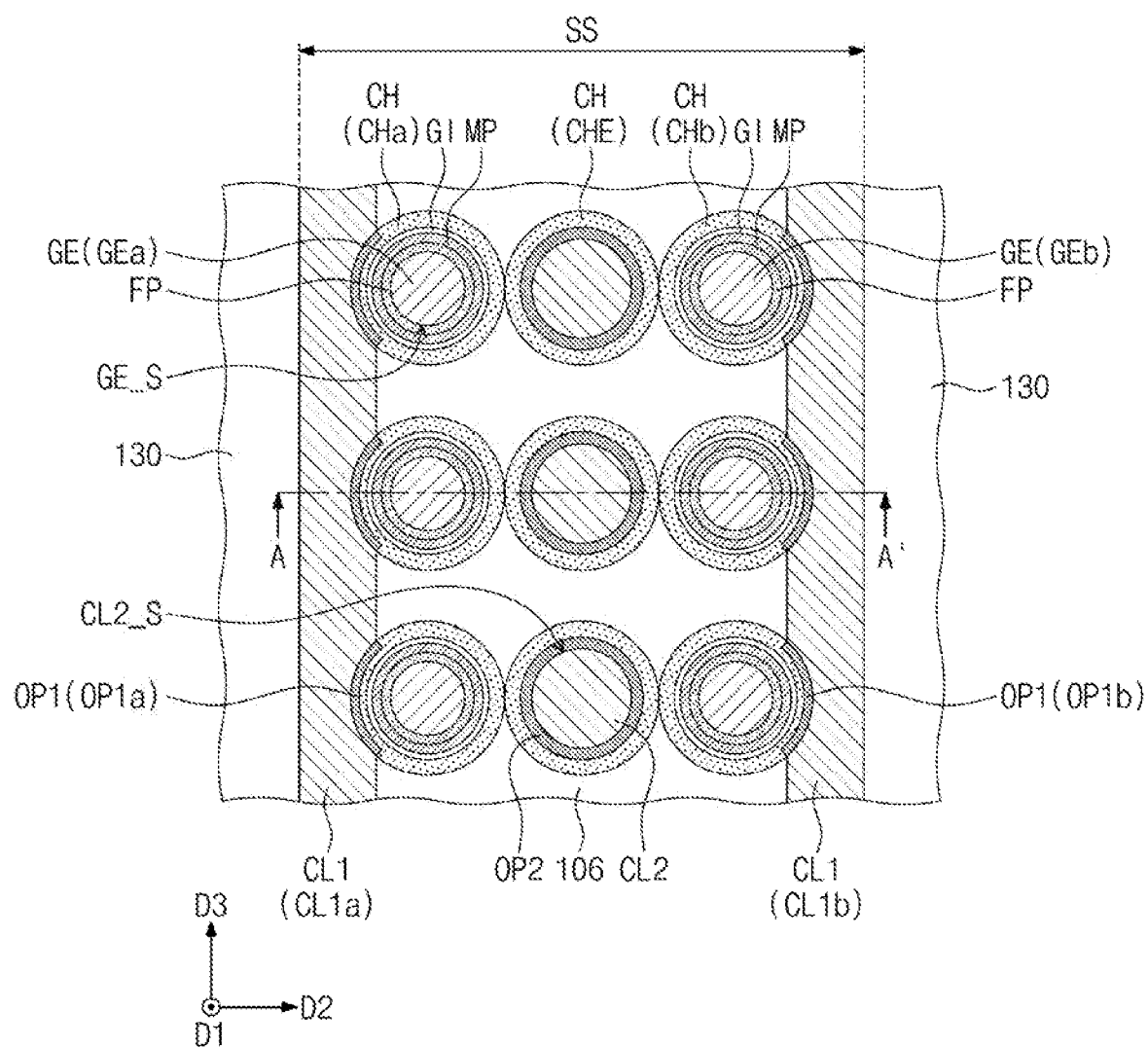
FIG. 27 is a plan view illustrating a semiconductor device according to an example embodiment.
Figure 28:
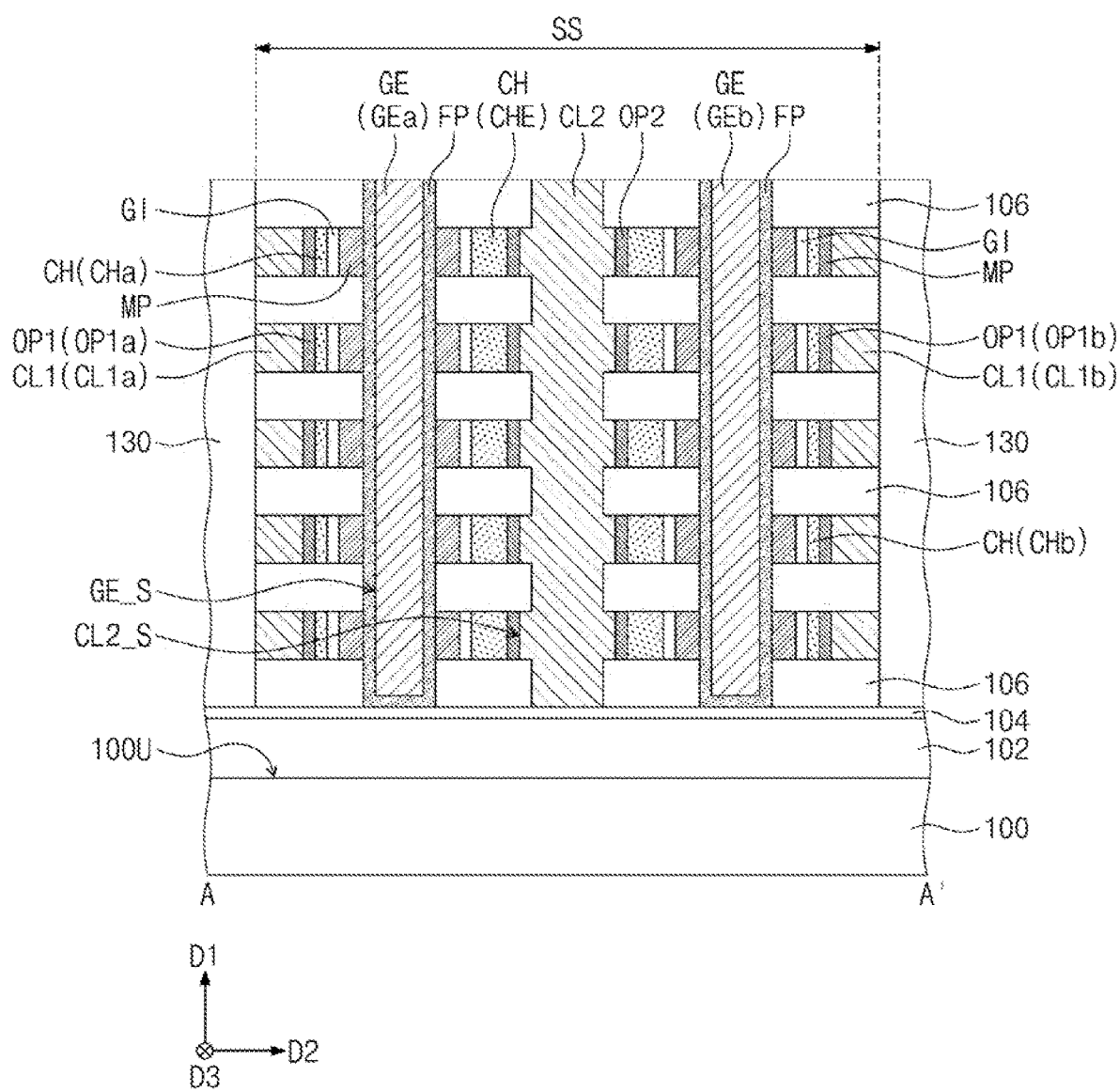
FIG. 28 is a sectional view taken along a line A-A' of FIG. 27.

FIG. 26 is a perspective view schematically illustrating a semiconductor device according to an example embodiment. FIG. 27 is a plan view illustrating a semiconductor device according to an example embodiment, and FIG. 28 is a sectional view taken along a line A-A' of FIG. 27. For the sake of brevity, features, which are different from the semiconductor device described with reference to FIGS. 1 to 3, will be mainly described below.

Referring to FIGS. 26 to 28, the stack SS may include first conductive lines CL1a, which constitute a first column and are spaced apart from each other in the first direction D1. The stack SS may include first conductive lines CL1b, which constitute a second column, are spaced apart from the first conductive lines CL1a of the first column in the second direction D2, and are spaced apart from each other in the first direction D1. The stack SS may include second conductive lines CL2, which are disposed between the first conductive lines CL1a of the first column and the first conductive lines CL2b of the second column, and are spaced apart from each other in the third direction D3. The stack SS may include gate electrodes GE, which are disposed between the first conductive lines CL1a and the second conductive lines CL2 of the first column, and between the first conductive lines CL1b and the second conductive lines CL2 of the second column.

The first conductive lines CL1a of the first column and the first conductive lines CL2b of the second column may be extended in the third direction D3. The second conductive lines CL2 may be extended in the first direction D1 and may be spaced apart from each other in the third direction D3. The gate electrodes GE may be extended in the first direction D1.

The gate electrodes GE may include gate electrodes GEa, which constitute a first column and are spaced apart from each other in the third direction D3 between the first conductive lines CL1a and the second conductive lines CL2 of the first column. The gate electrodes GE may include gate electrodes GEb, which constitute a second column and are spaced apart from each other in the third direction D3 between the first conductive lines CL1b and the second conductive lines CL2 of the second column.

The stack SS may further include a plurality of channel patterns CH, which are provided to enclose a side surface GE_S of each of the gate electrodes GE.

The channel patterns CH may include channel patterns CHa, which constitute a first column, enclose a side surface GE_S of each of the gate electrodes GEa of the first column, and are spaced apart from each other in the first direction D1.

The channel patterns CH may include channel patterns CHb, which constitute a second column, enclose a side surface GE_S of each of the gate electrodes GEb of the second column, and are spaced apart from each other in the first direction D1.

The channel patterns CH may further include channel extended portions CHE, which enclose a side surface CL2_S of each of the second conductive lines CL2 and are spaced apart from each other in the first direction D1.

The channel extended portions CHE may be disposed between the channel patterns CHa of the first column and the channel patterns CHb of the second column to connect the channel patterns CHa of the first column to the channel patterns CHb of the second column.

The stack SS may further include first impurity patterns OP1, which are interposed between the first conductive lines CL1a of the first column and the channel patterns CHa of the first column, and between the first conductive lines CL1b of the second column and the channel patterns CHb of the second column.

The first impurity patterns OP1 may include first impurity patterns OP1a, which constitute a first column, are respectively interposed between the first conductive lines CL1a of the first column and the channel patterns CHa of the first column, and are spaced apart from each other in the first direction D1.

The first impurity patterns OP1 may include first impurity patterns OP1b, which constitute a second column, are respectively interposed between the first conductive lines CL1b of the second column and the channel patterns CHb of the second column, and are spaced apart from each other in the first direction D1.

The channel patterns CHa of the first column may be electrically connected to the first conductive lines CL1a of the first column, respectively, through the first impurity patterns OP1a of the first column. The channel patterns CHb of the second column may be electrically connected to the first conductive lines CL1b of the second column, respectively, through the first impurity patterns OP1b of the second column.

The stack SS may further include second impurity patterns OP2, which are interposed between each of the second conductive lines CL2 and the channel extended portions CHE.

The second impurity patterns OP2 may be spaced apart from each other in the first direction D1 and may be respectively interposed between the channel extended portions CHE and a corresponding one of the second conductive lines CL2. The second impurity patterns OP2 may be provided to enclose the side surface CL2_S of the corresponding second conductive line CL2. The channel extended portions CHE may be spaced apart from the side surface CL2_S of the corresponding second conductive line CL2 with the second impurity patterns OP2 interposed therebetween. The channel patterns CHa of the first column and the channel patterns CHb of the second column may be electrically connected to the corresponding second conductive line CL2 through the channel extended portions CHE and the second impurity patterns OP2.

The stack SS may further include first insulating patterns 106, which are spaced apart from each other in the first direction D1.

The first insulating patterns 106 may be interposed between the channel patterns CHa of the first column, and the channel patterns CHa of the first column may be electrically separated or disconnected from each other by the first insulating patterns 106. The first insulating patterns 106 may be extended horizontally (e.g., in the second direction D2) and may be interposed between the channel extended portions CHE. The channel extended portions CHE may be electrically separated or disconnected from each other by the first insulating patterns 106. The first insulating patterns 106 may be extended horizontally (e.g., in the second direction D2) and may be interposed between the channel patterns CHb of the second column. The channel patterns CHb of the second column may be electrically separated or disconnected from each other by the first insulating patterns 106. The first insulating patterns 106 may be extended into regions between the first impurity patterns OP1a of the first column and between the first conductive lines CL1a of the first column and may enclose the side surface GE_S of each of the gate electrodes GEa of the first column. The first insulating patterns 106 may be extended into regions between the first impurity patterns OP1b of the second column and between the first conductive lines CL1b of the second column and may enclose the side surface GE_S of each of the gate electrodes GEb of the second column. The first insulating patterns 106 may be extended into regions between the second impurity patterns OP2. The first insulating patterns 106 may enclose the side surface CL2_S of the corresponding second conductive line CL2 and may be in contact with the side surface CL2_S of the corresponding second conductive line CL2.

Sidewall insulating patterns 130 may be disposed on the etch stop layer 104 and at both sides of the stack SS.

The sidewall insulating patterns 130 may be spaced apart from each other in the second direction D2 with the stack SS interposed therebetween. The sidewall insulating patterns 130 may be extended in the first direction D1 and the third direction D3. One of the sidewall insulating patterns 130 may be extended in the first direction D1 to cover side surfaces of the first conductive lines CL1a and the first insulating patterns 106 of the first column and may be extended along the side surfaces of the first conductive lines CL1a of the first column and in the third direction D3. Another of the sidewall insulating patterns 130 may be extended in the first direction D1 to cover side surfaces of the first conductive lines CL1b and the first insulating patterns 106 of the second column and may be extended along the side surfaces of the first conductive lines CL1b of the second column and in the third direction D3.

FIGS. 29, 31, 33, 35, 37, and 39 are plan views illustrating a method of fabricating a semiconductor device, according to an example embodiment, and FIGS. 30, 32, 34, 36, 38, and 40 are sectional views, which are respectively taken along lines A-A' of FIGS. 29, 31, 33, 35, 37, and 39. For the sake of brevity, features, which are different from the fabrication method described with reference to FIGS. 4 to 15, will be mainly described below.

Figure 29:
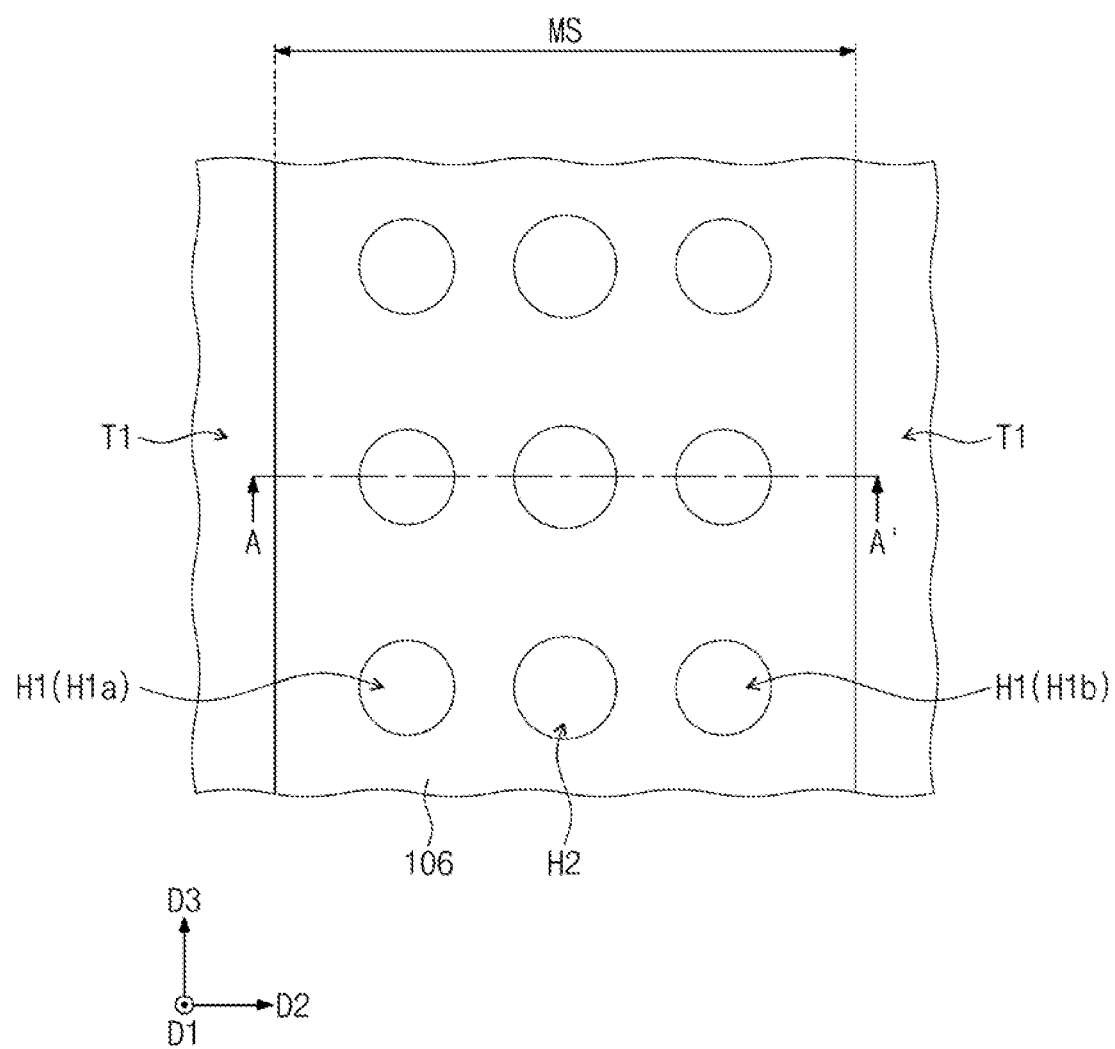
FIGS. 29, 31, 33, 35, 37, and 39 are plan views illustrating a method of fabricating a semiconductor device, according to an example embodiment.
Figure 30:
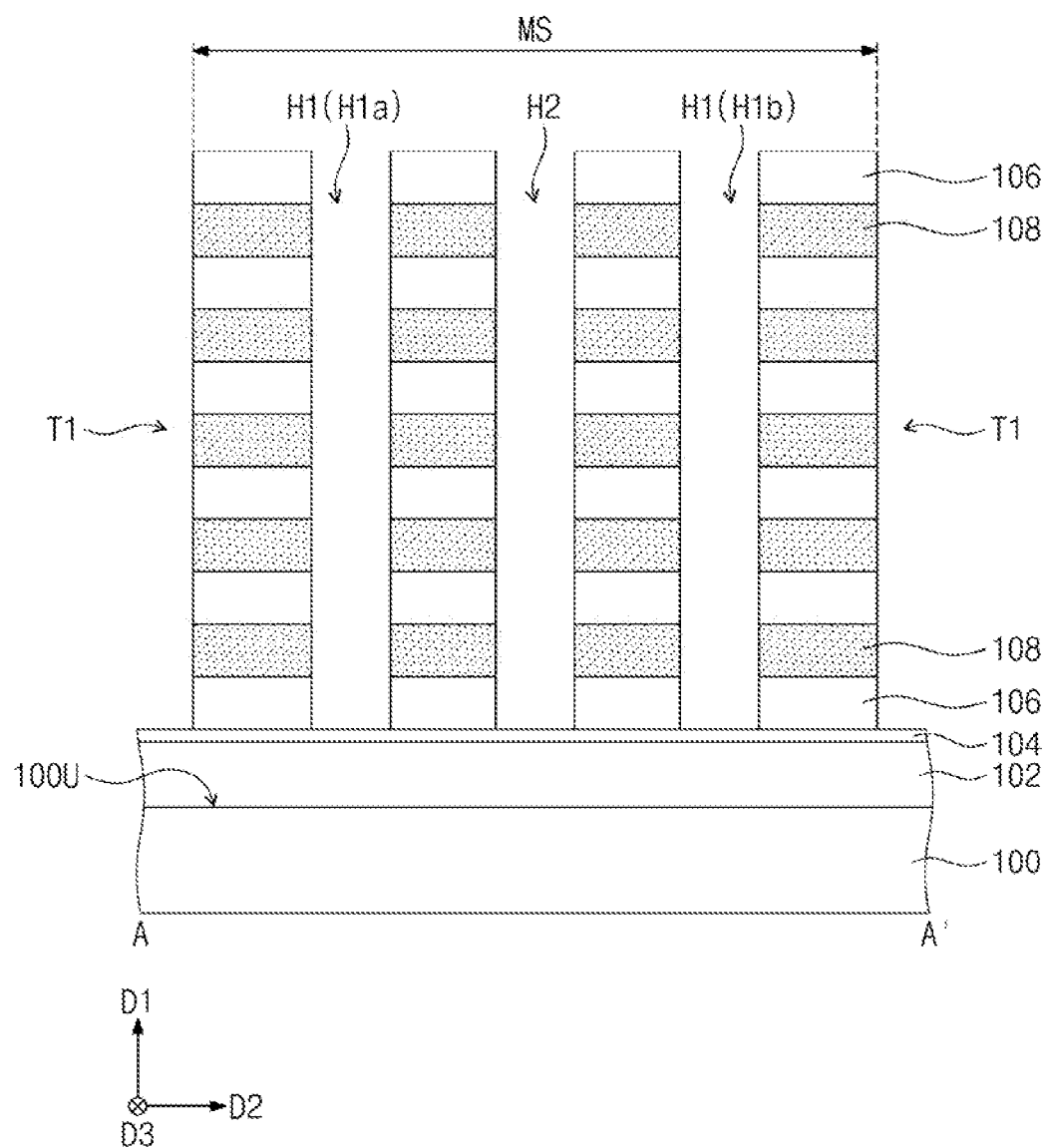
FIGS. 30, 32, 34, 36, 38, and 40 are sectional views, which are respectively taken along lines A-A' of FIGS. 29, 31, 33, 35, 37, and 39.

Referring to FIGS. 29 and 30, an interlayer insulating layer 102 and an etch stop layer 104 may be sequentially formed on a substrate 100.

First insulating layers 106 and second insulating layers 108 may be alternately stacked on the etch stop layer 104.

First trenches T1 may be formed in the first and second insulating layers 106 and 108. Each of the first trenches T1 may be formed to penetrate the first and second insulating layers 106 and 108 in the first direction D1 and to expose a top surface of the etch stop layer 104. The first trenches T1 may be spaced apart from each other in the second direction D2 and may be extended in the third direction D3.

A mold structure MS may be defined by the first trenches T1. The mold structure MS may include remaining portions of the first insulating layers 106 and remaining portions of the second insulating layers 108, which are interposed between the first trenches T1. The remaining portions of the first insulating layers 106 may be referred to as first insulating patterns 106, and the remaining portions of the second insulating layers 108 may be referred to as second insulating patterns 108. The first trenches T1 may be spaced apart from each other in the second direction D2 with the mold structure MS interposed therebetween and may be extended in the third direction D3.

First holes H1 may be formed in the mold structure MS. Each of the first holes H1 may be extended in the first direction D1 to penetrate the mold structure MS and to expose the top surface of the etch stop layer 104.

The first holes H1 may include first holes H1a, which constitute a first column and are spaced apart from each other in the third direction D3, and first holes H1b, which constitute a second column, are spaced apart from the first holes H1a of the first column in the second direction D2, and are spaced apart from each other in the third direction D3.

Second holes H2 may be formed in the mold structure MS. Each of the second holes H2 may be extended in the first direction D1 to penetrate the mold structure MS and to expose the top surface of the etch stop layer 104. The second holes H2 may be disposed between the first holes H1a of the first column and the first holes H1b of the second column and may be spaced apart from each other in the third direction D3.

Figure 31:
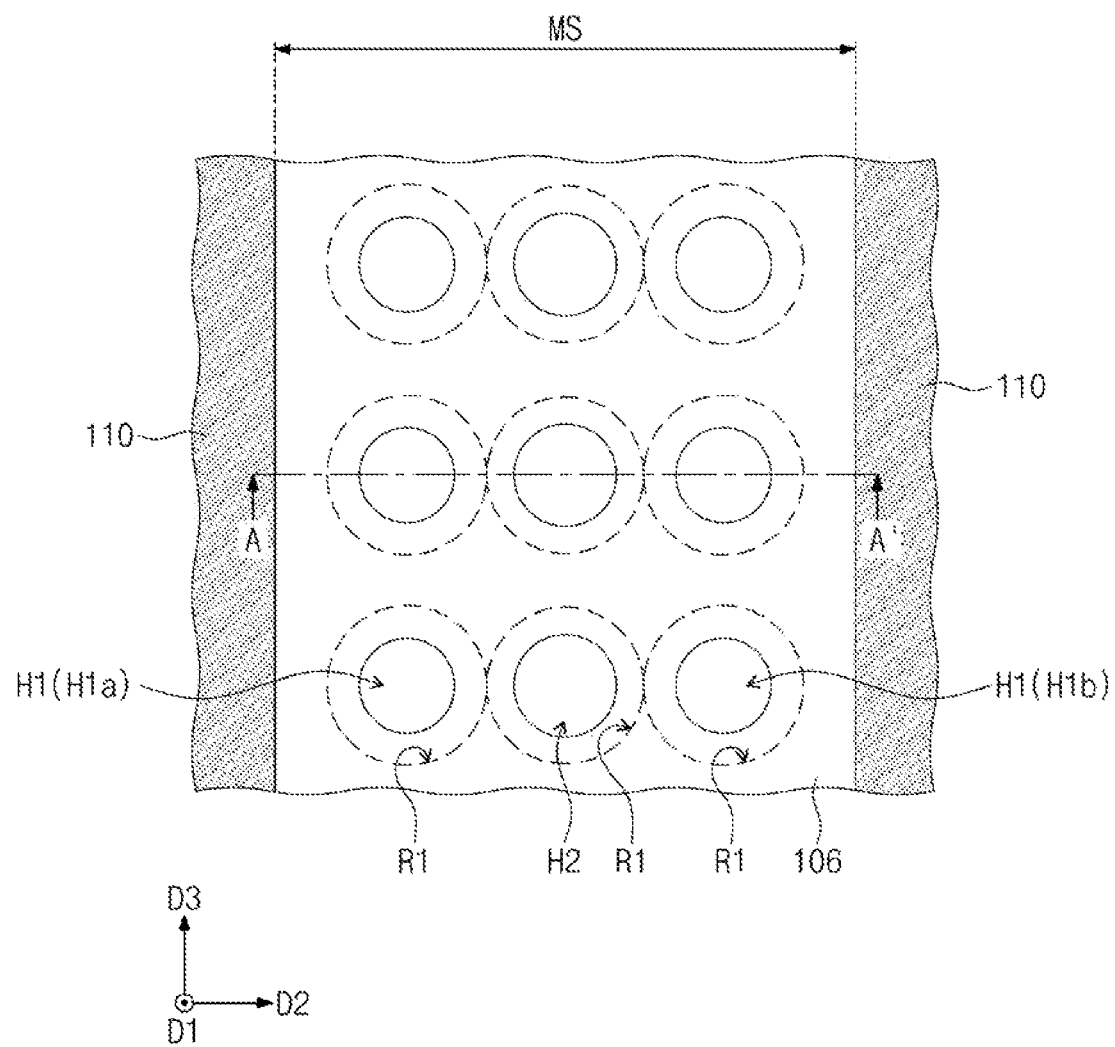
Figure 32:
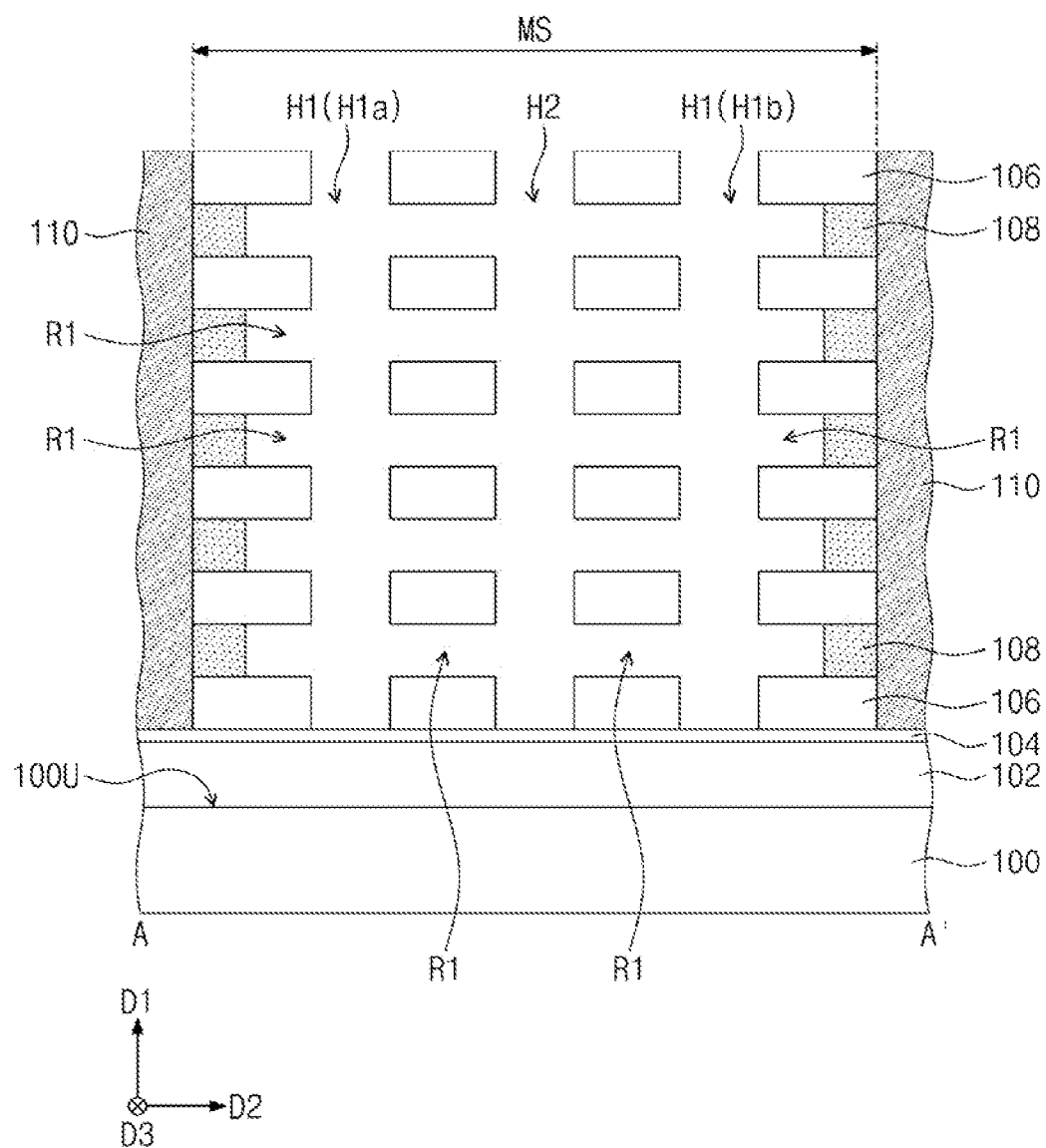

Referring to FIGS. 31 and 32, first sacrificial patterns 110 may be formed in the first trenches T1, respectively.

Each of the first and second holes H1 and H2 may expose side surfaces of the first and second insulating patterns 106 and 108 of the mold structure MS. The exposed side surfaces of the second insulating patterns 108 may be selectively recessed, and thus, first recess regions R1 may be formed in the mold structure MS. The first recess regions R1 may be spaced apart from each other in the first direction D1 and may be interposed between the first insulating patterns 106. Each of the first recess regions R1 may be formed to enclose each of the first and second holes H1 and H2, when viewed in a plan view. Each of the first recess regions R1 may be a single empty region, which is horizontally (e.g., in the second direction D2) extended from one of the first holes H1a of the first column, one of the second holes H2, and one of the first holes H1b of the second column.

Figure 33:
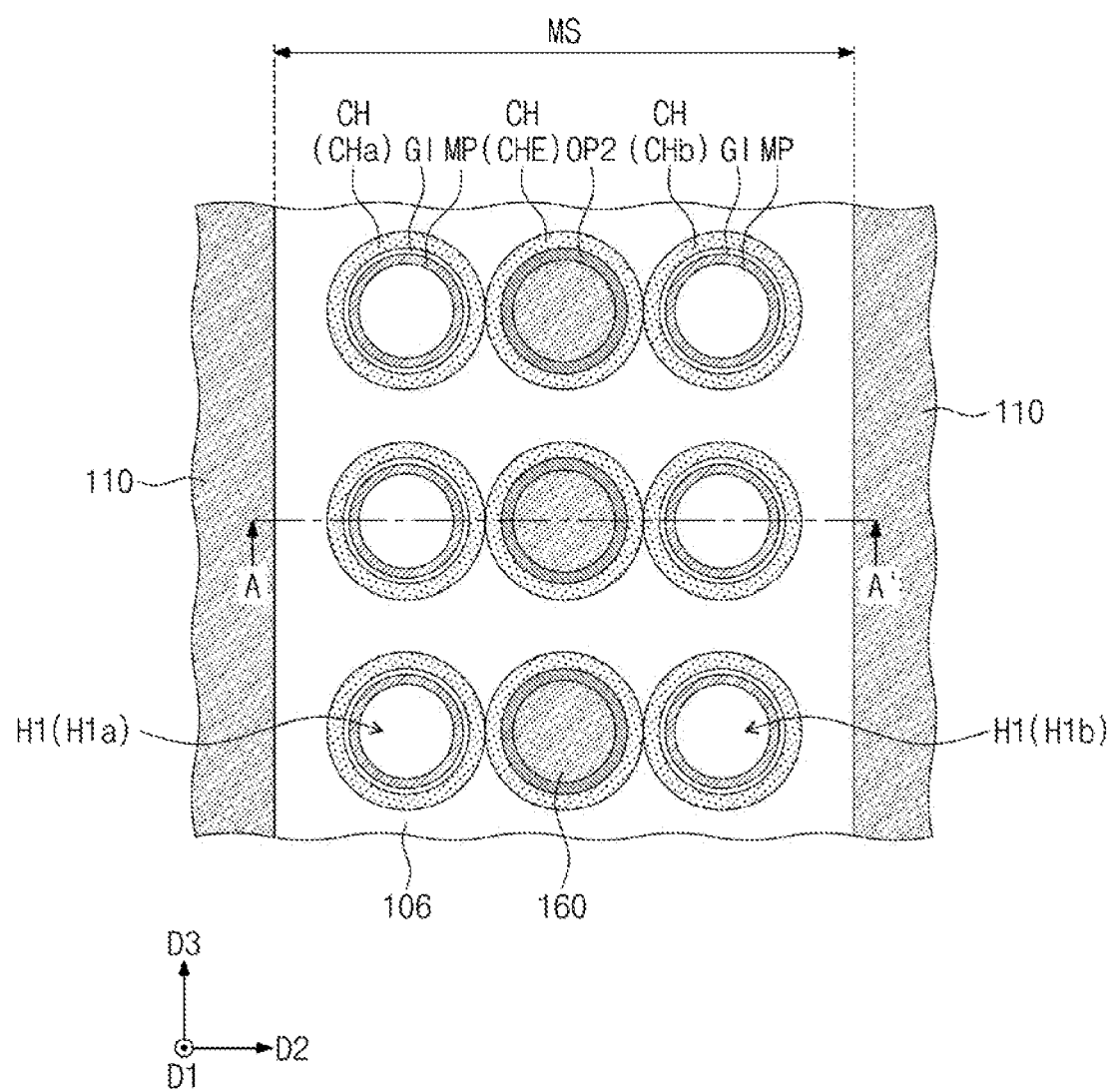
Figure 34:
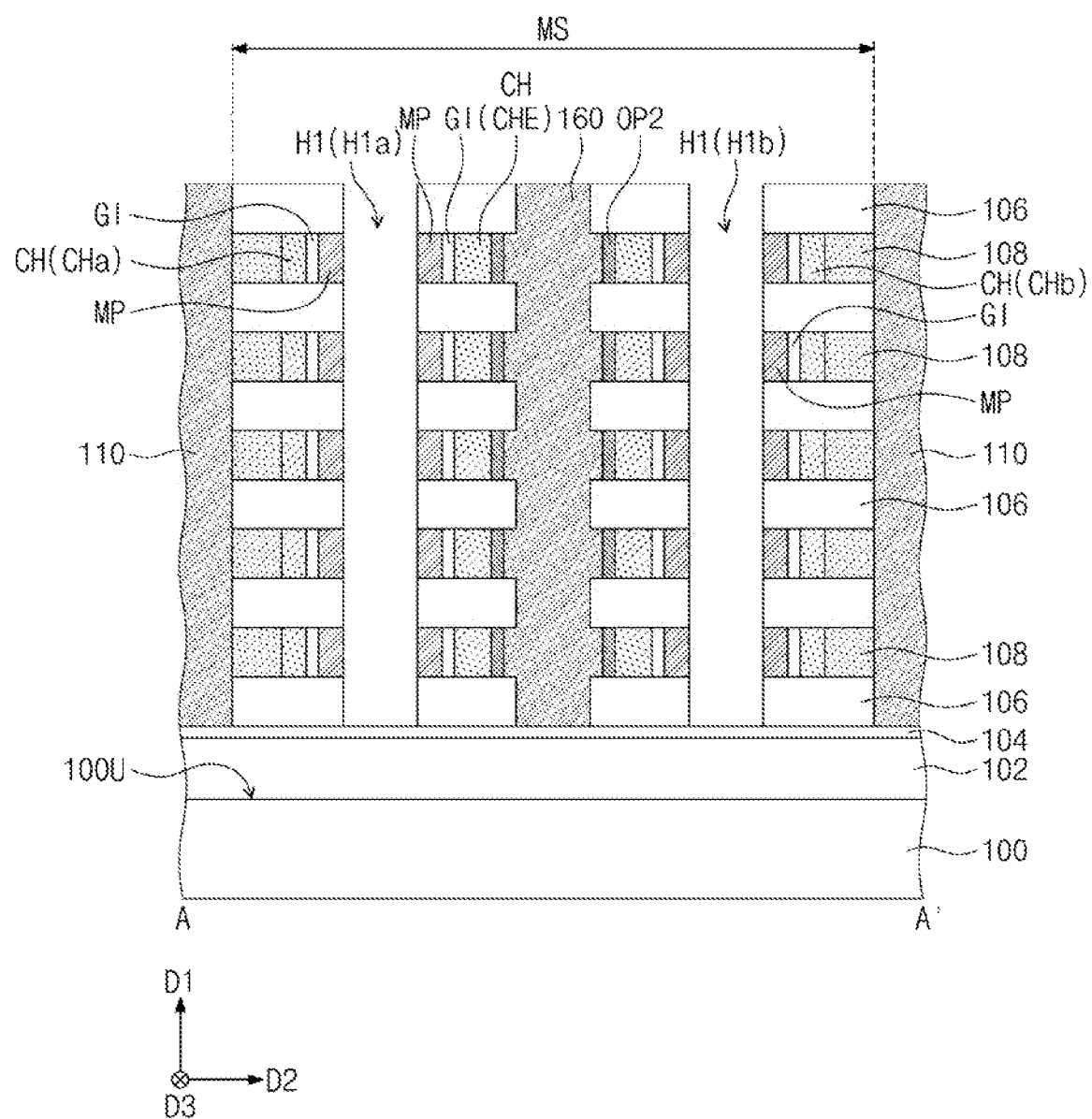

Referring to FIGS. 33 and 34, a plurality of channel patterns CH may be formed in the first recess regions R1, respectively. Each of the channel patterns CH may be formed to fill a portion of each of the first recess regions R1.

The channel patterns CH may include the channel patterns CHa of the first column (which enclose a corresponding one of the first holes H1a of the first column and are spaced apart from each other in the first direction D1), the channel patterns CHb of the second column (which enclose a corresponding one of the first holes H1b of the second column and are spaced apart from each other in the first direction D1), and channel extended portions CHE (which enclose a corresponding one of the second holes H2 and are spaced apart from each other in the first direction D1). The channel extended portions CHE may be interposed between the channel patterns CHa of the first column and the channel patterns CHb of the second column, and may connect the channel patterns CHa of the first column to the channel patterns CHb of the second column.

Second sacrificial patterns (not shown) may be provided to fill the first holes H1, respectively.

Each of the second holes H2 may be formed to expose side surfaces of the channel extended portions CHE.

Second impurity patterns OP2 may be respectively formed on the exposed side surfaces of the channel extended portions CHE. In an example embodiment, the formation of the second impurity patterns OP2 may include doping the exposed side surfaces of the channel extended portions CHE with impurities.

After the formation of the second impurity patterns OP2, third sacrificial patterns 160 may be formed in the second holes H2, respectively. The third sacrificial patterns 160 may be formed to fill the second holes H2, respectively. The third sacrificial patterns 160 may be spaced apart from each other in the third direction D3, in the mold structure MS.

The third sacrificial patterns 160 may be formed of or include a material having an etch selectivity with respect to the second insulating patterns 108. As an example, each of the third sacrificial patterns 160 may include a silicon oxide layer, which is formed to conformally cover an inner surface of each of the second holes H2 and to fill an upper region of each of the second holes H2, and a silicon nitride layer, which is formed to fill a remaining region of each of the second holes H2.

The second sacrificial patterns may be removed from the first holes H1. Each of the first holes H1 may be formed to expose the recess regions R1.

A plurality of gate insulating patterns GI may be respectively formed in the first recess regions R1 to cover side surfaces of the channel patterns CH, respectively. Each of the gate insulating patterns GI may fill a portion of each of the first recess regions R1.

A plurality of metal patterns MP may be respectively formed in the first recess regions R1 to cover side surfaces of the gate insulating patterns GI, respectively. Each of the metal patterns MP may be provided to fill a remaining region of each of the first recess regions R1.

Figure 35:
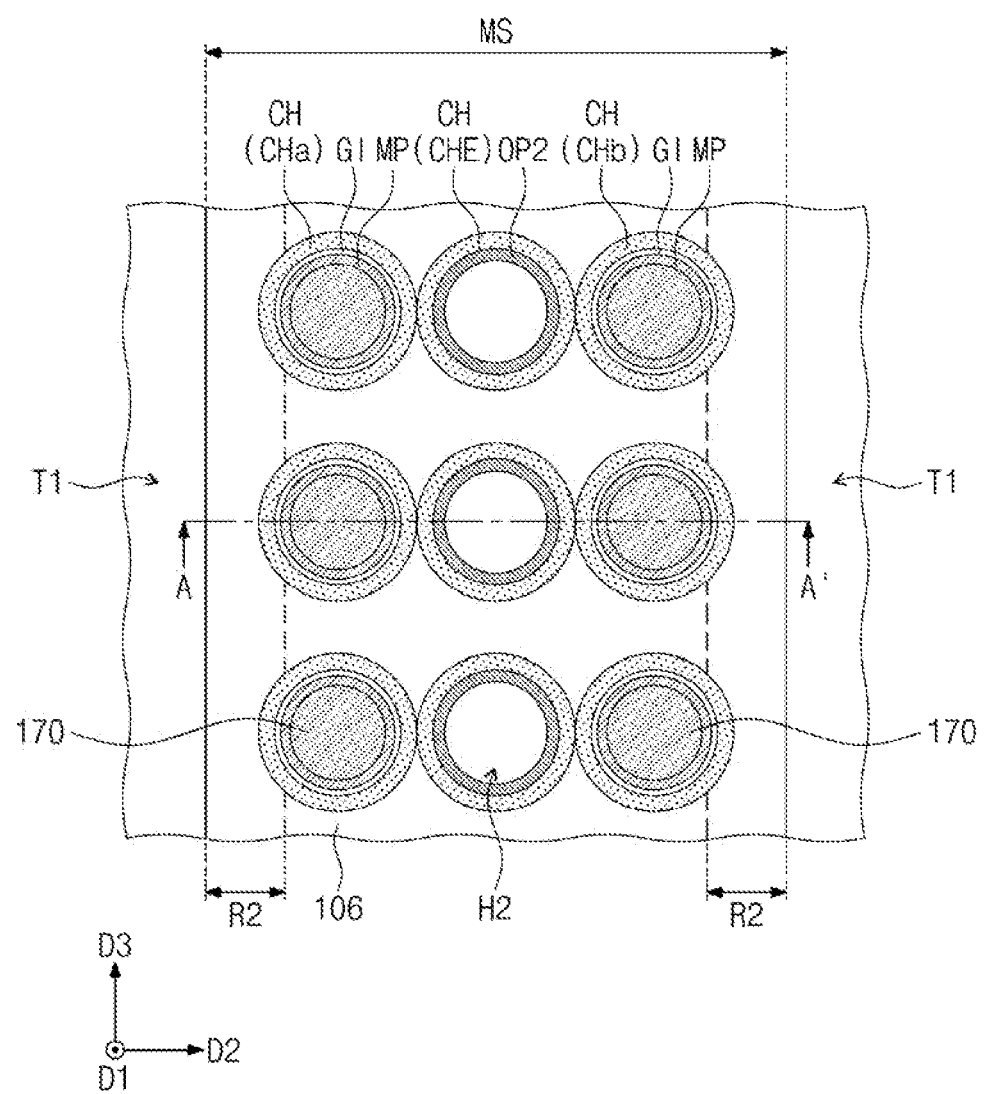
Figure 36:
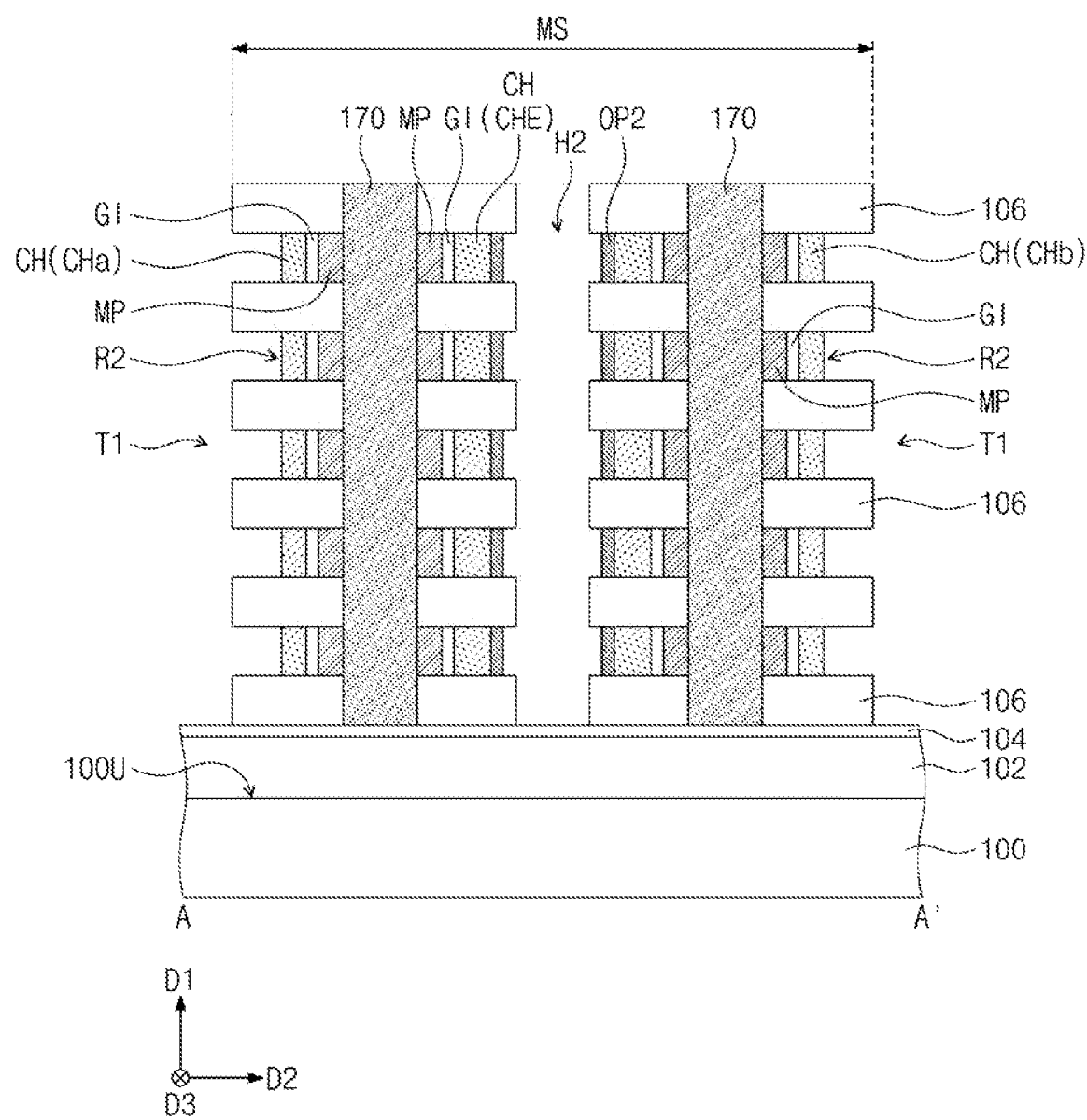

Referring to FIGS. 35 and 36, fourth sacrificial patterns 170 may be formed in the first holes H1, respectively. The fourth sacrificial patterns 170 may be formed to fill the first holes H1, respectively.

The fourth sacrificial patterns 170 may be formed of or include a material having an etch selectivity with respect to the second insulating patterns 108. As an example, each of the fourth sacrificial patterns 170 may include a silicon oxide layer, which is formed to conformally cover an inner surface of each of the first holes H1 and to fill an upper region of each of the first holes H1, and a silicon nitride layer, which is formed to fill a remaining region of each of the first holes H1.

The first sacrificial patterns 110 may be removed at the first trenches T1, and the third sacrificial patterns 160 may be removed at the second holes H2.

Each of the second holes H2 may be formed to expose side surfaces of the second impurity patterns OP2.

Each of the first trenches T1 may be formed to expose side surfaces of the first and second insulating patterns 106 and 108 of the mold structure MS. The exposed side surfaces of the second insulating patterns 108 may be selectively recessed, and thus, a second recess regions R2 may be formed in the mold structure MS. The second recess regions R2 may be formed to expose side surfaces of the channel patterns CH. The second recess regions R2 may be spaced apart from each other in the first direction D1 and may be interposed between the first insulating patterns 106. Each of the second recess regions R2 may have a line shape extending in the third direction D3.

Figure 37:
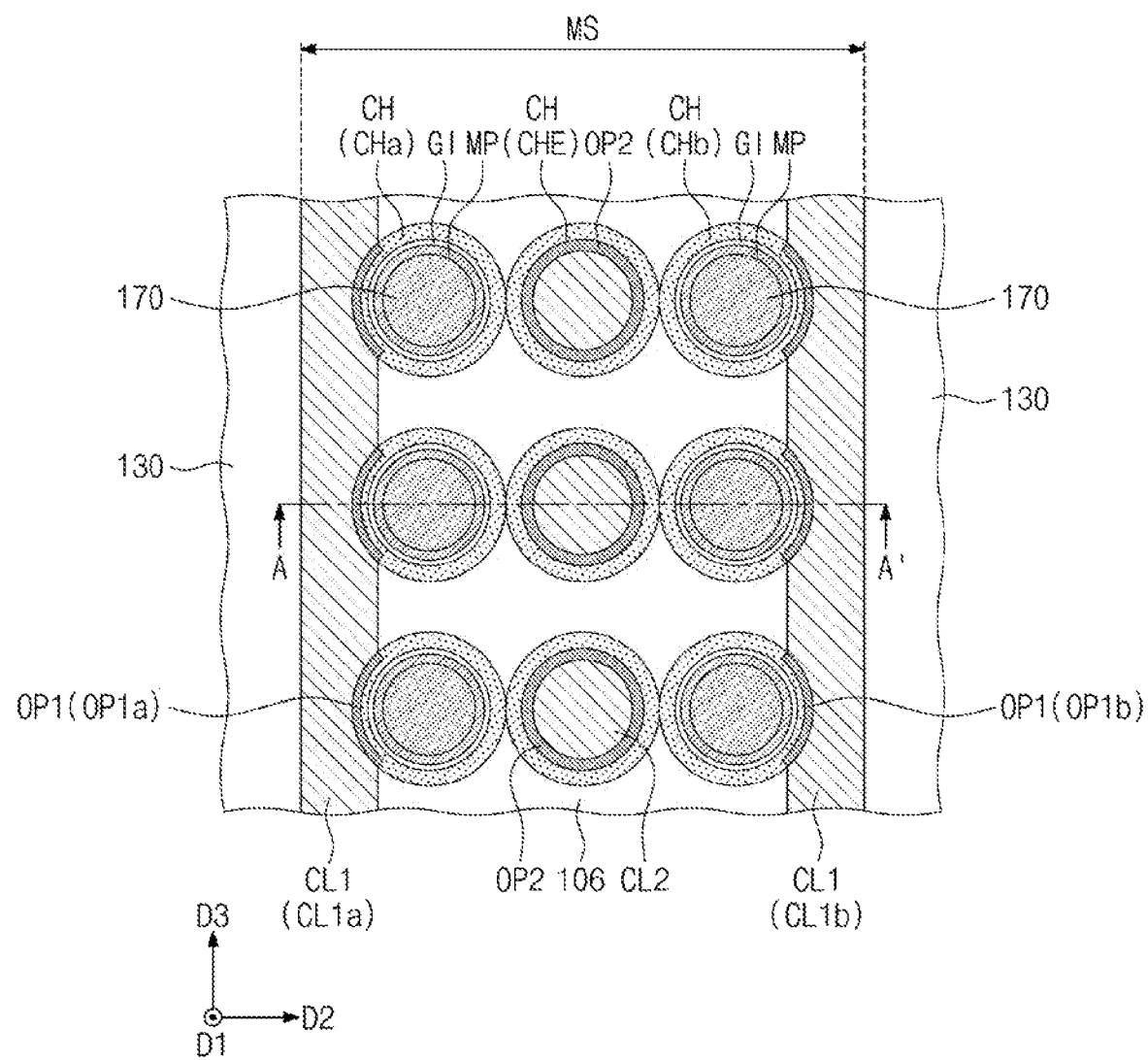
Figure 38:
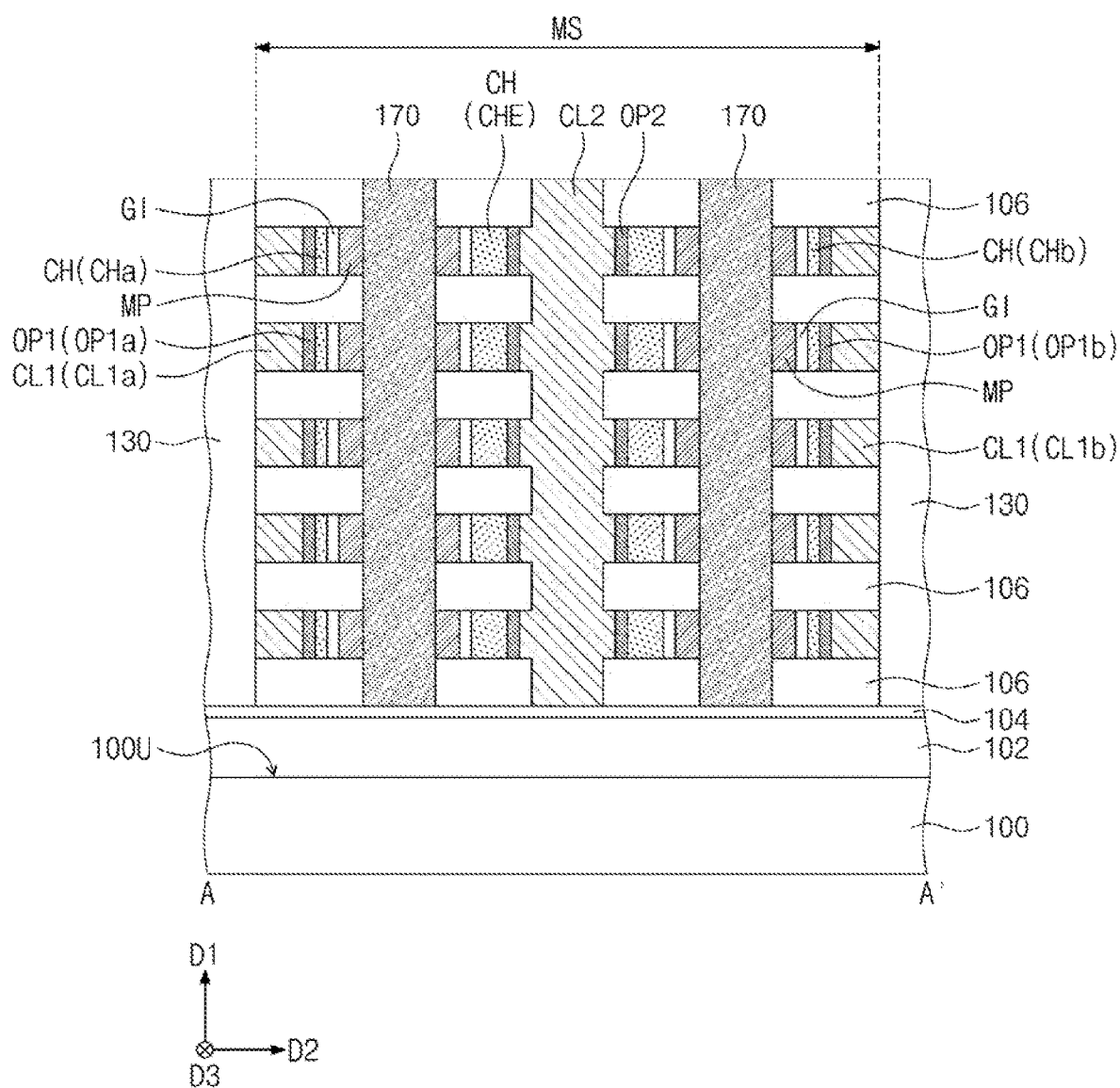

Referring to FIGS. 37 and 38, first impurity patterns OP1 may be formed in the second recess regions R2. In an example embodiment, the formation of the first impurity patterns OP1 may include doping side surfaces of the channel patterns CH, which are exposed through the second recess regions R2, with impurities.

First conductive lines CL1 may be formed to fill remaining portions of the second recess regions R2, and second conductive lines CL2 may be formed in the second holes H2, respectively. The formation of the first and second conductive lines CL1 and CL2 may include forming a conductive layer to fill the second recess regions R2, the second holes H2, and a portion of each of the first trenches T1, and removing the conductive layer from the first trenches T1.

Sidewall insulating patterns 130 may be formed in the first trenches T1, respectively. The sidewall insulating patterns 130 may be formed to fill the first trenches T1, respectively. The sidewall insulating patterns 130 may be spaced apart from each other in the second direction D2 with the mold structure MS interposed therebetween. One of the sidewall insulating patterns 130 may be extended in the first direction D1 to cover the side surfaces of the conductive lines CL1a of the first column among the first conductive lines CL1, and another of the sidewall insulating patterns 130 may be extended in the first direction D1 to cover the side surfaces of the conductive lines CL1b of the second column among the first conductive lines CL1. Each of the sidewall insulating patterns 130 may have a line shape extending in the third direction D3.

Figure 39:
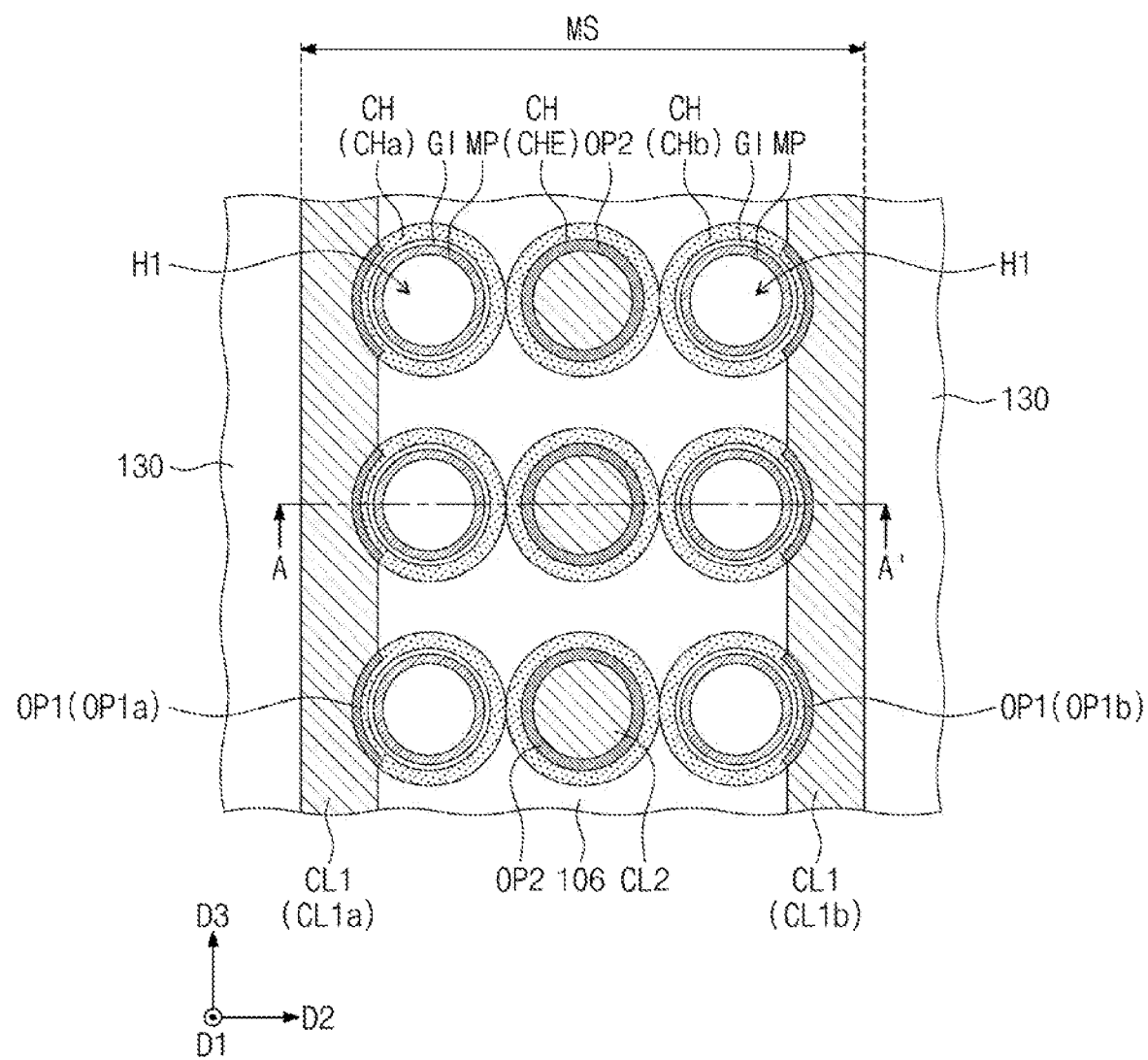
Figure 40:
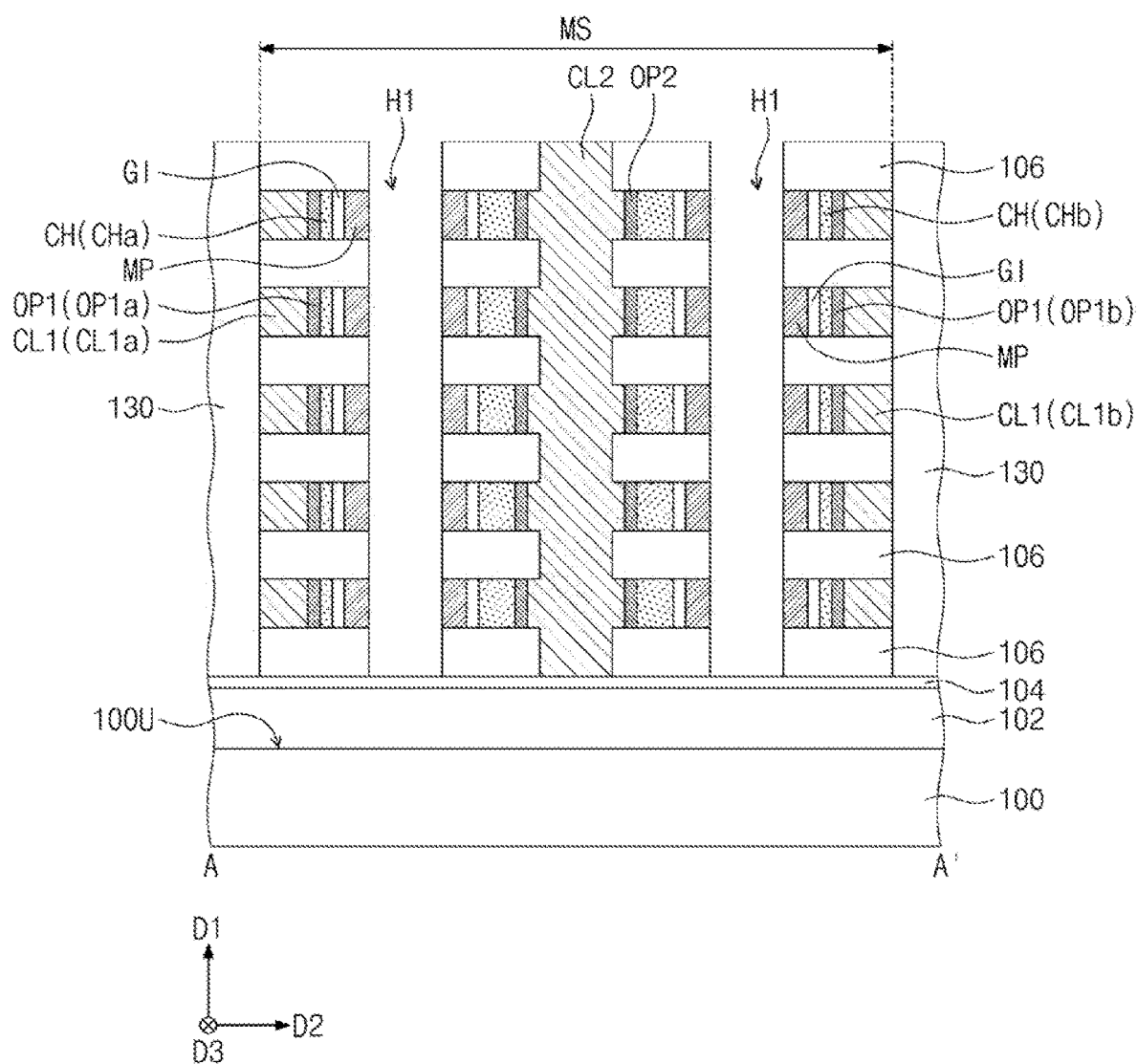

Referring to FIGS. 39 and 40, the fourth sacrificial patterns 170 may be removed from the first holes H1. Each of the first holes H1 may be formed to expose side surfaces of the metal patterns MP and side surfaces of the first insulating patterns 106.

Referring back to FIGS. 27 and 28, a ferroelectric pattern FP may be formed in each of the first holes H1. The ferroelectric pattern FP may be formed to fill a portion of each of the first holes H1, and to conformally cover an inner surface of each of the first holes H1. The ferroelectric pattern FP may be formed to cover the side surfaces of the metal patterns MP, the side surfaces of the first insulating patterns 106, and the top surface of the etch stop layer 104.

A gate electrode GE may be formed in each of the first holes H1. The gate electrode GE may be formed to fill a remaining region of each of the first holes H1.

Figure 41:
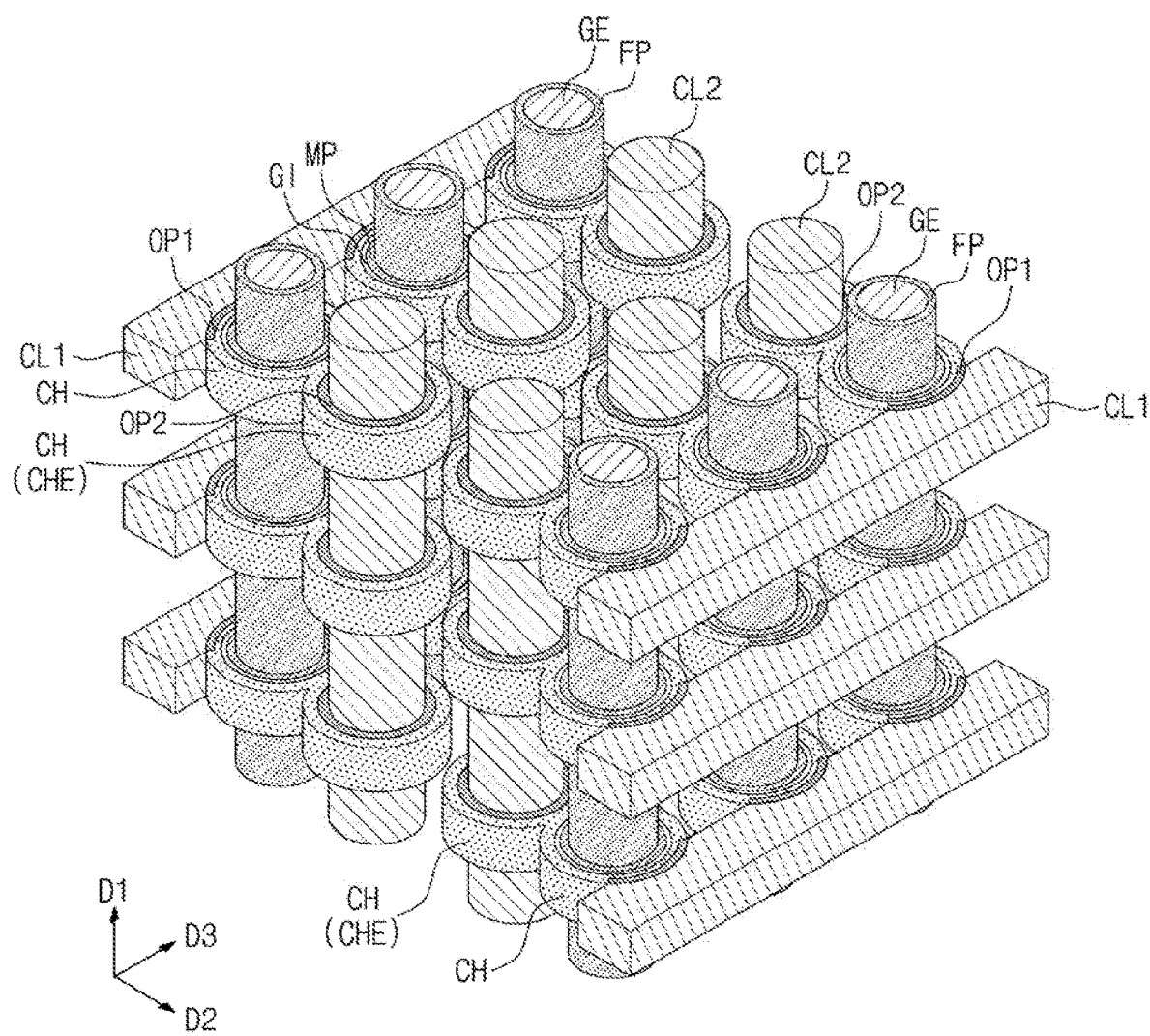
FIG. 41 is a perspective view schematically illustrating a semiconductor device according to an example embodiment.
Figure 42:
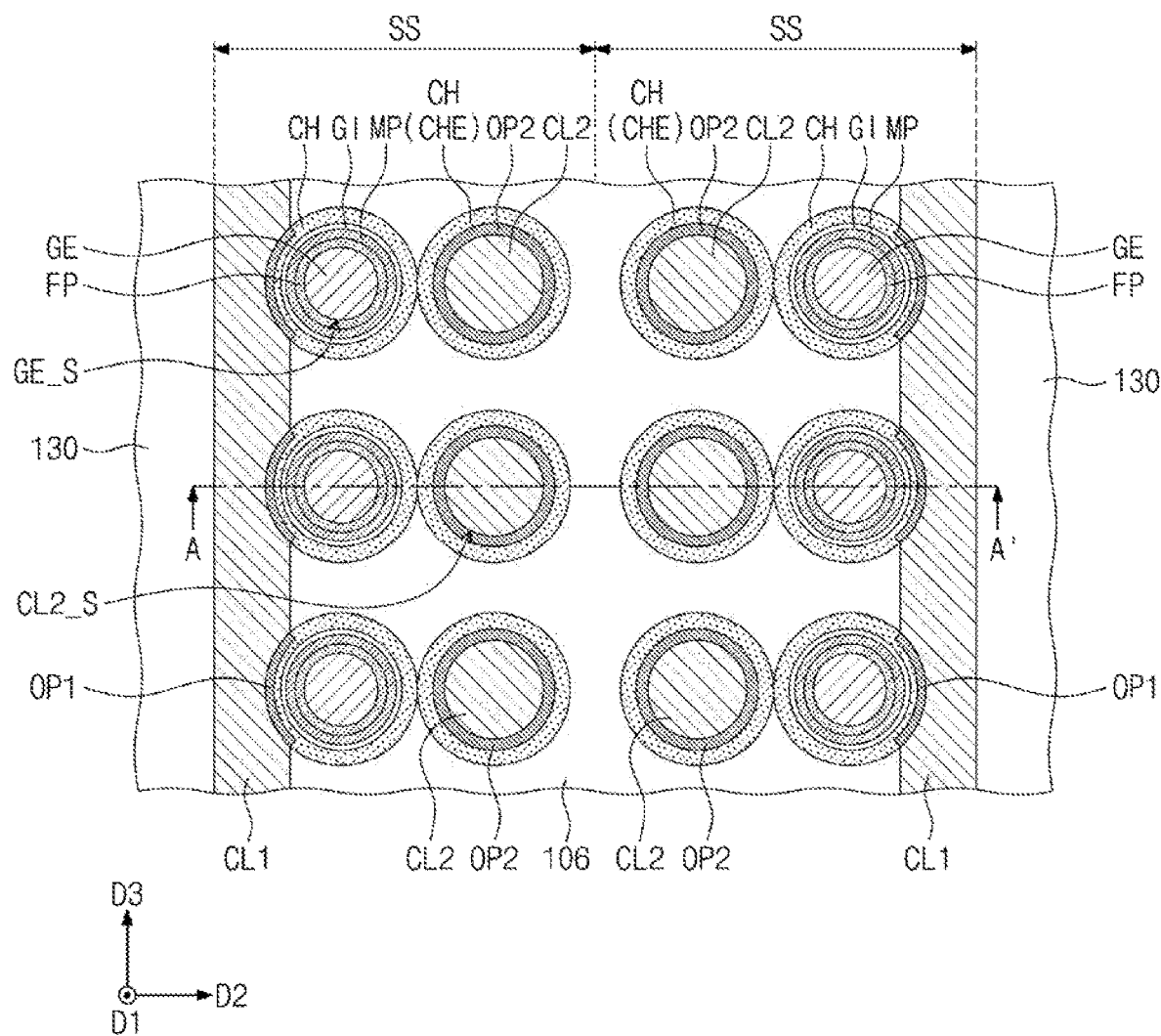
FIG. 42 is a plan view illustrating a semiconductor device according to an example embodiment.
Figure 43:
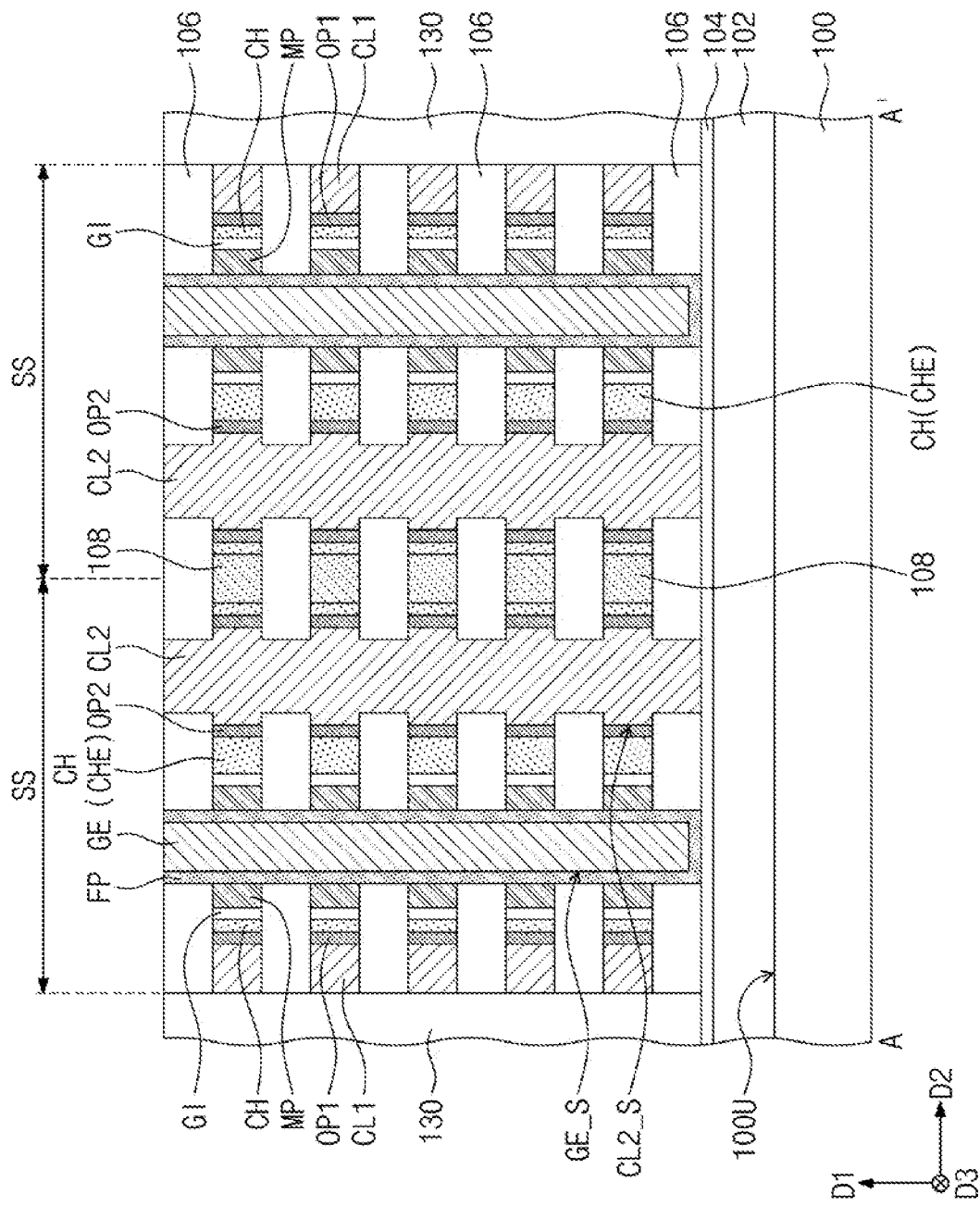
FIG. 43 is a sectional view taken along a line A-A' of FIG. 42.

FIG. 41 is a perspective view schematically illustrating a semiconductor device according to an example embodiment. FIG. 42 is a plan view illustrating a semiconductor device according to an example embodiment, and FIG. 43 is a sectional view taken along a line A-A' of FIG. 42. For the sake of brevity, features, which are different from the semiconductor device described with reference to FIGS. 1 to 3, will be mainly described below.

Referring to FIGS. 41 to 43, the stack SS may include first conductive lines CL1 (which are spaced apart from each other in the first direction D1), second conductive lines CL2 (which are spaced apart from the first conductive lines CL1 in the second direction D2), and gate electrodes GE (which are disposed between the first and second conductive lines CL1 and CL2).

The first conductive lines CL1 may be extended in the third direction D3. The second conductive lines CL2 may be extended in the first direction D1, and may be spaced apart from each other in the third direction D3. The gate electrodes GE may be spaced apart from each other in the third direction D3, between the first and second conductive lines CL1 and CL2, and may be extended in the first direction D1.

The stack SS may further include a plurality of channel patterns CH, which are provided to enclose a side surface GE_S of each of the gate electrodes GE.

The channel patterns CH may be provided to enclose a side surface GE_S of a corresponding one of the gate electrodes GE and may be spaced apart from each other in the first direction D1. The channel patterns CH may be extended horizontally (e.g., in the second direction D2) and may be provided to enclose a side surface CL2_S of a corresponding one of the second conductive lines CL2.

The channel patterns CH may include channel extended portions CHE, which are provided to enclose the side surface CL2_S of the corresponding second conductive line CL2 and are spaced apart from each other in the first direction D1.

The stack SS may further include first impurity patterns OP1 (which are provided between the first conductive lines CL1 and the channel patterns CH) and second impurity patterns OP2 (which are provided between the second conductive line CL2 and the channel patterns CH (i.e., the channel extended portions CHE)).

The first impurity patterns OP1 may be spaced apart from each other in the first direction D1, and may be respectively interposed between the channel patterns CH and the first conductive lines CL1. The second impurity patterns OP2 may be spaced apart from each other in the first direction D1, and may be respectively interposed between the channel patterns CH (i.e., the channel extended portions CHE) and a corresponding one of the second conductive lines CL2. The second impurity patterns OP2 may be provided to enclose the side surface CL2_S of the corresponding second conductive line CL2. The channel patterns CH (i.e., the channel extended portions CHE) may be spaced apart from the side surface CL2_S of the corresponding second conductive line CL2 with the second impurity patterns OP2 interposed therebetween. The channel patterns CH may be electrically and respectively connected to the first conductive lines CL1 through the first impurity patterns OP1, and may be electrically connected to the corresponding second conductive line CL2 through the channel extended portions CHE and the second impurity patterns OP2.

Each of the first conductive lines CL1 may be extended in the third direction D3 and may be connected to adjacent ones of the channel patterns CH, which are spaced apart from each other in the third direction D3. Adjacent ones of the first impurity patterns OP1, which are adjacent to each other in the third direction D3, may be disposed between each of the first conductive lines CL1 and the adjacent ones of the channel patterns CH. Each of the first conductive lines CL1 may be electrically connected to the adjacent ones of the channel patterns CH through the adjacent ones of the first impurity patterns OP1.

The second conductive lines CL2 may be spaced apart from each other in the third direction D3, and may be respectively connected to the adjacent ones of the channel patterns CH, which are spaced apart from each other in the third direction D3. The adjacent ones of the channel patterns CH may be extended in the second direction D2, and may enclose the side surfaces CL2_S of the second conductive lines CL2, respectively. The adjacent ones of the channel patterns CH may include channel extended portions CHE, which are provided to enclose the side surfaces CL2_S of the second conductive lines CL2, respectively, and are adjacent to each other. Adjacent ones of the second impurity patterns OP2, which are spaced apart from each other in the third direction D3, may be respectively interposed between the second conductive lines CL2 and the adjacent ones of the channel extended portions CHE. The adjacent ones of the second impurity patterns OP2 may enclose the side surfaces CL2_S of the second conductive lines CL2, respectively, and the adjacent ones of the channel extended portions CHE may be spaced apart from the side surfaces CL2_S of the second conductive lines CL2 with the adjacent ones of the second impurity patterns OP2 interposed therebetween. The adjacent ones of the channel patterns CH may be electrically and respectively connected to the second conductive lines CL2 through the adjacent ones of the channel extended portions CHE and the adjacent ones of the second impurity patterns OP2.

The stack SS may further include first insulating patterns 106, which are spaced apart from each other in the first direction D1 and are interposed between the channel patterns CH.

The first insulating patterns 106 and the channel patterns CH may be alternately stacked in the first direction D1. The channel patterns CH may be electrically separated or disconnected from each other by the first insulating patterns 106. Each of the first insulating patterns 106 may enclose the side surface GE_S of the corresponding gate electrode GE. The first insulating patterns 106 may be extended into regions between the first impurity patterns OP1 and between the first conductive lines CL1 and may be extended into regions between the second impurity patterns OP2. The first insulating patterns 106 may enclose the side surface CL2_S of the corresponding second conductive line CL2, and may be in contact with the side surface CL2_S of the corresponding second conductive line CL2.

A pair of stacks SS may be disposed to be adjacent to each other in the second direction D2.

The second conductive lines CL2 of one of the pair of stacks SS may face the second conductive lines CL2 of another of the pair of stacks SS. The pair of stacks SS may be disposed to have symmetry to each other. The first insulating patterns 106 of one of the pair of stacks SS may be extended horizontally (e.g., in the second direction D2), and may be connected to the first insulating patterns 106 of another of the pair of stacks SS. Second insulating patterns 108 may be interposed between the channel extended portions CHE of one of the pair of stacks SS and the channel extended portions CHE of another of the pair of stacks SS.

Sidewall insulating patterns 130 may be spaced apart from each other in the second direction D2, with the pair of stacks SS interposed therebetween.

One of the sidewall insulating patterns 130 may be extended in the first direction D1 to cover side surfaces of the first conductive lines CL1 and the first insulating patterns 106 of one of the pair of stacks SS. Another of the sidewall insulating patterns 130 may be extended in the first direction D1 to cover side surfaces of the first conductive lines CL1 and the first insulating patterns 106 of another of the pair of stacks SS.

Figure 44:
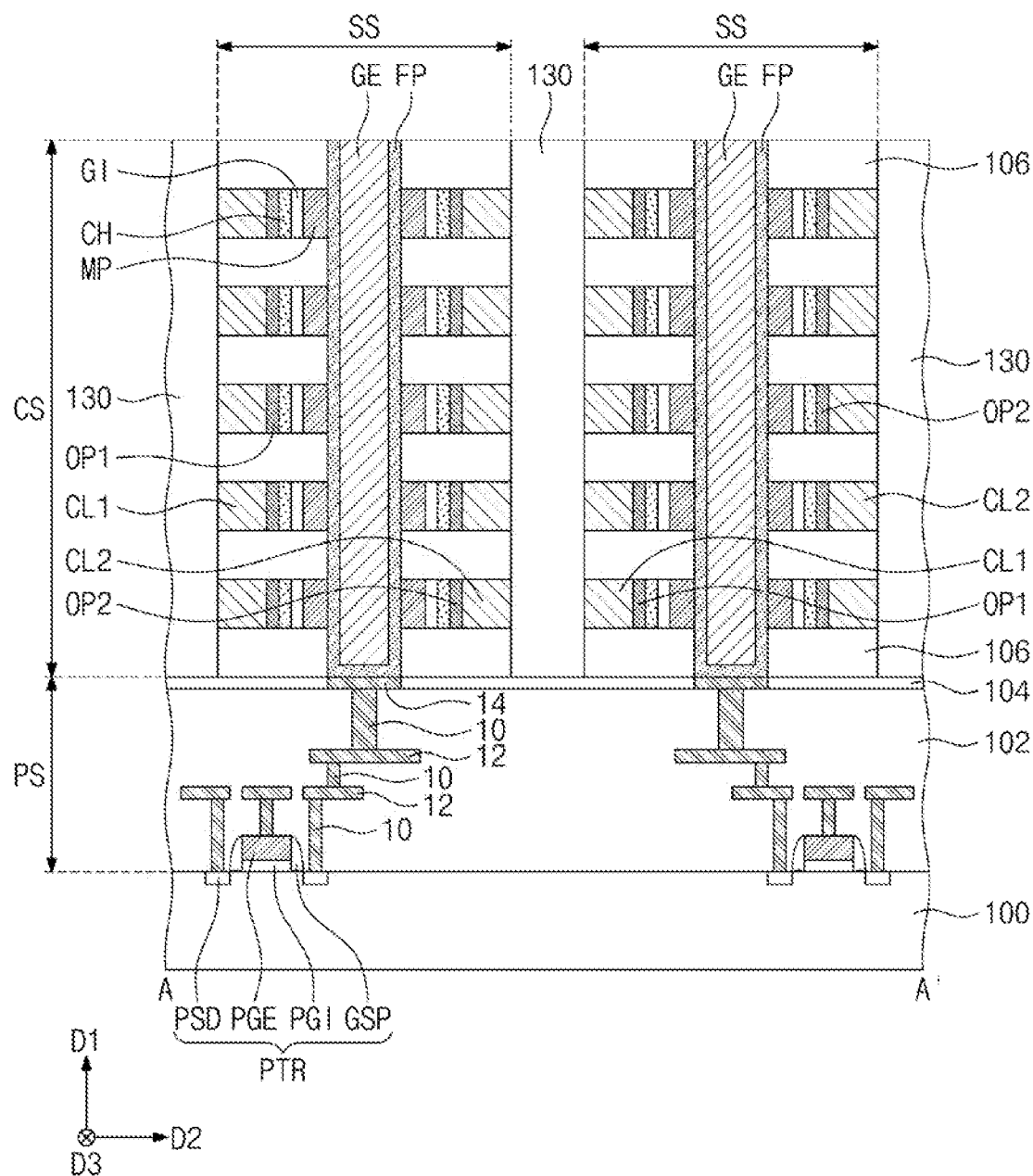
FIGS. 44 to 46 are sectional views, each of which schematically illustrates a semiconductor device according to an example embodiment.

FIG. 44 is a sectional view illustrating a semiconductor device according to an example embodiment. For the sake of brevity, features, which are different from the semiconductor device described with reference to FIGS. 1 to 3, will be mainly described below.

Referring to FIG. 44, a peripheral circuit structure PS and a cell structure CS may be provided on a substrate 100.

The cell structure CS may include the stack SS and the sidewall insulating patterns 130 described with reference to FIGS. 1 to 3.

The peripheral circuit structure PS may include peripheral transistors PTR on the substrate 100, an interlayer insulating layer 102 covering the peripheral transistors PTR, and an etch stop layer 104 on the interlayer insulating layer 102.

Each of the peripheral transistors PTR may include a peripheral gate electrode PGE on the substrate 100, a peripheral gate insulating pattern PGI between the substrate 100 and the peripheral gate electrode PGE, gate spacers GSP on opposite side surfaces of the peripheral gate electrode PGE, and peripheral source/drain regions PSD at both sides of the peripheral gate electrode PGE.

The peripheral circuit structure PS may further include peripheral contacts 10 and peripheral lines 12, which are disposed in the interlayer insulating layer 102 and are connected to the peripheral source/drain regions PSD and the peripheral gate electrode PGE.

In an example embodiment, the peripheral circuit structure PS may be disposed between the substrate 100 and the cell structure CS. In this case, the peripheral transistors PTR may be disposed below the stack SS of the cell structure CS and may be overlapped with the stack SS vertically (e.g., in the first direction D1).

The peripheral circuit structure PS may further include peripheral pads 14, which are respectively connected to the gate electrodes GE of the stack SS. Each of the peripheral pads 14 may be provided to penetrate the etch stop layer 104, and may be connected to a corresponding one of the gate electrodes GE. The peripheral pads 14 may be electrically connected to the peripheral transistors PTR through the peripheral contacts 10 and the peripheral lines 12.

The peripheral pads 14 may be formed of or include at least one of conductive materials.

Figure 45:
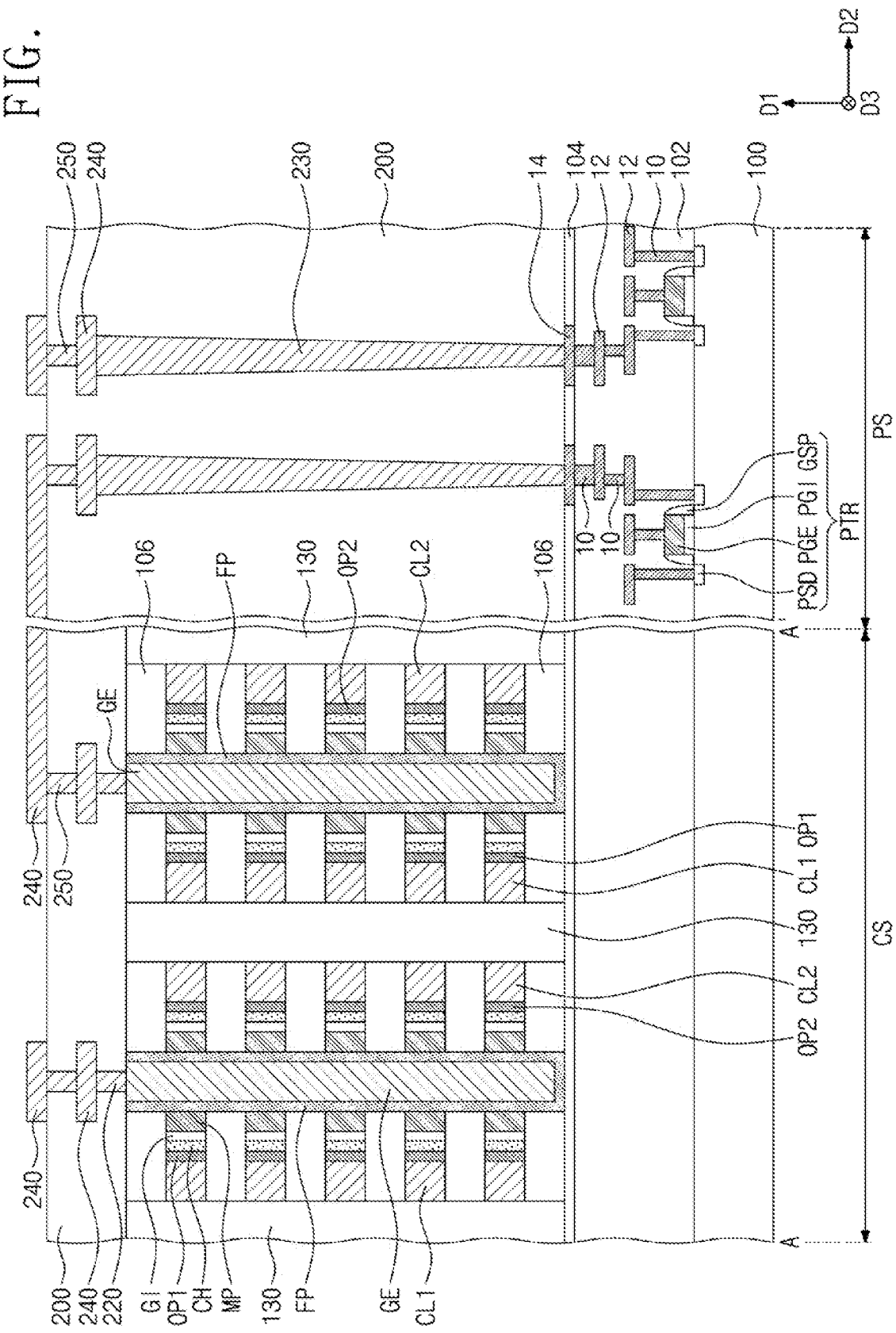

FIG. 45 is a sectional view illustrating a semiconductor device according to an example embodiment. For the sake of brevity, features, which are different from the semiconductor device described with reference to FIGS. 1 to 3, will be mainly described below.

Referring to FIG. 45, a peripheral circuit structure PS and a cell structure CS may be provided on a substrate 100.

The cell structure CS may include the interlayer insulating layer 102, the etch stop layer 104, the stack SS, and the sidewall insulating patterns 130 described with reference to FIGS. 1 to 3.

The peripheral circuit structure PS may include peripheral transistors PTR, which are provided on the substrate 100, and peripheral contacts 10 and peripheral lines 12, which are connected to the peripheral transistors PTR. The peripheral transistors PTR, the peripheral contacts 10, and the peripheral lines 12 may be configured to have substantially the same features as the peripheral transistors PTR, the peripheral contacts 10, and the peripheral lines 12 described with reference to FIG. 44.

The peripheral circuit structure PS may be disposed at a side of the cell structure CS.

The interlayer insulating layer 102 may be horizontally (e.g., in the second direction D2) extended to cover the peripheral transistors PTR, the peripheral contacts 10, and the peripheral lines 12.

The etch stop layer 104 may be extended along a top surface of the interlayer insulating layer 102.

The peripheral transistors PTR may be offset from the stack SS of the cell structure CS horizontally (e.g., in the second direction D2), and may not be overlapped with the stack SS vertically (e.g., in the first direction D1).

The cell structure CS may further include an upper insulating layer 200, which is provided on the stack SS, and cell contact plugs 220, upper contacts 250, and upper interconnection lines 240, which are disposed in the upper insulating layer 200.

The cell contact plugs 220 may be provided to penetrate a lower portion of the upper insulating layer 200, and may be respectively connected to the gate electrodes GE of the stack SS. The cell contact plugs 220 may be connected to the upper contacts 250 and the upper interconnection lines 240.

The peripheral circuit structure PS may further include peripheral contact plugs 230 and peripheral pads 14, which are connected to the peripheral contact plugs 230.

Each of the peripheral pads 14 may be provided to penetrate the etch stop layer 104, and may be connected to a corresponding one of the peripheral contact plugs 230. The peripheral pads 14 may be electrically connected to the peripheral transistors PTR through the peripheral contacts 10 and the peripheral lines 12.

The upper insulating layer 200 may be extended to a region on the peripheral circuit structure PS, and may cover the peripheral contact plugs 230 and the peripheral pads 14.

The upper contacts 250 and the upper interconnection lines 240 may be disposed in the upper insulating layer 200 on the peripheral circuit structure PS.

The peripheral contact plugs 230 may be provided to penetrate at least a portion of the upper insulating layer 200, and may be connected to the upper contacts 250 and the upper interconnection lines 240.

The gate electrodes GE of the stack SS may be electrically connected to the peripheral transistors PTR through the cell contact plugs 220, the upper contacts 250, the upper interconnection lines 240, the peripheral contact plugs 230, the peripheral pads 14, the peripheral contacts 10, and the peripheral lines 12.

Figure 46:
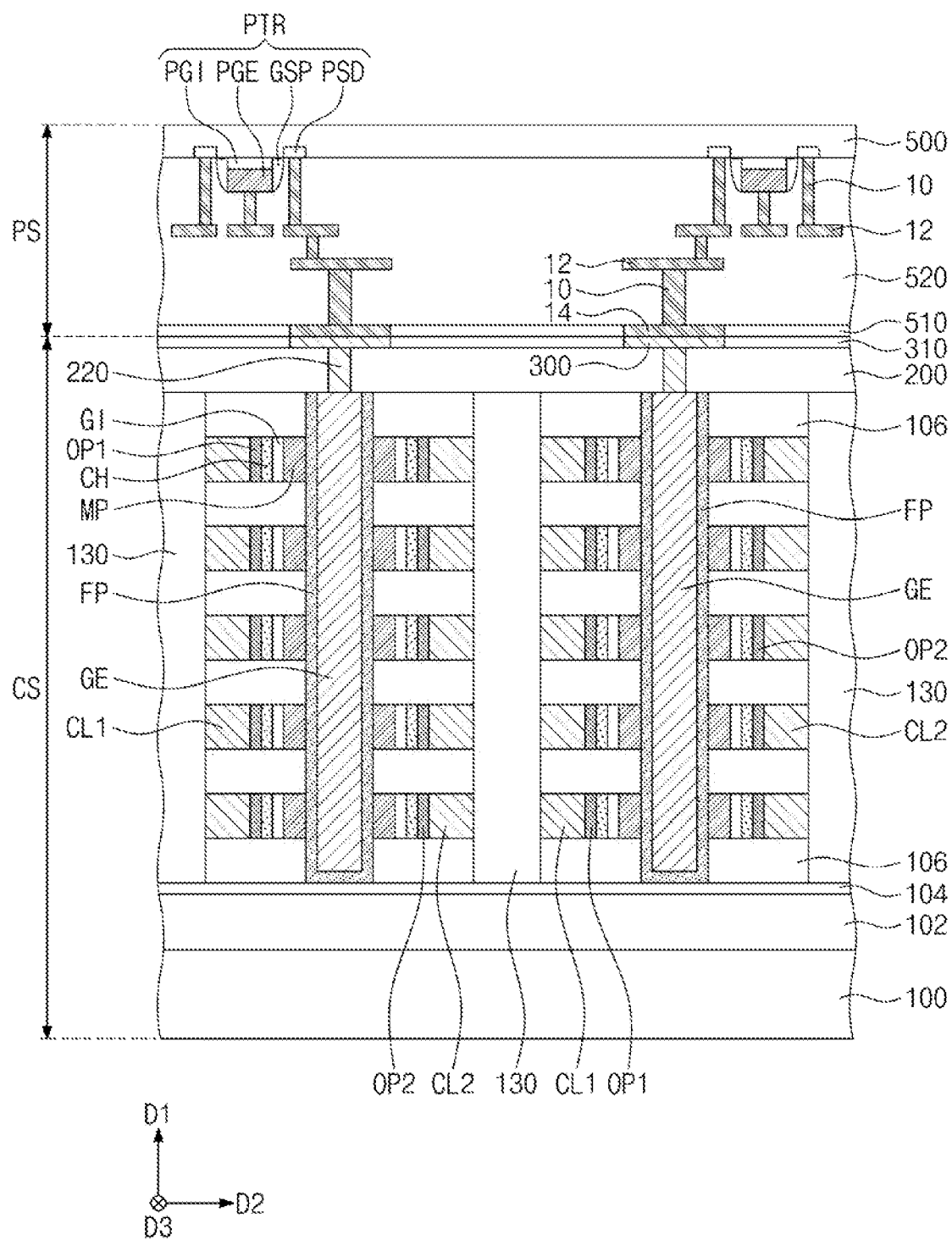

FIG. 46 is a sectional view illustrating a semiconductor device according to an example embodiment. For the sake of brevity, features, which are different from the semiconductor device described with reference to FIGS. 1 to 3, will be mainly described below.

Referring to FIG. 46, a peripheral circuit structure PS may be disposed on a cell structure CS.

The cell structure CS may include the substrate 100, the interlayer insulating layer 102, the etch stop layer 104, the stack SS, and the sidewall insulating patterns 130 described with reference to FIGS. 1 to 3. The substrate 100 of the cell structure CS may be referred to as a first substrate.

The cell structure CS may further include an upper insulating layer 200 and a cell junction layer 310, which are sequentially stacked on the stack SS, cell contact plugs 220, which are disposed in the upper insulating layer 200, and cell pads 300, which are provided to penetrate the cell junction layer 310.

The upper insulating layer 200 and the cell junction layer 310 may be formed of or include at least one of insulating materials. The cell contact plugs 220 and the cell pads 300 may be formed of or include at least one of conductive materials.

The cell contact plugs 220 may be provided to penetrate the upper insulating layer 200, and may be respectively connected to the gate electrodes GE of the stack SS.

The cell pads 300 may be provided to penetrate the cell junction layer 310, and may be respectively connected to the cell contact plugs 220.

The peripheral circuit structure PS may include a second substrate 500, peripheral transistors PTR on the second substrate 500, a peripheral insulating layer 520 covering the peripheral transistors PTR, and a peripheral junction layer 510 on the peripheral insulating layer 520.

The second substrate 500 may include a semiconductor substrate (e.g., a silicon substrate, a germanium substrate, a silicon-germanium substrate, and so forth).

Each of the peripheral transistors PTR may include a peripheral gate electrode PGE on the second substrate 500, a peripheral gate insulating pattern PGI between the second substrate 500 and the peripheral gate electrode PGE, gate spacers GSP on opposite side surfaces of the peripheral gate electrode PGE, and peripheral source/drain regions PSD at both sides of the peripheral gate electrode PGE.

The peripheral circuit structure PS may further include peripheral contacts 10 and peripheral lines 12, which are disposed in the peripheral insulating layer 520. The peripheral contacts 10 and the peripheral lines 12 may be connected to the peripheral source/drain regions PSD and the peripheral gate electrode PGE.

The peripheral circuit structure PS may further include the peripheral pads 14 penetrating the peripheral junction layer 510.

The peripheral insulating layer 520 and the peripheral junction layer 510 may be formed of or include an insulating material, and the peripheral contacts 10, the peripheral lines 12, and the peripheral pads 14 may be formed of or include a conductive material.

The peripheral pads 14 may be electrically connected to the peripheral transistors PTR through the peripheral contacts 10 and the peripheral lines 12.

The peripheral pads 14 may be directly bonded to the cell pads 300. As an example, the peripheral pads 14 and the cell pads 300 may be formed of or include copper, and may be bonded to each other by a direct bonding method. The peripheral junction layer 510 may be directly bonded to the cell junction layer 310.

The gate electrodes GE of the stack SS may be electrically connected to the peripheral transistors PTR through the cell contact plugs 220, the cell pads 300, the peripheral pads 14, the peripheral contacts 10, and the peripheral lines 12.

As described above, embodiments relate to a semiconductor memory device including a ferroelectric field effect transistor, and a method of fabricating the same.

Embodiments may provide a highly-integrated semiconductor device and a method of fabricating the same. Embodiments may provide a semiconductor device with improved operational and reliability characteristics and a method of fabricating the same.

According to an embodiment, it may be possible to easily stack a plurality of ferroelectric field effect transistors in a vertical direction and thereby to easily increase an integration density of a semiconductor device.

In addition, each of the ferroelectric field effect transistors may include a ferroelectric pattern, a metal pattern, and a gate insulating pattern, which are provided to enclose a side surface of a gate electrode, and in this case, it may be possible to increase an intensity of an electric field applied to the ferroelectric pattern and the metal pattern and to reduce an intensity of an electric field applied to the gate insulating pattern. Accordingly, it may be possible to improve a polarization property of the ferroelectric pattern and an endurance property of the gate insulating pattern. Thus, it may be possible to improve operational and reliability characteristics of the semiconductor device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   first conductive lines provided on a substrate and spaced apart from each other in a first direction, the first direction being perpendicular to a top surface of the substrate;
   second conductive lines spaced apart from the first conductive lines in a second direction, the second direction being parallel to the top surface of the substrate;
   a gate electrode disposed between the first conductive lines and the second conductive lines, and extended in the first direction;
   channel patterns provided to enclose a side surface of the gate electrode, and spaced apart from each other in the first direction;
   a ferroelectric pattern between each of the channel patterns and the gate electrode; and
   a gate insulating pattern between each of the channel patterns and the ferroelectric pattern,
   wherein each of the channel patterns is connected to a corresponding one of the first conductive lines and a corresponding one of the second conductive lines.

2. The semiconductor device as claimed in claim 1, wherein each of the channel patterns is interposed between the corresponding first conductive line and the corresponding second conductive line.

3. The semiconductor device as claimed in claim 2, wherein each of the channel patterns is overlapped with the corresponding first conductive line and the corresponding second conductive line in the second direction.

4. The semiconductor device as claimed in claim 2, further comprising:
a first impurity pattern between each of the channel patterns and the corresponding first conductive line; and
a second impurity pattern between each of the channel patterns and the corresponding second conductive line,
wherein the first impurity pattern and the second impurity pattern have the same conductivity type.

5. The semiconductor device as claimed in claim 2, wherein:
the first conductive lines are extended in a third direction, the third direction being parallel to the top surface of the substrate and crossing the second direction, and
the second conductive lines are spaced apart from each other in the first direction and are extended in the third direction.

6. The semiconductor device as claimed in claim 2, wherein:
the first conductive line are extended in a third direction, the third direction being parallel to the top surface of the substrate and crossing the second direction, and
the second conductive lines are spaced apart from each other in the third direction and are extended in the first direction.

7. The semiconductor device as claimed in claim 1, further comprising first insulating patterns interposed between the channel patterns and spaced apart from each other in the first direction,
wherein the first insulating patterns are provided to enclose the side surface of the gate electrode.

8. The semiconductor device as claimed in claim 7, wherein the channel patterns are electrically separated from each other by the first insulating patterns.

9. The semiconductor device as claimed in claim 7, wherein the ferroelectric pattern is extended into a region between each of the first insulating patterns and the gate electrode.

10. The semiconductor device as claimed in claim 7, wherein the gate insulating pattern is interposed between adjacent ones of the first insulating patterns.

11. The semiconductor device as claimed in claim 7, further comprising a metal pattern between each of the channel patterns and the ferroelectric pattern,
wherein the metal pattern is interposed between the gate insulating pattern and the ferroelectric pattern.

12. The semiconductor device as claimed in claim 11, wherein the gate insulating pattern and the metal pattern are interposed between adjacent ones of the first insulating patterns.

13. The semiconductor device as claimed in claim 1, wherein each of the ferroelectric pattern and the gate insulating pattern is provided to enclose the side surface of the gate electrode.

14. The semiconductor device as claimed in claim 13, further comprising a separation insulating pattern provided to penetrate the gate electrode and to extend in the first direction,
wherein the separation insulating pattern is extended in the second direction to penetrate the ferroelectric pattern, the gate insulating pattern, and each of the channel patterns.

15. The semiconductor device as claimed in claim 14, wherein:
the gate electrode is divided into a first gate electrode and a second gate electrode by the separation insulating pattern,
the first gate electrode and the second gate electrode are spaced apart from each other in a third direction, the third direction being parallel to the top surface of the substrate and crossing the second direction,
each of the channel patterns is divided into a first channel pattern and a second channel pattern, which are spaced apart from each other in the third direction, by the separation insulating pattern, and
each of the corresponding first conductive line and the corresponding second conductive line is connected to the first channel pattern and the second channel pattern.

16. A semiconductor device, comprising:
first conductive lines and first insulating patterns, which are alternately stacked in a first direction, the first direction being perpendicular to a top surface of a substrate;
a gate electrode, which is extended in the first direction and is spaced apart from the first conductive lines in a second direction, the second direction being parallel to the top surface of the substrate;
channel patterns provided to enclose a side surface of the gate electrode, and spaced apart from each other in the first direction;
a ferroelectric pattern between each of the channel patterns and the gate electrode; and
a gate insulating pattern between each of the channel patterns and the ferroelectric pattern, wherein:
the first insulating patterns are extended into regions between the channel patterns, and
the channel patterns are connected to the first conductive lines, respectively.

17. The semiconductor device as claimed in claim 16, further comprising first impurity patterns, which are respectively interposed between the channel patterns and the first conductive lines, and are spaced apart from each other in the first direction,
wherein the first insulating patterns are interposed between the first impurity patterns.

18. The semiconductor device as claimed in claim 17, further comprising second impurity patterns, which are spaced apart from the first impurity patterns in the second direction with the gate electrode and the channel patterns interposed therebetween, wherein:
the second impurity patterns are spaced apart from each other in the first direction and are connected to the channel patterns, respectively, and
the first insulating patterns are extended into regions between the second impurity patterns.

19. The semiconductor device as claimed in claim 18, wherein the second impurity patterns have the same conductivity type as the first impurity patterns.

20. The semiconductor device as claimed in claim 18, further comprising second conductive lines, which are connected to the second impurity patterns, respectively, and are spaced apart from each other in the first direction, wherein:
the second impurity patterns are respectively interposed between the channel patterns and the second conductive lines, and
the first insulating patterns are extended into regions between the second conductive lines.

* * * * *